(12) United States Patent
Nishihara

(10) Patent No.: US 8,605,184 B2
(45) Date of Patent: Dec. 10, 2013

(54) PIXEL CIRCUIT, SOLID-STATE IMAGE PICKUP DEVICE, AND CAMERA

(75) Inventor: Toshiyuki Nishihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 258 days.

(21) Appl. No.: 13/126,790

(22) PCT Filed: Nov. 25, 2009

(86) PCT No.: PCT/JP2009/069848
§ 371 (c)(1),
(2), (4) Date: Apr. 29, 2011

(87) PCT Pub. No.: WO2010/067705
PCT Pub. Date: Jun. 17, 2010

(65) Prior Publication Data
US 2011/0205416 A1  Aug. 25, 2011

(30) Foreign Application Priority Data

Dec. 8, 2008 (JP) .................................. 2008-312413

(51) Int. Cl.
*H04N 5/335* (2011.01)
(52) U.S. Cl.
USPC ......................................................... 348/308
(58) Field of Classification Search
USPC ........................................ 348/308; 250/208.1
See application file for complete search history.

(56) References Cited

U.S. PATENT DOCUMENTS 7,442,910 B2 * 10/2008 Fossum ....................... 250/208.1
2004/0051801 A1  3/2004 Iizuka
2005/0110093 A1  5/2005 Altice, Jr.
2005/0110885 A1  5/2005 Altice, Jr.
2007/0131993 A1  6/2007 Oita
2008/0284250 A1  11/2008 Makino
2012/0326008 A1 * 12/2012 McKee et al. ............... 250/208.1

FOREIGN PATENT DOCUMENTS

| JP | 2002-64751 | 2/2002 |
| JP | 2002-064751 | 2/2002 |
| JP | 2004-111590 | 4/2004 |
| JP | 2007-300083 | 11/2007 |
| JP | 2008-004692 | 1/2008 |
| JP | 2008-021925 | 1/2008 |
| JP | 2008-078489 | 4/2008 |

OTHER PUBLICATIONS

Extended European Search Report for EP Application No. 09 831810 dated Oct. 31, 2012.
International Search Report dated Dec. 28, 2009 in connection with counterpart International Application No. PCT/JP2009/069848.

\* cited by examiner

*Primary Examiner* — Tuan Ho
(74) *Attorney, Agent, or Firm* — Dentons US LLP

(57) ABSTRACT

A pixel circuit has first, second, and third field effect transistors integrated and connected in series from a photoelectric conversion element to a side of an amplifier circuit. The first and second field effect transistors have gate electrodes to be simultaneously collectively driven. A threshold voltage of the first field effect transistor is set to be higher than that of the second field effect transistor. As the gate electrodes are driven step by step, electrons generated by the photoelectric conversion element and transferred via the first field effect transistor are accumulated in a channel region of the second field effect transistor. The electrons accumulated in the channel region are transferred to an input of the amplifier circuit via the third field effect transistor.

11 Claims, 33 Drawing Sheets

PIXEL CIRCUIT, SOLID-STATE IMAGE PICKUP DEVICE, AND CAMERA

TECHNICAL FIELD

The present invention relates to a pixel circuit represented by a CMOS image sensor, a solid-state image pickup device, and a camera system.

BACKGROUND ART

Recently, CMOS imagers for a digital still camera, a camcorder, a security camera, and the like have been widely used and markets have also extended.

The CMOS imager converts light incident on each pixel into electrons by a photodiode, which is a photoelectric conversion element, accumulates the electrons for a fixed period of time, digitalizes a signal reflecting an accumulated electric charge amount thereof, and outputs the digitalized signal to the outside.

FIG. 1 is a diagram showing an example of a pixel circuit including four transistors in one unit pixel.

A pixel circuit PX1 of one unit has a photo diode 1, a transfer transistor 2, a reset transistor 3, an amplifier transistor 4, a row selection transistor 5, an accumulation node 6, and floating diffusion (FD, a floating diffusion layer) 7.

A gate electrode of the transfer transistor 2 is connected to a transfer line 8, and a gate electrode of the reset transistor 3 is connected to a reset line 9. A gate electrode of the amplifier transistor 4 is connected to the FD 7, and a gate electrode of the row selection transistor 5 is connected to a row selection line 10. A source of the row selection transistor 5 is connected to a vertical signal line 11.

A constant current circuit 12 and a sensing circuit 13 are connected to the vertical signal line 11.

In the pixel circuit PX1, light incident on a silicon substrate of a pixel generates pairs of electrons and holes, and the electrons thereof are focused and accumulated in the node 6 by the photodiode 1. The electrons are ultimately read as a signal directed to the vertical signal line 11.

Hereinafter, specific operations of electric charge accumulation and read will be described with reference to FIG. 2.

FIGS. 2(A) to 2(D) are diagrams showing a timing chart of the pixel circuit of FIG. 1.

First, a pixel is reset ahead of electric charge accumulation. Thereby, the reset line 9 and the transfer line 8 are set to a high level, so that the reset transistor 3 and the transfer transistor 2 are in an ON state. For example, this is an operation of transferring a power supply voltage of 3 V to the accumulation node 6 of the photodiode.

Thereby, a potential of the accumulation node 6 rises and the electrons accumulated therein are extracted.

In a hole-accumulation diode (HAD) that has recently become mainstream, the accumulation node 6 is formed in an n-type buried diffusion layer interposed between p-type layers, and all electrons are discharged, so that it is in a full depletion state. An increase of the potential of the node 6 is also stopped at a point in time when all the electrons have been discharged, and its level becomes a predetermined level lower than the power supply voltage 3 V.

Thereafter, the transfer line 8 has a low level and the transfer transistor 2 is turned off, so that the accumulation node 6 is in the floating state and new electric charge accumulation is started. During the electric charge accumulation, the reset transistor 3 is normally turned off.

In general, the above-described pixel reset operation is used as an electronic shutter operation of a CMOS image sensor.

Next, an operation of reading the accumulated electric charge will be described.

First, the row selection line 10 has a high level and the row selection transistor 5 is turned on, so that the amplifier transistor 4 of the pixel is connected to the vertical signal line 11.

Here, the vertical signal line 11 connected to the amplifier transistor 4 and the constant current circuit 12 form a source follower circuit, and a potential Vf of the FD 7, which is its input, and a potential Vsl of the vertical signal line 11, which is its output, have a linear relationship close to a variation ratio of 1.

That is, if a current value of the constant current circuit 12 is i, the following expression is ideally established.

$$i = (1/2) * \beta * (Vf - Vth - Vsl)2, \text{ where } \beta \text{ is a constant.} \quad [\text{Expression 1}]$$

Here, (Vf−Vth−Vsl) becomes constant, and a variation of Vf is linearly reflected in Vsl.

That is, the source follower circuit operates as an amplifier circuit in which a gain is about 1, and drives the vertical signal line 11 according to a signal amount of the FD 7, which is an input node.

Here, the power supply voltage 3V is transferred to the FD 7 by switching the reset line 9 to a high level and turning on the reset transistor 3.

Further, after the reset transistor 3 is turned off, first sensing of the potential Vsl of the vertical signal line 11 is performed by a sensing circuit 13 constituted by a comparator, an analog/digital converter (ADC), or the like. This is the read of a reset signal.

Next, electrons accumulated in the accumulation node 6 flows into the FD 7 by switching the transfer line 8 to the high level and turning on the transfer transistor 2.

In this case, if the potential of the FD 7 is sufficiently deep, that is, a high potential, all the electrons accumulated in the accumulation node 6 are discharged to the FD 7, and the accumulation node 6 is in the full depletion state.

Here, the transfer transistor 2 is turned off and second sensing of the potential of the vertical signal line 11 is performed. This is the read of an accumulated signal.

A difference between the first sensing and the second sensing of the above-described Vsl accurately reflects an electric charge amount accumulated in the accumulation node 6 by exposure of the photodiode 1.

The CMOS imager digitalizes the difference and outputs the digitalized result to the outside as a pixel signal value. An electron accumulation time of each pixel is a period of time between the reset operation and the read operation described above, and accurately, is a period T1 until the transfer transistor 2 is turned off in the read after the transfer transistor 2 is reset and then turned off.

In general, in a CMOS type imager, accumulated electrons generated by the photoelectric conversion element are converted into an analog signal of the vertical signal line 11 via the amplifier circuit for each pixel, and the analog signal is transferred to the sensing circuit 13.

Further, the analog signal is converted into a digital signal by the ADC, and the digital signal is output outside a chip.

This is significantly different from a CCD type imager in which accumulated electrons themselves are vertically/horizontally transferred by a CCD transfer immediately before a chip output amplifier circuit.

SUMMARY OF INVENTION

Technical Problem

Incidentally, because the photoelectrically converted electrons are completely transferred during a read operation in the above-described pixel circuit, it is necessary to maintain a potential after the transfer of the FD 7, which is an input node of the amplifier circuit 118, to be higher than that of the photodiode 1 during full depletion.

However, a dynamic range of the potential of the FD 7 is limited, so that there is a disadvantage in that it is not possible to sufficiently increase a potential variation amount $\Delta Vf$ and increase an S/N ratio.

Further, because a saturated accumulated electric charge amount Qs of the photodiode corresponds to the number of donors within its diffusion layer, the potential during the full depletion normally becomes deep (as a high potential) if the saturated accumulated electric charge amount Qs is increased. Thereby, the range of the potential variation amount $\Delta Vf$ is in a narrower direction.

A problem of this transfer margin serves as a large limitation in design.

The present invention is made in view of the above-mentioned issue, and aims to provide a pixel circuit, a solid-state image pickup device, and a camera system that can facilitate an electric charge transfer within a pixel, improve an amount of accumulated electric charge or sensitivity, and improve image pickup capability.

Solution to Problem

According to a first aspect of the present invention, there is provided a pixel circuit including: a photoelectric conversion element; an amplifier circuit; and a transfer transistor for transferring electric charge generated by the photoelectric conversion element to an input node of the amplifier circuit, wherein the transfer transistor has first, second, and third field effect transistors integrated and connected in series from the photoelectric conversion element to a side of the amplifier circuit, the first and second field effect transistors have gate electrodes to be simultaneously collectively driven, and a threshold voltage of the first field effect transistor is set to be higher than that of the second field effect transistor, and as the gate electrodes are driven step by step, the electric charge generated by the photoelectric conversion element and transferred via the first field effect transistor is accumulated in a channel region of the second field effect transistor, and the electric charge accumulated in the channel region is transferred to an input of the amplifier circuit via the third field effect transistor, and wherein the amplifier circuit drives a signal line, so that the accumulated electric charge is read.

According to a second aspect of the present invention, there is provided a pixel circuit including: a photoelectric conversion element; an amplifier circuit; and a transfer transistor for transferring electric charge generated by the photoelectric conversion element to an input node of the amplifier circuit, wherein the transfer transistor has first and second field effect transistors integrated and connected in series from the photoelectric conversion element to a side of the amplifier circuit, the first and second field effect transistors have gate electrodes to be simultaneously collectively driven, and a threshold voltage of the first field effect transistor is set to be higher than that of the second field effect transistor, and as the gate electrodes are driven step by step, a predetermined amount of electric charge generated by the photoelectric conversion element and transferred via the first field effect transistor is accumulated in a channel region of the second field effect transistor, and the electric charge accumulated in the channel region is transferred to an input of the amplifier circuit, and wherein the amplifier circuit drives a signal line, so that the accumulated electric charge is read.

According to a third aspect of the present invention, there is provided a solid-state image pickup device including: a pixel section where a plurality of pixel circuits are arranged; and a pixel driving section for reading a pixel signal by driving a pixel circuit of the pixel section, wherein each pixel circuit has: a photoelectric conversion element; an amplifier circuit; and a transfer transistor for transferring electric charge generated by the photoelectric conversion element to an input node of the amplifier circuit, wherein the transfer transistor has first, second, and third field effect transistors integrated and connected in series from the photoelectric conversion element to a side of the amplifier circuit, the first and second field effect transistors have gate electrodes to be simultaneously collectively driven, and a threshold voltage of the first field effect transistor is set to be higher than that of the second field effect transistor, and as the gate electrodes are driven by the pixel driving section step by step, the electric charge generated by the photoelectric conversion element and transferred via the first field effect transistor is accumulated in a channel region of the second field effect transistor, and the electric charge accumulated in the channel region is transferred to an input of the amplifier circuit via the third field effect transistor, and wherein the amplifier circuit drives a signal line, so that the accumulated electric charge is read.

According to a fourth aspect of the present invention, there is provided a solid-state image pickup device including: a pixel section where a plurality of pixel circuits are arranged; and a pixel driving section for reading a pixel signal by driving a pixel circuit of the pixel section, wherein each pixel circuit has: a photoelectric conversion element; an amplifier circuit; and a transfer transistor for transferring electric charge generated by the photoelectric conversion element to an input node of the amplifier circuit, wherein the transfer transistor has first and second field effect transistors integrated and connected in series from the photoelectric conversion element to a side of the amplifier circuit, the first and second field effect transistors have gate electrodes to be simultaneously collectively driven, and a threshold voltage of the first field effect transistor is set to be higher than that of the second field effect transistor, and as the gate electrodes are driven by the pixel driving section step by step, a predetermined amount of electric charge generated by the photoelectric conversion element and transferred via the first field effect transistor is accumulated in a channel region of the second field effect transistor, and the electric charge accumulated in the channel region is transferred to an input of the amplifier circuit, and wherein the amplifier circuit drives a signal line, so that the accumulated electric charge is read.

According to a fifth aspect of the present invention, there is provided a camera system including: a solid-state image pickup device; an optical system for forming an image of a subject on the image pickup device; and a signal processing circuit for processing an output image signal of the image pickup device, wherein the solid-state image pickup device has: a pixel section where a plurality of pixel circuits are arranged; and a pixel driving section for reading a pixel signal by driving a pixel circuit of the pixel section, wherein each pixel circuit has: a photoelectric conversion element; an amplifier circuit; and a transfer transistor for transferring electric charge generated by the photoelectric conversion element to an input node of the amplifier circuit, wherein the transfer transistor has first, second, and third field effect transistors integrated and connected in series from the photoelectric conversion element to a side of the amplifier circuit, the first and second field effect transistors have gate electrodes to be simultaneously collectively driven, and a threshold voltage of the first field effect transistor is set to be higher than that of the second field effect transistor, and as the gate electrodes are driven by the pixel driving section step by step, the electric charge generated by the photoelectric conversion element and transferred via the first field effect transistor is accumulated in a channel region of the second field effect transistor, and the electric charge accumulated in the channel region is transferred to an input of the amplifier circuit via the third field effect transistor, and wherein the amplifier circuit drives a signal line, so that the accumulated electric charge is read.

According to a sixth aspect of the present invention, there is provided a camera system including: a solid-state image pickup device; an optical system for forming an image of a subject on the image pickup device; and a signal processing circuit for processing an output image signal of the image pickup device, wherein the solid-state image pickup device has: a pixel section where a plurality of pixel circuits are arranged; and a pixel driving section for reading a pixel signal by driving a pixel circuit of the pixel section, wherein each pixel circuit has: a photoelectric conversion element; an amplifier circuit; and a transfer transistor for transferring electric charge generated by the photoelectric conversion element to an input node of the amplifier circuit, wherein the transfer transistor has first and second field effect transistors integrated and connected in series from the photoelectric conversion element to a side of the amplifier circuit, the first and second field effect transistors have gate electrodes to be simultaneously collectively driven, and a threshold voltage of the first field effect transistor is set to be higher than that of the second field effect transistor, and as the gate electrodes are driven by the pixel driving section step by step, a predetermined amount of electric charge generated by the photoelectric conversion element and transferred via the first field effect transistor is accumulated in a channel region of the second field effect transistor, and the electric charge accumulated in the channel region is transferred to an input of the amplifier circuit, and wherein the amplifier circuit drives a signal line, so that the accumulated electric charge is read.

Advantageous Effects of Invention

According to the present invention, an electric charge transfer within a pixel can be facilitated, an amount of accumulated electric charge or sensitivity can be improved, and image pickup capability can be improved.

DESCRIPTION OF EMBODIMENTS

Hereinafter, preferred embodiments of the present invention will be described in detail with reference to the appended drawings. Note that, in this specification and the drawings, elements that have substantially the same function and structure are denoted with the same reference signs, and repeated explanation is omitted.

Description will be given in the following order.

1. First Embodiment (First Configuration Example of Pixel Circuit)
2. Second Embodiment (Second Configuration Example of Pixel Circuit)
3. Third Embodiment (Third Configuration Example of Pixel Circuit)
4. Fourth Embodiment (Fourth Configuration Example of Pixel Circuit)
5. Fifth Embodiment (Electric Charge Accumulation Example Using Deep Depletion State)
6. Sixth Embodiment (Electric Charge Accumulation Example Using Deep Depletion State)
7. Seventh Embodiment (Intermediate Retention Mode)
8. Eighth Embodiment (Intermediate Retention Mode)
9. Ninth Embodiment (Global Shutter Function)
10. Tenth Embodiment (Global Shutter Function)
11. Eleventh Embodiment (Wide Dynamic Range Operation)
12. Twelfth Embodiment (Wide Dynamic Range Operation)
13. Thirteenth Embodiment (Fifth Configuration Example of Pixel Circuit)
14. Fourteenth Embodiment (Sixth Configuration Example of Pixel Circuit)
15. Fifteenth Embodiment (Another Cross-sectional Structure)
16. Sixteenth Embodiment (Another Cross-sectional Structure)
17. Seventeenth Embodiment (Camera System)

Figure 3:
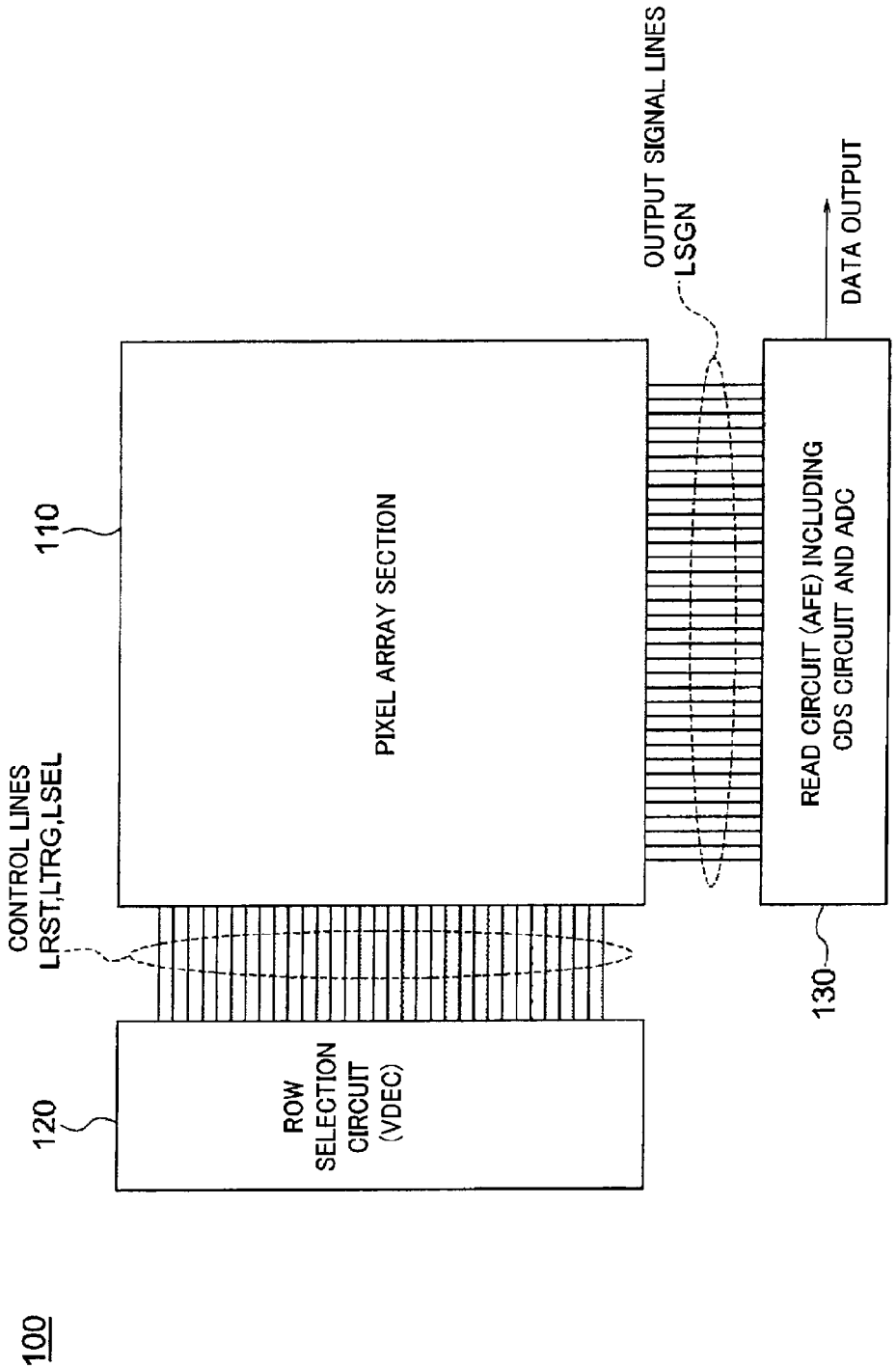
FIG. 3 is a diagram showing a configuration example of a CMOS image sensor (solid-state image pickup device) adopting a pixel circuit according to an embodiment of the present invention.

FIG. 3 is a diagram showing a configuration example of a CMOS image sensor (solid-state image pickup device) adopting a pixel circuit according to an embodiment of the present invention.

A CMOS image sensor 100 has a pixel array section 110, a row selection circuit (Vdec) 120 as a pixel driving section, and a column read circuit (AFE) 130.

In the pixel array section 110, a plurality of pixel circuits 110A are arranged in a two-dimensional form (matrix form) of M rows×N columns.

According to this embodiment, the pixel circuit 110A basically includes a photoelectric conversion element, a transfer transistor, a reset transistor, an amplifier transistor, a row selection transistor, an accumulation node, and FD (floating diffusion).

In this regard, the transfer transistor of the pixel circuit 110A is formed of at least first and second insulating gate type field effect transistors (MOS transistors) integrated and connected in series as described later. The first and second MOS transistors are formed of a transistor of a high threshold voltage Vth and a transistor of a low threshold voltage Vth having gate electrodes to be simultaneously collectively driven.

A specific configuration of the pixel circuit 110A will be described later.

A transfer line 140 (LTRG), a reset line 150 (LRST), and a row selection line 160 (LSL) wired to the pixel array section 110 are wired in each row unit of a pixel arrangement as one set.

M control lines are provided for each of the transfer line 140 (LTRG), the reset line 150 (LRST), and the row selection line 160 (LSL).

The transfer line 140 (LTRG), the reset line 150 (LRST), and the row selection line 160 (LSL) are driven by the row selection circuit 120.

The row selection circuit 120 controls an operation of a pixel arranged in any row of the pixel array section 110. The row selection circuit 120 controls the pixel circuit through the transfer line 140 (LTRG), the reset line 150 (LRST), and the row selection line 160 (LSL).

The column read circuit 130 receives data of a pixel row in which a read operation is under control of the row selection circuit 120 via a vertical signal line (LSGN) 170, and transfers the data to a rear-stage signal processing circuit. A constant current circuit or a sensing circuit is connected to the vertical signal line 170.

The column read circuit 130 includes a CDS circuit or an ADC (analog-digital converter).

Hereinafter, a specific configuration example of the pixel circuit of the CMOS image sensor 100 having the configuration as described above will be described.

<1. First Embodiment>

Figure 4:
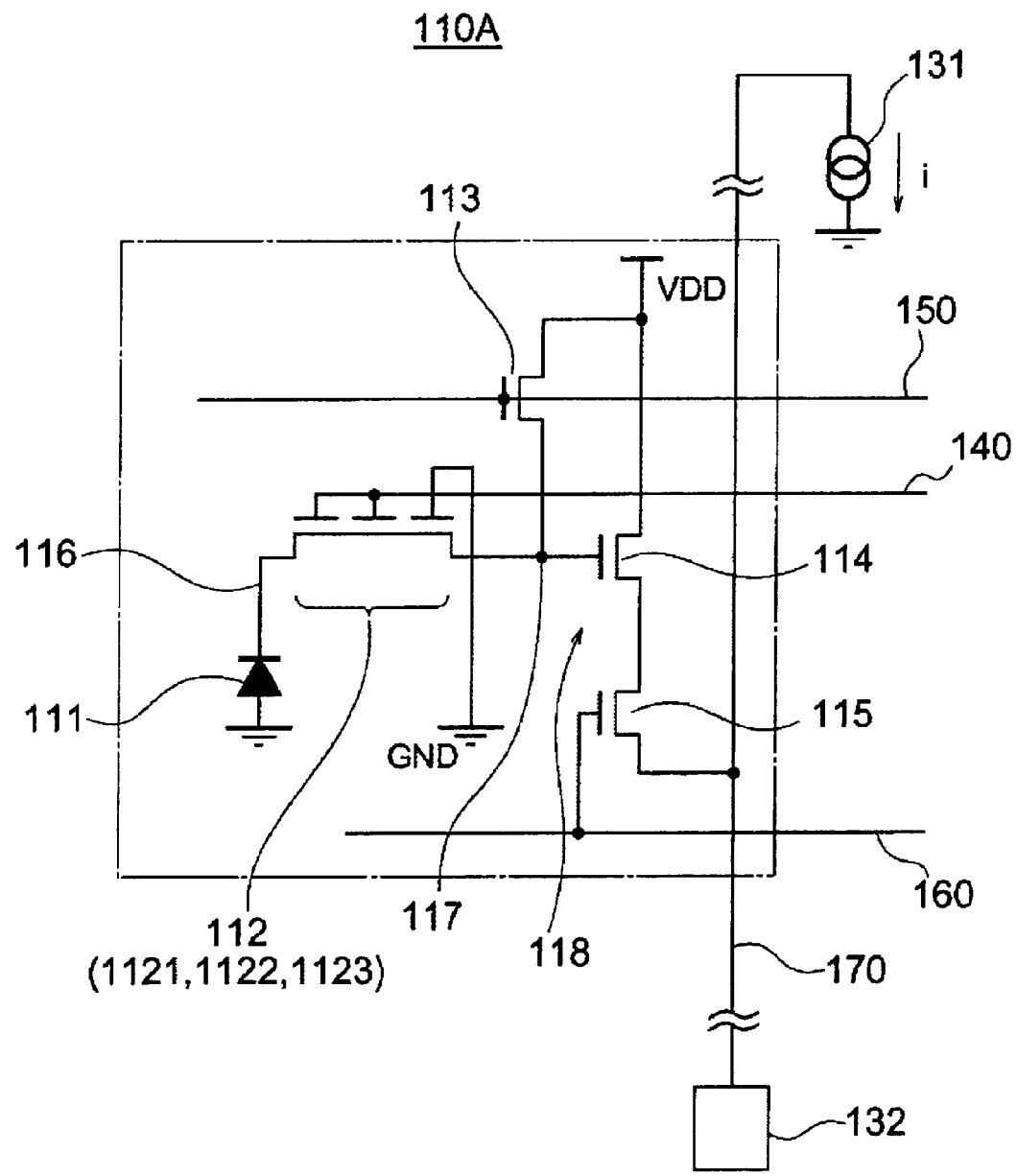
FIG. 4 is a diagram showing a pixel circuit of a CMOS image sensor according to a first embodiment of the present invention.

FIG. 4 is a diagram showing a pixel circuit of a CMOS image sensor according to a first embodiment of the present invention.

The pixel circuit 110A (PX111) of one unit has a photodiode 111 as a photoelectric conversion element, a transfer transistor 112, a reset transistor 113, an amplifier transistor 114, a row selection transistor 115, an accumulation node 116, and FD 117.

An amplifier circuit 118 is formed of the amplifier transistor 114, and an input node of the amplifier circuit 118 is formed of the FD 117.

The transfer transistor 112 of the first embodiment is connected between the photodiode 111 and the FD 117 as an output node.

The transfer transistor 112 is formed of at least a first MOS transistor 1121, a second MOS transistor 1122, and a third MOS transistor 1123 integrated and connected in series.

The first and second MOS transistors 1121 and 1122 are formed of a transistor of a high threshold voltage Vth and a transistor of a low threshold voltage Vth having gate electrodes to be driven by a driving signal simultaneously collectively applied.

The first MOS transistor 1121 is formed of a transistor of a high threshold voltage HVth, and the second MOS transistor 1122 is formed of a transistor of a low threshold voltage LVth.

The gate electrodes of the first and second MOS transistors 1121 and 1122 are commonly connected to the transfer line 140, and a gate electrode of the third MOS transistor 1123 is connected to a reference potential, for example, a ground GND.

In this embodiment, the first, second, and third MOS transistors 1121, 1122, and 1123 are formed of n-channel MOS (NMOS) transistors.

For example, the high threshold voltage HVth of the first NMOS transistor 1121 is set, for example, to 0 V, and the low threshold voltage LVth of the second NMOS transistor 1122 is set, for example, to −1.5 V.

A threshold voltage of the third NMOS transistor is set to −0.6 V.

The reset transistor 113 is connected between a power supply line and the FD 117, and its gate electrode is connected to the reset line 150.

A gate of the amplifier transistor 114 is connected to the FD 117. The amplifier transistor 114 is connected to the vertical signal line 170 via the row selection transistor 115, and constitutes a source follower with a constant current circuit 131 outside a pixel section.

A gate electrode of the row selection transistor 115 is connected to the row selection line 160. A source of the row selection transistor 115 is connected to the vertical signal line 170.

The constant current circuit 131 and a sensing circuit 132 are connected to the vertical signal line 170.

Figure 5:
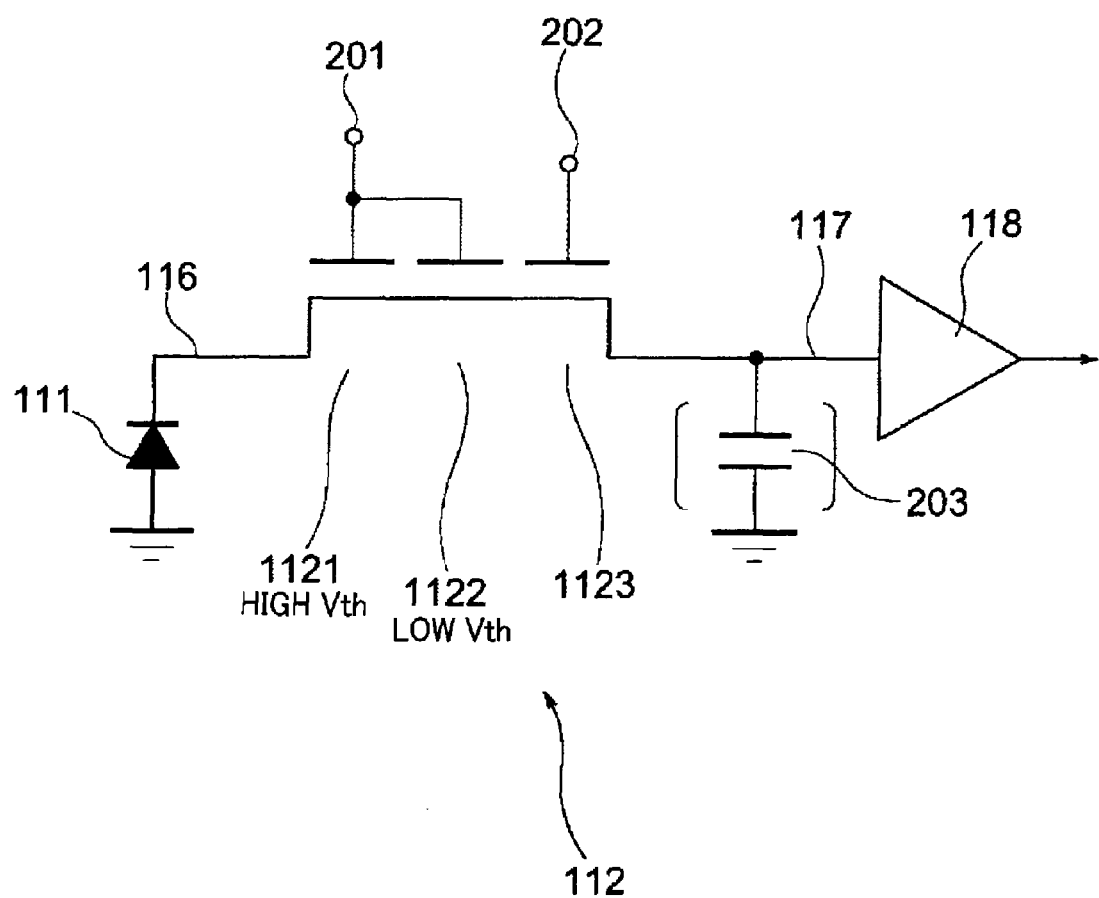
FIG. 5 is a diagram showing an equivalent circuit of a transfer circuit including a transfer transistor of the pixel circuit according to the first embodiment.

FIG. 5 is a diagram showing an equivalent circuit of a transfer circuit including the transfer transistor of the pixel circuit 110A according to the first embodiment.

In a transfer circuit 200 of FIG. 5, reference numerals 201 and 202 denote gate electrodes, reference numeral 203 denotes parasitic capacitance, and reference numeral 118 denotes the amplifier circuit. The amplifier circuit 118 is formed of the amplifier transistor 114.

Electrons generated by photoelectric conversion in the photodiode 111 are completely transferred to the FD 117, which is the input node of the amplifier circuit 118, via the first, second, and third NMOS transistors 1121, 1122, and 1123 integrated and connected in series.

In the integrated first, second, and third NMOS transistors 1121, 1122, and 1123, channels are directly connected to each other, not via an n-type diffusion layer or the like.

As described above, a driving signal is simultaneously collectively applied to gate electrodes 201 of the first and second NMOS transistors 1121 and 1122.

The first MOS transistor 1121 has the high threshold voltage HVth, and the second MOS transistor 1122 has the low threshold voltage LVth.

The FD 117, which is the input node, has the parasitic capacitance 203, and its potential variation amount ΔVf is as follows if an accumulated electric charge amount is Q and a parasitic capacitance value is Cf.

$$\Delta Vf = Q/Cf \quad \text{[Expression 2]}$$

During a read operation, this displacement drives the vertical signal line 170 at a fixed gain via the amplifier circuit 118.

Figure 6:
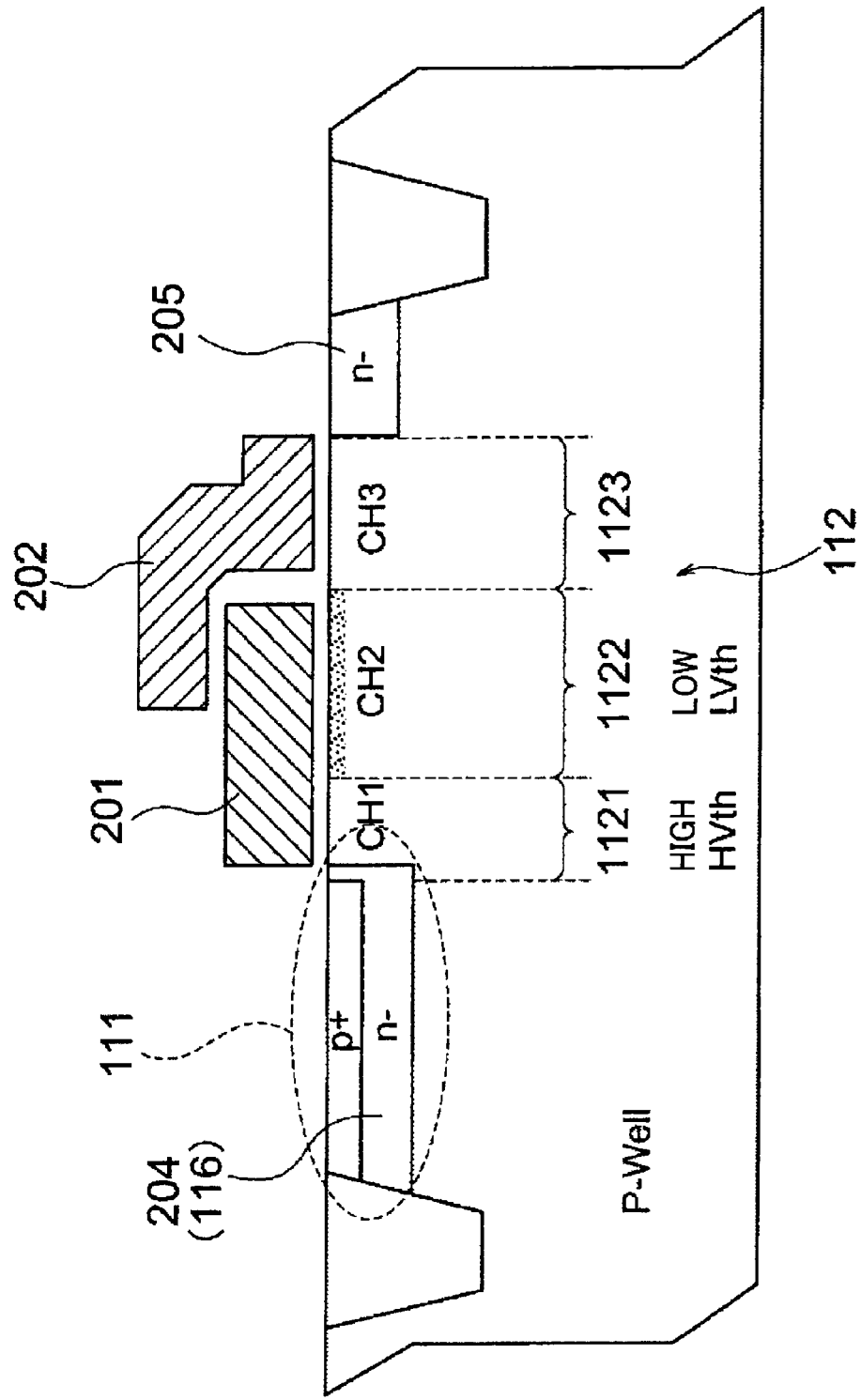
FIG. 6 is a diagram showing a cross-sectional structure example of the transfer circuit of FIG. 5.

FIG. 6 is a diagram showing a cross-sectional structure example of the transfer circuit of FIG. 5.

In the photodiode 111, a HAD structure in which the vicinity of a silicon surface in contact with an oxide film has a p-type is adopted.

Here, the photoelectrically converted electrons are initially accumulated in an n-type diffusion node 204. The diffusion node 204 corresponds to the accumulation node 116.

If a signal that turns on the first NMOS transistor 1121 is applied to the gate electrode 201, the electrons are transferred to a channel region of the second NMOS transistor 1122 via the first NMOS transistor 1121, and accumulated in the channel region.

For example, an impurity profile of a channel portion is adjusted, so that a threshold of the first NMOS transistor 1121 is set to be high and a threshold of the second NMOS transistor 1122 is set to be low. Thereby, a channel portion CH2 of the second NMOS transistor 1122 forms an electron accumulation well, and a channel portion CH1 of the first NMOS transistor 1121 forms a potential wall of backflow prevention.

On the other hand, the third NMOS transistor 1123 is controlled by an independent gate electrode 202.

A potential of a channel region of the third NMOS transistor 1123 is set to be shallower than that of the second NMOS transistor 1122 (as a high potential) when an ON voltage is applied to the gate electrode 201.

The potential of the channel region is set to be deeper than that of the second NMOS transistor 1122 (as a low potential) when an OFF voltage is applied to the gate electrode 201.

The gate electrode 202 of the third NMOS transistor 1123 may have a fixed potential, and may also be connected to a power supply line, a ground line, or the like if an impurity profile of a channel portion CH3 of the third NMOS transistor 1123, or the like is appropriately adjusted.

A diffusion layer 205 is connected to an input of the amplifier circuit 118, which is not shown in the cross-sectional view.

The third NMOS transistor 1123 functions as a separation transistor.

Here, the first NMOS transistor 1121 and the second NMOS transistor 1122 are considered two individual transistors. However, they may also be considered a single NMOS transistor having a gradient in the impurity profile of the channel portion if the gate electrodes are also integrally formed as shown in the figure.

In any case, it is functionally the same as two individual transistors connected in series. The present invention also includes the above-described form.

FIGS. 7(A) to 7(D) are diagrams showing potential changes accompanying a read transfer operation using the transfer circuit of the pixel circuit according to the first embodiment.

In terms of the potential of each node in FIGS. 7(A) to 7(D), a positive potential direction is shown on the lower side in the figure and a negative potential direction is shown on the upper side. Each node serves a well where electrons having negative electric charge are accumulated, and the potential rises to the upper side, that is, in the negative potential direction, with the well filled with the electrons.

[Step T11]

In step ST11 of FIG. 7(A), the diffusion node 204 of the photodiode 111 is designed so that a potential bottom is about 2.0 V during full depletion in positive electric charge by a fixed number of donors. Here, it is filled with photoelectrically converted electrons up to a saturation state (about 0 V).

On the other hand, in the channel regions of the first NMOS transistor 1121 and the second NMOS transistor 1122, potentials are respectively modulated in ranges of R11 and R12 according to a potential commonly applied to the gate electrodes of the two, for example, −1.5 V to 3 V.

On the other hand, the gate electrode 202 of the third NMOS transistor 1123 as the separation transistor is connected to the ground GND, and the potential of the channel is adjusted to about 0.6 V.

The diffusion layer 205 (the FD 117), which is the input node of the amplifier circuit 118, is reset to have a floating state of 3 V.

[Step ST12]

If the first NMOS transistor 1121 and the second NMOS transistor 1122 are turned on in step ST12 of FIG. 7(B), electrons move as follows.

Electrons accumulated in the diffusion node 204 of the photodiode 111 all move to the channel region of the second NMOS transistor 1122 via the first NMOS transistor 1121.

That is, the electrons move to the channel region of the second NMOS transistor 1122 having a deep depletion state and are accumulated in an analog state.

At this time, the potential of the channel region of the third NMOS transistor 1123 is shallower than that of the second NMOS transistor 1122 (as a low potential), and forms a barrier between the second NMOS transistor 1122 and the diffusion layer 205 (the FD 117), which is the input node of the amplifier circuit 118.

[Step ST13]

The gate electrodes are driven to turn off the first NMOS transistor 1121 and the second NMOS transistor 1122 in step ST13 of FIG. 7(C), so that the potentials of the channel regions are modulated in the negative potential direction.

Here, the channel of the first NMOS transistor 1121 forms a potential barrier, and prevents accumulated electrons from flowing back to the diffusion node 204 of the photodiode 111.

A height of the barrier corresponds to a difference between thresholds of two transistors of the first NMOS transistor 1121 and the second NMOS transistor 1122, for example, 1.5 V.

In the step in which the gate electrodes 201 of the first and second NMOS transistors 1121 and 1122 have reached an appropriate intermediate voltage, a state in which the accumulated electrons have been separated from both the diffusion node 204 of the photodiode 111 and the FD 117, which is the input of the amplifier, is possible.

The gates may be directly driven at once until the next step, but it is also possible to add a new function by temporarily retaining this intermediate state as will be described later.

Further, if the potential of the channel region of the second NMOS transistor 1122 is modulated in the negative potential direction by continuously driving the gate from here, the electrons accumulated therein start to move to the diffusion layer 205 (the FD 117), which is the input of the amplifier circuit 118.

[Step ST14]

If the first NMOS transistor 1121 and the second NMOS transistor 1122 are completely turned off in step ST14 of FIG. 7(D), the potential of the channel region of the second NMOS transistor 1122 from which all accumulated electrons have been discharged is as follows.

That is, the potential of the channel region of the second NMOS transistor 1122 exceeds the potential of the channel of the third NMOS transistor 1123.

In step ST11, a state is reached in which all electrons accumulated in the photodiode 111 have moved to the diffusion layer 205 (the FD 117), which is the input node of the amplifier circuit 118.

Thereby, the amplifier circuit 118 drives the vertical signal line 170, and an accumulated signal is read.

If the above-described step-by-step transfer is used, it is unnecessary to secure a potential difference between the diffusion node 204 of the photodiode 111 having the full depletion state and the FD 117, which is the input node of the amplifier circuit 118.

That is, in this example, a complete transfer is implemented even in a state in which the potential of the FD 117 filled with electrons is shallower than that of the diffusion node 204.

The operation of the transfer circuit of the pixel circuit 110A according to the first embodiment has been mainly described above.

Next, electric charge accumulation and read operations of the pixel circuit 110A of the first embodiment will be described.

FIGS. 8(A) to 8(D) are diagrams showing a timing chart when reset, electric charge accumulation, and read operations are performed in the pixel circuit of FIG. 4.

FIG. 8(A) shows a signal potential of the reset line 150, FIG. 8(B) shows a signal potential of the transfer line 140, FIG. 8(C) shows a signal potential of the row selection line 160, and FIG. 8(D) shows a signal potential of the vertical signal line 170.

As a characteristic operation of the pixel circuit 110A of the first embodiment, the transfer of accumulated electrons of the photodiode 111 to the FD 117 is performed in two steps in correspondence with driving of the transfer line 140.

That is, if a level of the transfer line 140 rises from the low level to the high level, the accumulated electrons are transferred from the diffusion node 204 of the photodiode 111 to the channel region of the second NMOS transistor 1122 as shown in step ST12 of FIG. 7(B).

Further, when the level of the transfer line 140 returns from the high level to the low level, the electrons of the channel region are transferred to the FD 117, which is the input node of the amplifier circuit 118, as shown in step ST 14 of FIG. 7(D).

For example, the reset line 150 has the high level during reset, so that the FD 117, which is the input node of the amplifier circuit 118, is connected to a reset level potential (power supply voltage 3V).

On the other hand, at a point in time when the level of the transfer line 140 has risen from the low level to the high level and has further fallen from the high level to the low level, the electrons accumulated in the photodiode 111 are transferred to the diffusion layer 205 and drawn to the reset level.

At this point in time, a new electron accumulation period T2 starts.

A reset pulse of the reset line 150 falls to the low level after waiting for the level of the transfer line 140 to fall to the low level.

Likewise, during a read operation also, the electrons accumulated in the photodiode 111 are transferred to the diffusion layer 205 at a point in time when the level of the transfer line 140 has risen from the low level to the high level and further fallen from the high level to the low level.

Therefore, the vertical signal line 170 is driven by the accumulated signal via the amplifier circuit 118 at a point in time when the level of the transfer line 140 has returned from the high level to the low level. At this point in time, the accumulation period T2 also ends.

The pixel circuit 110A according to the above-described first embodiment can facilitate an electric charge transfer within a pixel of a CMOS image sensor, improve an accumulated electric charge amount or sensitivity, and improve image pickup capability.

Here, processing of a transfer circuit system of the pixel circuit of FIG. 1 for a comparison with the pixel circuit 110A according to the above-described first embodiment will be described.

Figure 1:
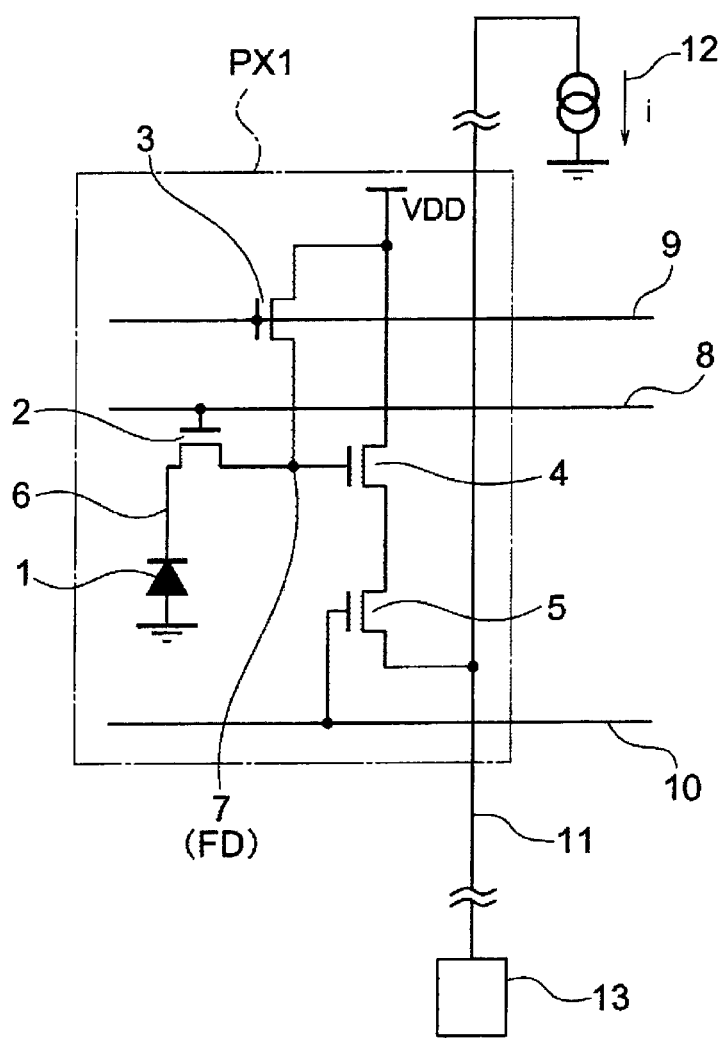
FIG. 1 is a diagram showing an example of a pixel circuit.
Figure 9:
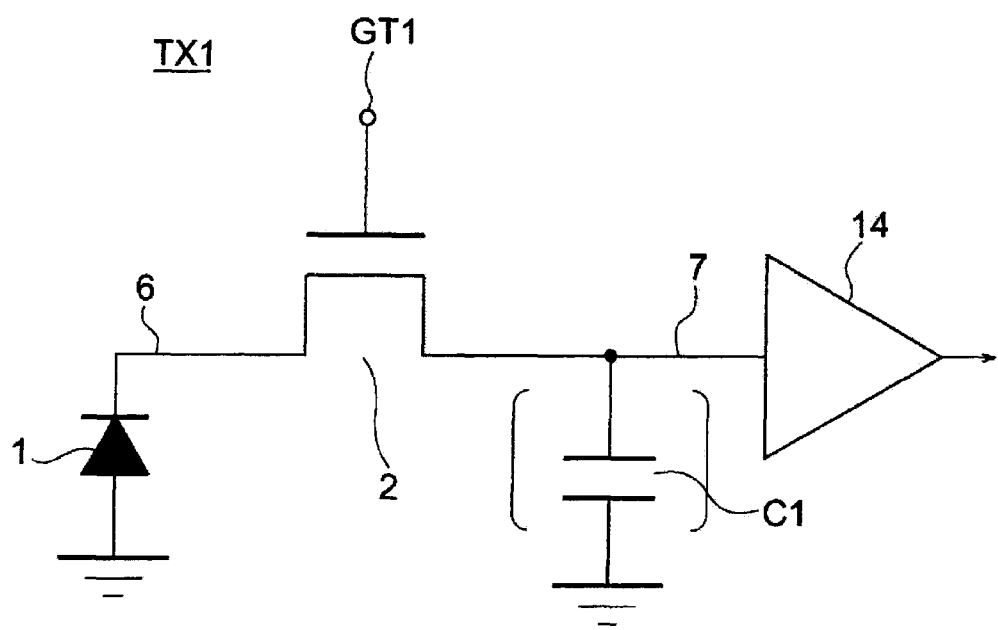
FIG. 9 is a diagram showing an equivalent circuit of a transfer circuit including a transfer transistor of the pixel circuit of FIG. 1.

FIG. 9 is a diagram showing an equivalent circuit of the transfer circuit including the transfer transistor of the pixel circuit PX1 of FIG. 1.

In the transfer circuit TX1 of FIG. 9, GT1 denotes a gate electrode, C1 denotes parasitic capacitance, and reference numeral 14 denotes the amplifier circuit. The amplifier circuit 14 is formed of the amplifier transistor 4.

In the transfer circuit TX1, electrons generated by photoelectric conversion in the photodiode 1 are accumulated in the accumulation node 6, which is a diffusion layer node of the photodiode 1.

During a read operation, the electrons are completely transferred to the FD 7, which is the input node of the amplifier circuit 14, via the transfer transistor 2.

If the FD 7, which is the input node, has the parasitic capacitance C1, an accumulated electric charge amount is Q, and a parasitic capacitance value is Cf, its potential variation amount $\Delta Vf$ is given as $\{\Delta Vf=Q/Cf\}$ as described above.

The amplifier circuit 14 uses an NMOS transistor like the normal amplifier transistor 4, but generates unique random noise Nr.

Therefore, if its gain is G, an S/N ratio of an accumulated signal occurring in the vertical signal line as an output is $\{G \cdot \Delta Vf/Nr\}$.

Because the gain G or the random noise Nr are substantially fixed if the configuration of the amplifier circuit 14 is decided, the magnitude of the potential variation amount $\Delta Vf$ directly affects image pickup performance.

FIGS. 10(A) to 10(D) are diagrams showing potential changes accompanying a read transfer operation using the pixel circuit as shown in FIGS. 1 and 3.

As in FIGS. 7(A) to 7(D), in this case also, in terms of the potential of each node, a positive potential direction is shown on the lower side in the figure and a negative potential direction is shown on the upper side.

Each node serves a well where electrons having negative electric charge are accumulated, and the potential rises to the upper side, that is, in the negative potential direction, with the well filled with the electrons.

[Step ST1]

In step ST1 of FIG. 10(A), the accumulation node 6, which is the diffusion node of the photodiode 1, is designed so that a potential bottom is about 1.5 V during full depletion in positive electric charge by a fixed number of donors. Here, it is filled with photoelectrically converted electrons up to a saturation state (about 0 V).

On the other hand, the channel region of the transfer transistor 2 is modulated in a range of R1 according to a potential applied to the gate electrode, for example, 1 V to 3 V.

The FD 7, which is the input node of the amplifier circuit 14, is reset to have a floating state of 3 V.

[Step ST2]

If the transfer transistor 2 is turned on in step ST2 of FIG. 10(B), electrons move as follows.

That is, if the transfer transistor 2 is turned on, the electrons move in a state in which all the electrons accumulated in the accumulation node 6, which is the diffusion node of the photodiode 1, have been distributed to the channel region of the transfer transistor 2 and the FD 7, which is the input node of the amplifier circuit 14.

[Step ST3]

If the potential of the channel region rises with a potential increase in the gate electrode in order to turn off the transfer transistor 2 in step ST3 of FIG. 10(C), the electrons accumulated therein move to the FD 7, which is the input node of the amplifier circuit 14.

[Step ST4]

In step ST4 of FIG. 10(D), a state is reached in which all electrons accumulated in the photodiode 1 in step ST1 have moved to the FD 7, which is the input node of the amplifier circuit 14, in a state in which the transfer transistor 2 has been turned off. Thereby, the amplifier circuit 14 drives the vertical signal line 11, and an accumulated signal is read.

As described above, it is necessary for the pixel circuit PX1 of FIG. 1 to secure a potential difference M1 between the accumulation node 6 of the photodiode 1 having a full depletion state and the FD 7, which is the input node of the amplifier circuit 14, in order to implement complete electron movement.

On the other hand, if the potential difference is not sufficiently secured, the electrons accumulated in the channel region of the transfer transistor 2 flow back to the photodiode 1, and an accumulated electron amount of the photodiode 1 is not linearly reflected in a read signal.

In order to completely transfer electrons photoelectrically converted during a read operation as described above, it is necessary to maintain the potential after the transfer of the FD 7, which is the input node of the amplifier circuit 14, as a potential higher than that of the photodiode 1 during full depletion.

However, the pixel circuit PX1 of FIG. 1 has a disadvantage in that a dynamic range of the potential of the FD 7 is limited, $\Delta Vf$ cannot be sufficiently increased, and the S/N ratio cannot be increased.

Figure 10:
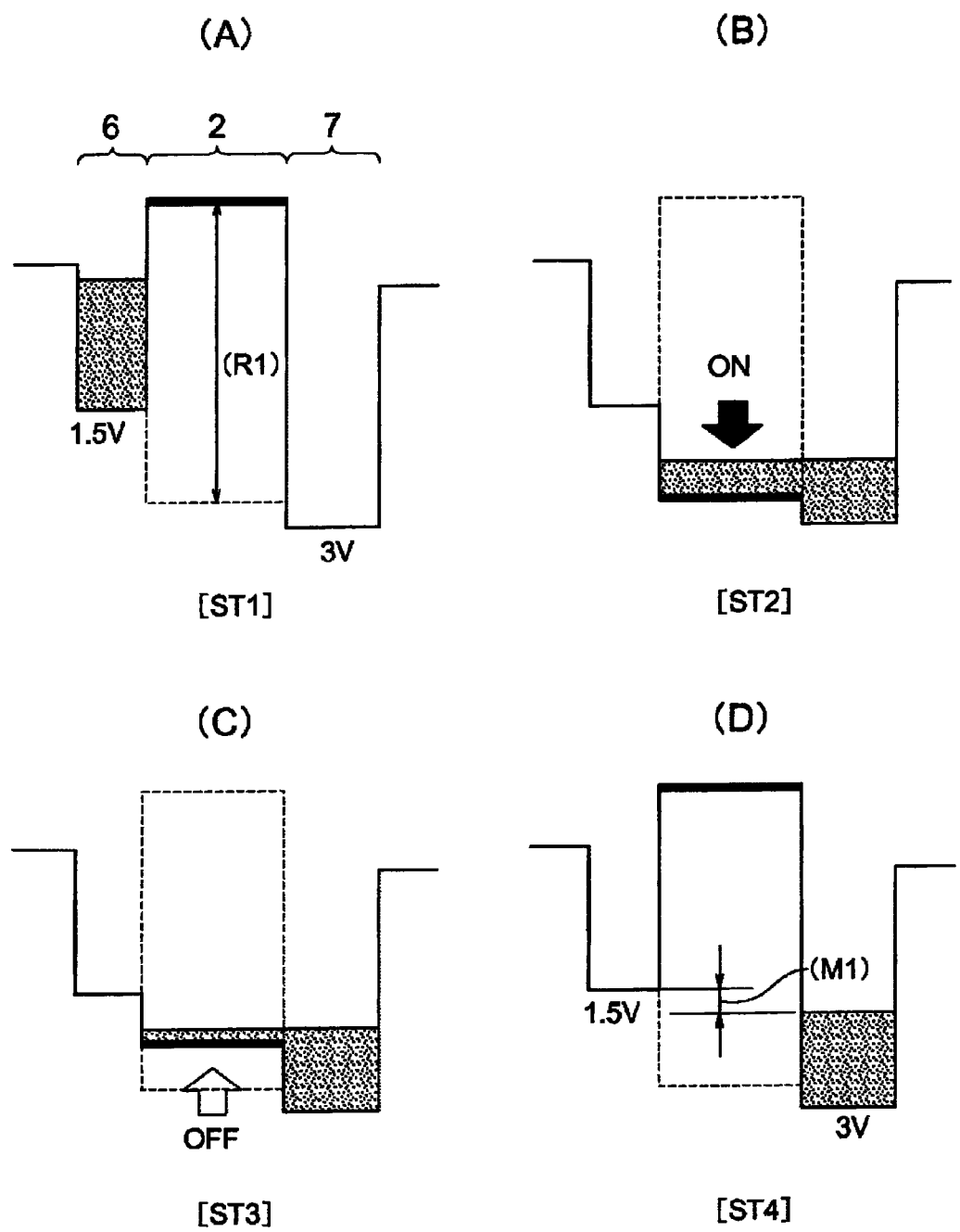
FIG. 10 is a diagram showing a potential change accompanying a read transfer operation using the pixel circuit as shown in FIGS. 1 and 3.

For example, in FIG. 10, $\Delta Vf$ has a limit of (3.0 V–1.5 V), and is further reduced by a potential difference of a transfer margin.

Further, because a saturated accumulated electric charge amount Qs of the photodiode 1 corresponds to the number of donors within its diffusion layer, the potential during the full depletion becomes deep (as a high potential) if Qs is normally increased. Thereby, a range of $\Delta Vf$ is in a narrower direction.

A problem of this transfer margin serves as a large limitation in design.

On the other hand, the pixel circuit 110A of the first embodiment adopts a transfer by integrated series transistors for the transfer of electrons from the photodiode within the pixel to the amplifier circuit. Specifically, in the pixel circuit 110A, an intermediate transfer node in which potential modulation is possible is formed in a channel portion of a MOS transistor, and accumulated electrons are transferred step by step from the photodiode 111 to the amplifier circuit 118 via the intermediate node.

Therefore, the pixel circuit 110A of the first embodiment can release the above-described potential limitation for the transfer, and hence improve a dynamic range of a signal by increasing the saturated accumulated electric charge amount Qs or reducing parasitic capacitance of an amplifier input portion.

Further, for example, the pixel circuit 110A can accumulate electrons photoelectrically converted during exposure in the channel region of the MOS transistor separately formed, not within the photodiode, and completely transfer the accumulated electrons from the channel region to the amplifier circuit during a read operation.

Therefore, the pixel circuit 110A can improve exposure sensitivity and also significantly improve the saturated accumulated electric charge amount Qs.

In the pixel circuit 110A, an electron (electric charge) transfer is performed only inside the pixel, and an analog signal of low impedance or a digital signal is transferred after driving of the vertical signal line by the amplifier circuit.

Therefore, it is possible to implement a high-speed, low-power consumption imager without a problem of M smear or transfer leak.

<2. Second Embodiment>

Figure 11:
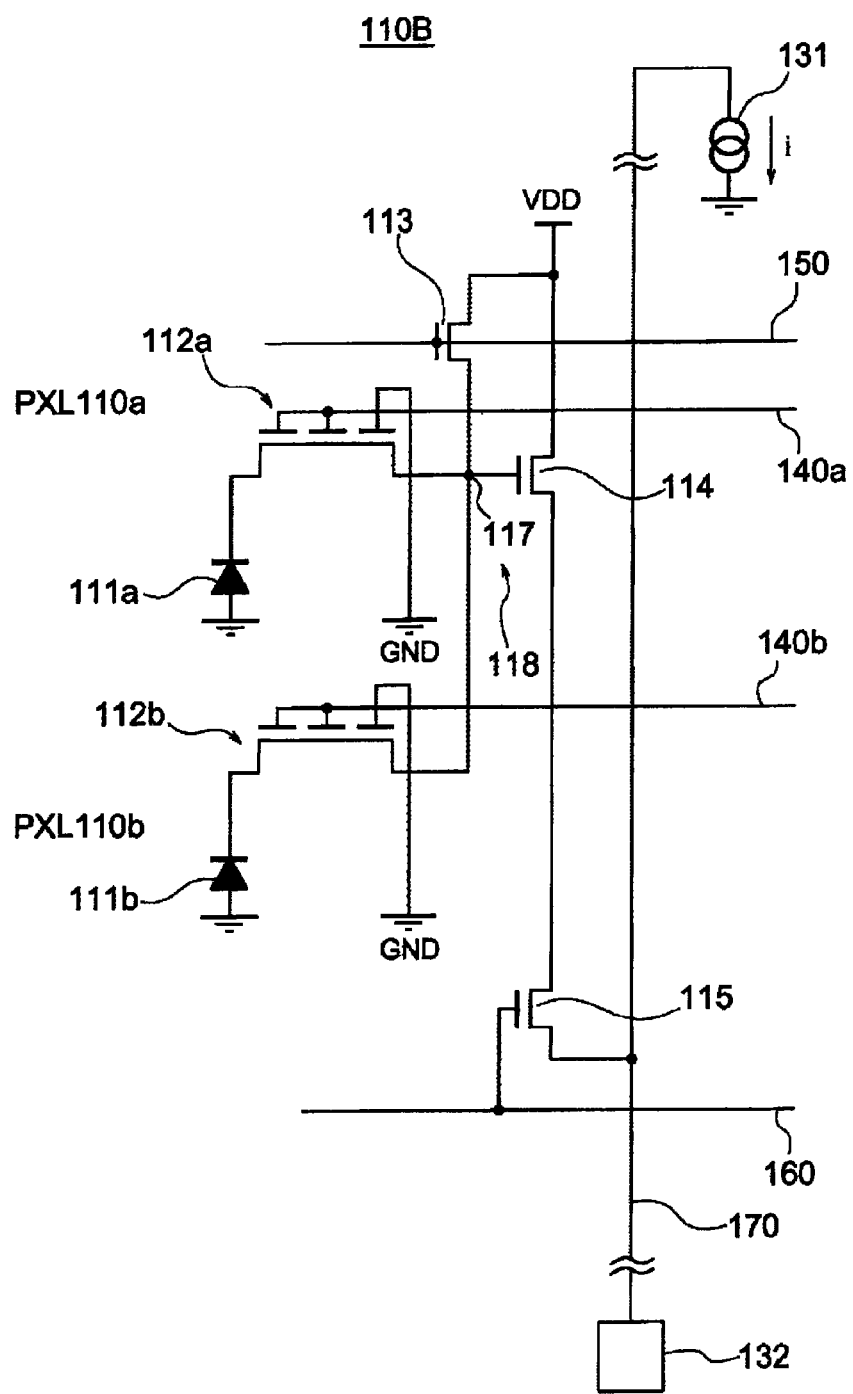
FIG. 11 is a diagram showing a pixel circuit of a CMOS image sensor according to a second embodiment of the present invention.

FIG. 11 is a diagram showing a pixel circuit of a CMOS image sensor according to a second embodiment of the present invention.

A difference between a pixel circuit 110B according to the second embodiment and the pixel circuit 110A according to the first embodiment is as follows.

In the pixel circuit 110B according to the second embodiment, a plurality of pixels, for example, two pixels PXL110a and PXL110b, respectively having a unique photodiode 111 and a unique transfer circuit 112, share FD 117 and an amplifier transistor 114 forming an amplifier circuit.

In the pixel circuit 110B, the plurality of pixels PXL110a and PXL110b also share a reset transistor 113 and a row selection transistor 115.

In transfer transistors 112a and 112b of the respective pixels PXL110a and PXL110b, shared gate electrodes of first and second NMOS transistors are respectively connected to different transfer lines 140a and 140b.

Incidentally, gate electrodes of third MOS transistors 1123 of the transfer transistors 112a and 112b of the respective pixels PXL110a and PXL110b are respectively grounded.

In the pixel circuit 110B, electrons accumulated in respective photodiodes 111a and 111b are transferred to the FD117 (an input node of the amplifier circuit) at individual timings according to the respectively independent transfer lines 140a and 140b.

The sharing of the amplifier circuit can reduce an effective size of the pixel, but parasitic capacitance of the FD 117 also increases when the number of sharing pixels increases.

Therefore, it is preferable that the number of sharing pixels be equal to or greater than 2 and equal to or less than 16.

The second embodiment can have the same advantageous effects as the above-described first embodiment.

<3. Third Embodiment>

Figure 12:
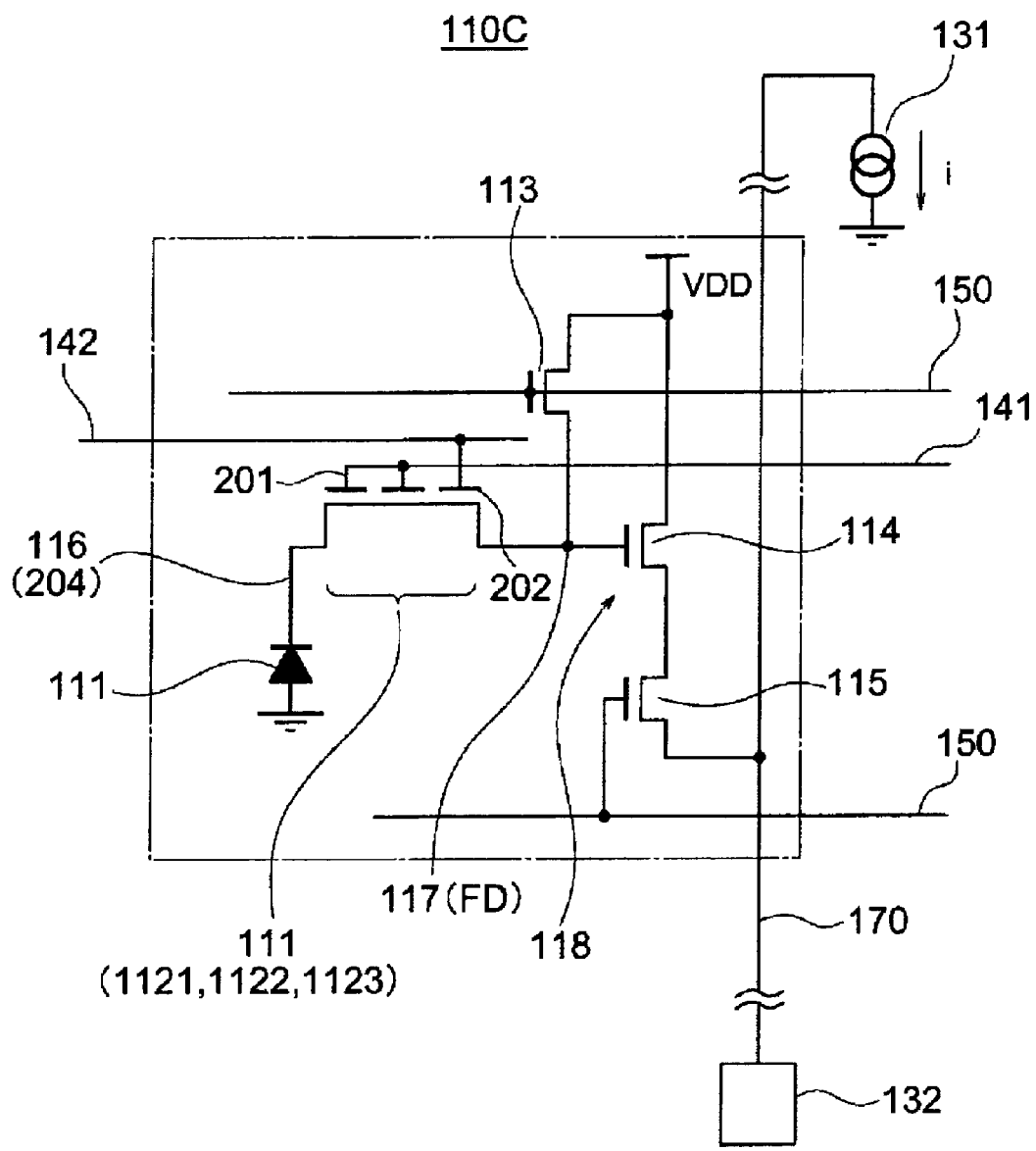
FIG. 12 is a diagram showing a pixel circuit of a CMOS image sensor according to a third embodiment of the present invention.

FIG. 12 is a diagram showing a pixel circuit of a CMOS image sensor according to a third embodiment of the present invention.

A difference between a pixel circuit 110C according to the third embodiment and the pixel circuit 110A according to the first embodiment is as follows.

In the pixel circuit 110C of the third embodiment, a gate electrode 202 of a third NMOS transistor 1123, which has a fixed potential in the first embodiment, is subsidiarily driven by a row selection circuit 120, which is a peripheral circuit.

Specifically, a shared gate electrode 201 of first and second NMOS transistors 1121 and 1122 is connected to a first transfer line 141, and the gate electrode 202 of the third NMOS transistor 1123 is connected to a second transfer line (separation line) 142.

Thereby, as the transfer via the third NMOS transistor 1123 can be facilitated, a driving range at the side of the gate electrode 201 can be narrowed.

While there is a disadvantage in an area when the number of driving wirings is increased by 1, there is an advantage in voltage resistance or reliability when the driving range of the first transfer line 141 can be narrowed.

FIGS. 13(A) to 13(D) are diagrams showing potential changes accompanying the read transfer operation using the pixel circuit 110C according to the third embodiment.

[Step ST21]

In step ST21 of FIG. 13(A), a diffusion node 204 of a photodiode 111 is designed so that a potential bottom is about 2.0 V during full depletion in positive electric charge by a fixed number of donors. Here, it is filled with photoelectrically converted electrons up to a saturation state (about 0 V).

On the other hand, in channel regions of the first NMOS transistor 1121 and the second NMOS transistor 1122, potentials are respectively modulated in ranges of R13 and R14 according to a potential commonly applied to gate electrodes of the two, for example, −0.5 V to 3 V.

On the other hand, in a channel region of the third NMOS transistor 1123 as a separation transistor, a potential uniquely applied to its gate electrode is modulated in a range of R15, for example, according to 0 V to 3 V.

A diffusion layer 205 (FD 117), which is an input node of an amplifier circuit 118, is reset to have a floating state of 3 V.

[Step ST22]

If the first NMOS transistor 1121 and the second NMOS transistor 1122 are turned on in step ST22 of FIG. 13(B), an electron transfer is performed as follows.

That is, electrons accumulated in the diffusion node 204 of the photodiode 111 all move to the channel region of the second NMOS transistor 1122 via the first NMOS transistor 1121.

That is, the electrons move to the channel region of the second NMOS transistor 1122 having a deep depletion state and are accumulated in an analog state.

At this time, the potential of the channel region of the third NMOS transistor 1123 is shallower than that of the second NMOS transistor 1122 (as a low potential), and forms a barrier between the second NMOS transistor 1122 and the diffusion layer 205 (the FD 117), which is the input node of the amplifier circuit 118.

[Step ST23]

If the first NMOS transistor 1121 and the second NMOS transistor 1122 are turned off again in step ST23 of FIG. 13(C), the potentials of the channel regions are modulated in the negative potential direction.

Here, a channel of the first NMOS transistor 1121 forms a potential barrier, and prevents accumulated electrons from flowing back to the diffusion node 204 of the photodiode 111.

A height of the barrier corresponds to a difference between thresholds of two transistors of the first NMOS transistor 1121 and the second NMOS transistor 1122, for example, 1.5 V.

In this step, a state in which the accumulated electrons have been separated from both the diffusion node 204 of the photodiode 111 and the diffusion layer 205 (the FD 117), which is the input of the amplifier circuit 118, is possible.

It may proceed to the next step at once by directly or simultaneously driving the gate of the third NMOS transistor 1123, but it is also possible to add a new function by temporarily retaining this intermediate state as will be described later.

[Step ST24]

If the gate electrode 202 of the third NMOS transistor 1123 is driven through the second transfer line 142 as the separation line in step ST24 of FIG. 13(D) and the third NMOS transistor 1123 is turned on, the accumulated electrons flow into the FD 117, which is the input node of the amplifier circuit 118.

Further, at a point in time when the third NMOS transistor 1123 has been turned off, a state is reached in which all the accumulated electrons have moved to the diffusion layer 205 (the FD 117), which is the input node of the amplifier circuit 118.

Thereby, the amplifier drives the vertical signal line and an accumulated signal is read.

As described above, the transfer from the channel of the second NMOS transistor 1122 to the FD 117, which is the input node of the amplifier circuit 118, in the third embodiment is performed as follows.

It is implemented by combining both OFF driving of the shared gate electrode 201 of the first and second NMOS transistors 1121 and 1122 of step ST23 and auxiliary ON/OFF driving of the gate electrode 202 of the third NMOS transistor 1123 of step ST24.

If the above-described step-by-step transfer is used, it is unnecessary to secure a potential difference between the diffusion node 204 of the photodiode 111 having the full depletion state and the FD 117, which is the input node of the amplifier circuit 118.

That is, in this example, a complete transfer is implemented even in a state in which the potential of the FD 117 filled with electrons is shallower than that of the diffusion node 204.

The transfer operation of the pixel circuit 110C according to the third embodiment has been mainly described above.

Next, electric charge accumulation and read operations of the pixel circuit 110C of the third embodiment will be described.

FIGS. 14(A) to 14(E) are diagrams showing a timing chart when the reset, electric charge accumulation, and read operations are performed in the pixel circuit of FIG. 12.

FIG. 14(A) shows a signal potential of a reset line 150, FIG. 14(B) shows a signal potential of the first transfer line 141, and FIG. 14(C) shows a signal potential of the second transfer line 142. FIG. 14(D) shows a signal potential of a row selection line 160, and FIG. 14(E) shows a signal potential of a vertical signal line 170.

Figure 8:
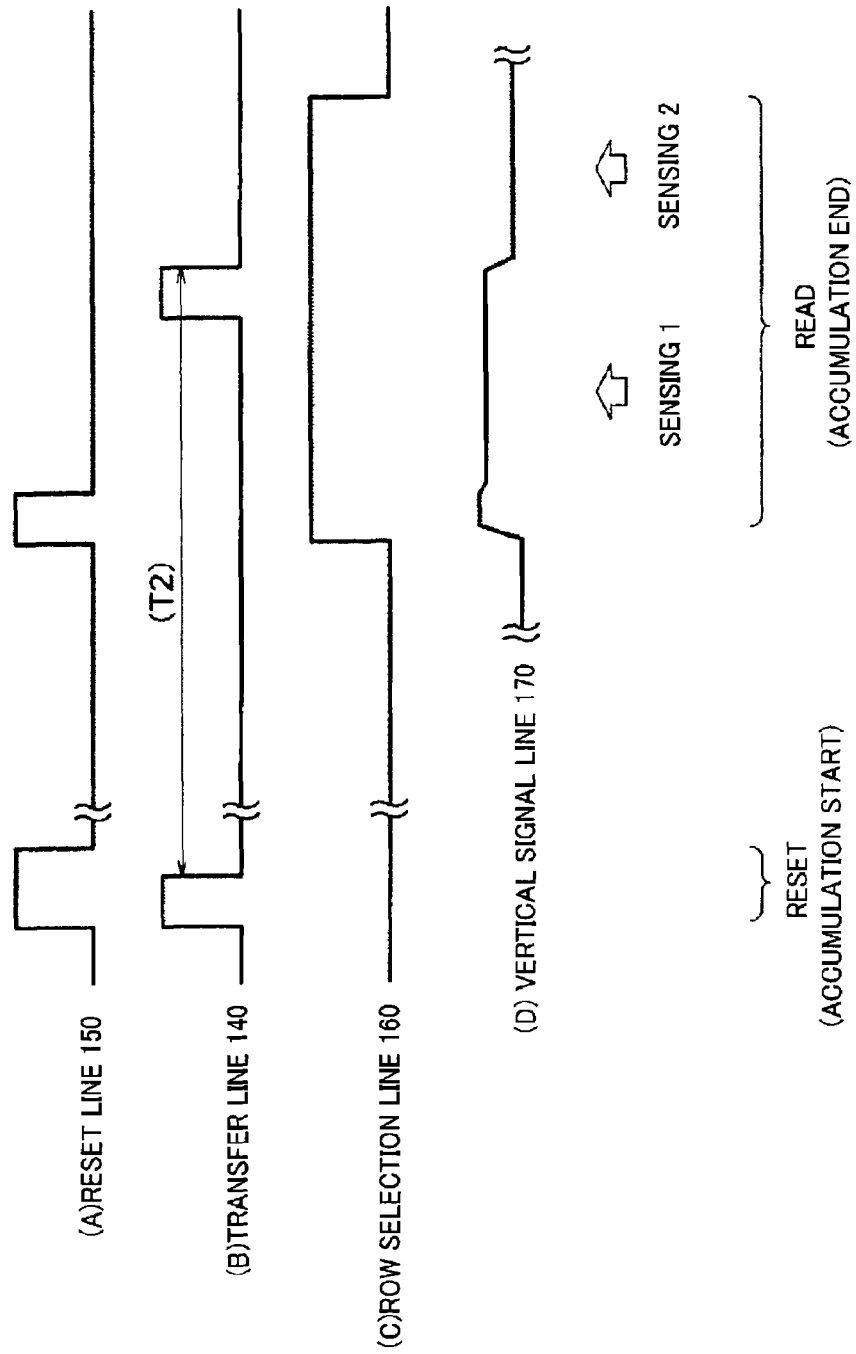
FIG. 8 is a diagram showing a timing chart when reset, electric charge accumulation, and read operations are performed in the pixel circuit of FIG. 4.

A main difference in the operation between the third embodiment and the first embodiment shown in FIG. 8 is as follows.

In the third embodiment, an ON/OFF pulse of the second transfer line 142, which drives the third NMOS transistor 1123, is added to assist the transfer of accumulated electrons when the first and second NMOS transistors 1121 and 1122 are turned off by the first transfer line 141.

That is, if a level of the first transfer line 141 rises from the low level to the high level, the accumulated electrons are transferred from the diffusion node 204 of the photodiode 111 to the channel region of the second NMOS transistor 1122 as shown in step ST22 of FIG. 13(B).

Further, if the level of the first transfer line 141 returns from the high level to the low level and the second transfer line 142 as the separation line has the high level at substantially the same time, the electrons move as follows.

As shown in step ST24 of FIG. 13(D), the third NMOS transistor 1123 as the separation transistor is conductive and the accumulated electrons flow into the FD 117, which is the input node of the amplifier circuit 118.

Ultimately, if the level of the second transfer line 142 as the separation line falls to the low level, a complete transfer of electrons to the FD 117, which is the input node of the amplifier circuit 118, is completed.

For example, the reset line 150 has the high level during reset, so that the FD 117, which is the input node of the amplifier circuit, is connected to a reset level potential (power supply voltage 3 V).

On the other hand, the level of the first transfer line 141 rises from the low level to the high level, so that extra electrons accumulated in the photodiode 111 are transferred to a channel portion CH2 of the second NMOS transistor 1122 via the first NMOS transistor 1121.

Further, the level of the first transfer line 141 falls from the high level to the low level and the second transfer line 142 as the separation line has the high level at substantially the same time, so that the third NMOS transistor 1123, which is the separation transistor, is conductive.

Ultimately, if the level of the second transfer line 142 as the separation line falls to the low level, the accumulated electrons are completely transferred to the FD 117 and drawn to the reset level.

At this point in time, a new electron accumulation period T3 starts. More precisely, T3 starts at a point in time when the level of the first transfer line 141 has fallen from the high level to the low level.

Likewise, the level of the first transfer line 141 first rises from the low level to the high level during a read operation also, so that the electrons accumulated in the photodiode 111 are transferred to the channel portion of the second MOS transistor 1122 via the first NMOS transistor 1121.

Further, if the level of the first transfer line 141 falls from the high level to the low level and the level of the second transfer line 142 as the separation line rises to the high level at substantially the same time and further ultimately falls to the low level, the electrons are completely transferred to the FD 117, which is the input node of the amplifier circuit 118.

At this point in time, the accumulation period T3 ends.

The timing that the second transfer line 142 as the separation line is turned on at the high level may be before/after the timing that the first transfer line 141 is turned off at the low level.

If the amplifier transistor 114 has been turned on through the FD 117 before the first transfer line 141 has an OFF level, it moves to step ST14 of FIG. 13(D) by skipping the states of step ST22 of FIG. 13(B) to step ST23 of FIG. 13(C).

However, a complete transfer can be implemented if the second transfer line 142 as the separation line has the OFF level after the first transfer line 141 has the OFF level.

The third embodiment can improve voltage resistance or reliability in addition to the advantageous effects of the first embodiment.

<4. Fourth Embodiment>

Figure 15:
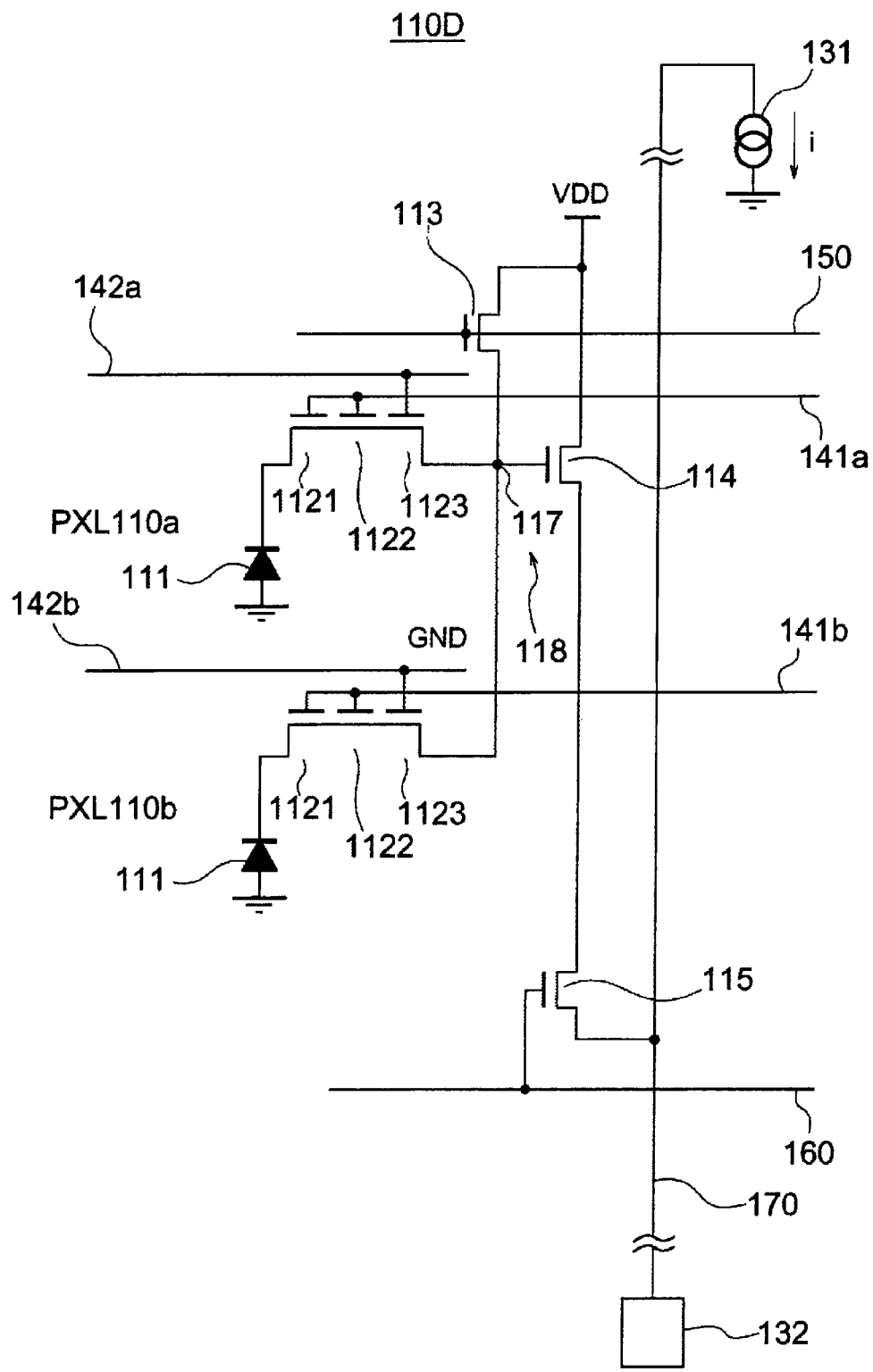
FIG. 15 is a diagram showing a pixel circuit of a CMOS image sensor according to a fourth embodiment of the present invention.

FIG. 15 is a diagram showing a pixel circuit of a CMOS image sensor according to a fourth embodiment of the present invention.

A difference between a pixel circuit 110D according to the fourth embodiment and the pixel circuit 110C according to the third embodiment is as follows.

In the pixel circuit 110D according to the fourth embodiment, a plurality of pixels, for example, two pixels PXL110a and PXL110b, respectively having a unique photodiode 111 and a unique transfer circuit 112, share FD 117 and an amplifier transistor 114 forming an amplifier circuit.

In the pixel circuit 110D, the plurality of pixels PXL110a and PXL110b also share a reset transistor 113 and a row selection transistor 115.

In transfer transistors 112a and 112b of the respective pixels PXL110a and PXL110b, shared gate electrodes of first and second NMOS transistors are respectively connected to different first transfer lines 141a and 141b.

Gate electrodes of third MOS transistors 1123 of the transfer transistors 112a and 112b of the respective pixels PXL110a and PXL110b are respectively connected to second transfer lines 142a and 142b as separation lines.

In the pixel circuit 110D, electrons accumulated in respective photodiodes 111a and 111b are transferred to the FDF 117 at individual timings according to the respectively independent first transfer lines 141a and 141b and the second transfer lines 142a and 142b as the separation lines.

The sharing of the amplifier circuit can reduce an effective size of the pixel, but parasitic capacitance of the FD 117 also increases when the number of sharing pixels increases.

Therefore, it is preferable that the number of sharing pixels be equal to or greater than 2 and equal to or less than 16.

The fourth embodiment can have the same advantageous effects as the above-described first embodiment.

Next, an application operation, which makes it possible to perform large-capacity accumulation by utilizing the configuration of the pixel circuit according to the embodiment of the present invention, will be described.

The large-capacity accumulation operation is applicable to any circuit configuration of the above-described first to fourth embodiments, and will be described below as fifth and sixth embodiments.

<5. Fifth Embodiment>

In a fifth embodiment of the present invention, electric charge accumulation is applied using the pixel circuit configuration of FIG. 4 and the deep depletion state of the second NMOS transistor 1122 adopted in the first embodiment.

Specifically, electrons accumulated in the diffusion node 204, which is the diffusion layer of the photodiode 111, are transferred to the channel portion of the second NMOS transistor 1122 and accumulated in the channel portion during an accumulation period.

That is, during the accumulation period of a pixel, the gate electrode 201 is maintained at a level of an ON state so that the first and second NMOS transistors 1121 and 1122 are maintained in the ON state.

Electrons photoelectrically converted by the photodiode 111 are directly transferred to the channel portion CH2 of the second NMOS transistor 1122 via the first NMOS transistor 1121, and accumulated in the channel portion CH2.

At a point in time when accumulation is completed and read is performed, the gate electrode 201 is driven to turn off the first and second NMOS transistors 1121 and 1122. Thereby, the accumulated electrons are transferred to the FD 117, which is the input node of the amplifier circuit 118, via the third NMOS transistor 1123.

FIGS. 16(A) to 16(D) are diagrams showing a timing chart of an operation of the fifth embodiment.

FIG. 16(A) shows a signal potential of the reset line 150, FIG. 16(B) shows a signal potential of the transfer line 140, FIG. 16(C) shows a signal potential of the row selection line 160, and FIG. 16(D) shows a signal potential of the vertical signal line 170.

In the fifth embodiment, a pixel circuit is the same as shown in FIG. 4, and details and a cross-sectional configuration of a transfer circuit are the same as shown in FIGS. 5 and 6.

The same reset as in FIGS. 8(A) to 8(D) is performed. After new accumulation starts, the transfer line 140 has the high-level state again, and is maintained in the high-level state during an accumulation period T4.

During this period, electrons photoelectrically converted by the photodiode 111 are not accumulated within the diffusion layer, but are directly transferred to the channel region of the second NMOS transistor 1122 and accumulated in the channel region.

During a read operation, first, the row selection line 160 has the high level, and an output of the amplifier circuit is connected to the vertical signal line 170.

Further, the FD 117, which is the input node of the amplifier circuit 118, is reset by a pulse directed to the reset line 150, and the FD 117 is connected to a power supply voltage source, so that the reset level is read.

Next, the transfer line 140 has a transition from the high level to the low level.

Thereby, the electrons accumulated in the channel region of the second NMOS transistor 1122 are transferred to the FD 117, which is the input node of the amplifier circuit 118, and an accumulated signal is read.

The accumulation period T4 also ends with the transition of the transfer line 140.

A potential change of this embodiment is based on FIGS. 7(A) to 7(D), but the duration of electron accumulation has the state of step ST12 of FIG. 7(B), not step ST11 of FIG. 7(A).

In the accumulation period, the first NMOS transistor 1121 and the second NMOS transistor 1122 are maintained in the ON state. Then, electrons photoelectrically converted by the photodiode 111 and collected in the diffusion node 204 directly move to the channel region of the second NMOS transistor 1122 via the first NMOS transistor 1121.

That is, the electrons move to the channel region of the second NMOS transistor 1122 having the deep depletion state, and are accumulated in an analog state.

The transfer of electrons from the second NMOS transistor 1122 to the diffusion layer 205 during a read operation is the same as the process of steps ST13 and ST14 of FIGS. 7(C) and 7(D).

As described above, during the accumulation period, the electrons photoelectrically converted in the state of step ST12 of FIG. 7(B) are all accumulated in the channel region of the second NMOS transistor 1122, and there is no saturation until its potential well is full.

Therefore, it is possible to accumulate a larger number of electrons than in accumulation directed to a normal photodiode if accumulation capacity is sufficiently increased in the deep depletion state of the second NMOS transistor 1122.

Further, during this period, the photodiode 111 is constantly maintained in the same full depletion state. Therefore, sensitivity or linearity of an accumulation time and an accumulated signal is improved.

In general, in terms of electron/hole pairs generated by light incidence directed to a photodiode, holes generated inside a depletion layer are drawn by its internal electric field and rapidly discharged to a substrate.

However, if electrons are accumulated inside the photodiode, the internal electric field is mitigated, hole discharge capability is reduced, and electrons and holes are easily recombined.

Thereby, there is a problem in that sensitivity is gradually reduced.

On the other hand, this problem does not occur in the fifth embodiment.

Because there is no problem even when a saturated accumulated electric charge amount of the photodiode itself is little, it is possible to suppress a dark current or white spot from occurring by reducing an impurity concentration of the diffusion layer.

In this case, the potential formed in the diffusion node 204 of the photodiode 111 can be shallow during reset. Therefore, the modulation ranges R11 and R12 of the channel regions of the first NMOS transistor 1121 and the second NMOS transistor 1122 can also be decreased and securement of reliability of voltage resistance or the like is facilitated.

As described above, it is possible to improve all basic performances of an image pickup device for an accumulated electric charge amount, sensitivity, and a white spot.

<6. Sixth Embodiment>

A sixth embodiment in which the same concept is applied to the third embodiment will be described.

FIG. 17(A) shows a signal potential of the reset line 150, FIG. 17(B) shows a signal potential of the first transfer line 141, and FIG. 17(C) shows a signal potential of the second transfer line (separation line) 142. FIG. 17(D) shows a signal potential of the row selection line 160, and FIG. 17(E) shows a signal potential of the vertical signal line 170.

In the sixth embodiment, a pixel circuit is the same as that of FIG. 12, and a potential change of the transfer is based on FIGS. 13(A) to 13(D).

The same reset as in FIGS. 14(A) to 14(E) is performed. After new accumulation starts, the first transfer line 141 is in the high-level state again, and is maintained in the high-level state during an accumulation period T5.

During this period, electrons photoelectrically converted by the photodiode 111 are not accumulated within the diffusion layer, but are directly transferred to the channel region of the second NMOS transistor 1122 and accumulated in the channel region.

That is, the state of step ST22 of FIG. 13(B) of the potential diagrams is retained.

During a read operation, first, the row selection line 160 has the high level, and an output of the amplifier circuit 118 is connected to the vertical signal line 170.

Further, the FD 117, which is the input node of the amplifier circuit 118, is reset by a pulse directed to the reset line 150, and the FD 117 is connected to a power supply voltage source, so that a reset level is read.

Next, the first transfer line 141 has a transition from the high level to the low level, and further a pulse is also applied to the second transfer line 142 as the separation line.

Thereby, electrons accumulated in the channel region of the second NMOS transistor 1122 are transferred to the FD 117, which is the input node of the amplifier circuit 118, and an accumulated signal is read.

The accumulation period T5 also ends with the transition of the first transfer line 141.

As described above, during the accumulation period, the electrons photoelectrically converted in the state of step ST22 of FIG. 13(B) are all accumulated in the channel region of the second NMOS transistor 1122, and there is no saturation until its potential well is full.

Therefore, it is possible to accumulate a larger number of electrons than in accumulation directed to a normal photodiode if accumulation capacity is sufficiently increased in the deep depletion state of the second NMOS transistor 1122.

Figure 7:
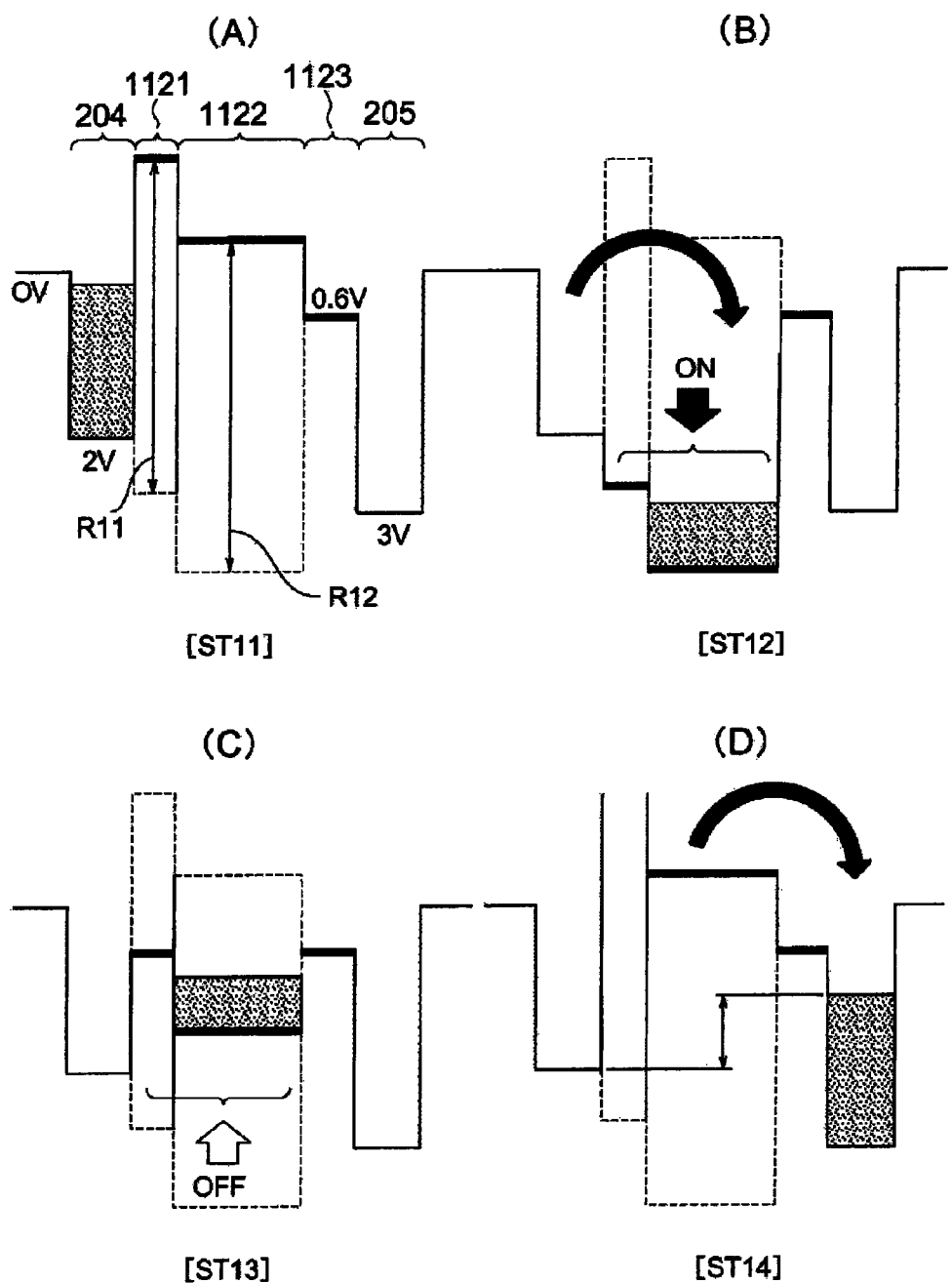
FIG. 7 is a diagram showing a potential change accompanying a read transfer operation using the transfer circuit of the pixel circuit according to the first embodiment.

Incidentally, the intermediate state of step ST13 in the potential change of FIG. 7 showing the first embodiment is as follows.

Electrons accumulated in the channel region of the second NMOS transistor 1122, which is the intermediate accumulation node, are separated from the FD 117, which is in the amplifier input, as well as from the diffusion node 204 of the photodiode 111.

That is, electrons newly photoelectrically converted in the diffusion node 204 of the photodiode 111 do not flow into the intermediate accumulation node and electrons accumulated in the intermediate accumulation node do not flow into the FD 117.

In the first embodiment, the shared gate of the first and second NMOS transistors 1121 and 1122 is driven in three values, and the above-described state is implemented at its intermediate voltage, so that the intermediate state can be retained during a fixed period.

Figure 13:
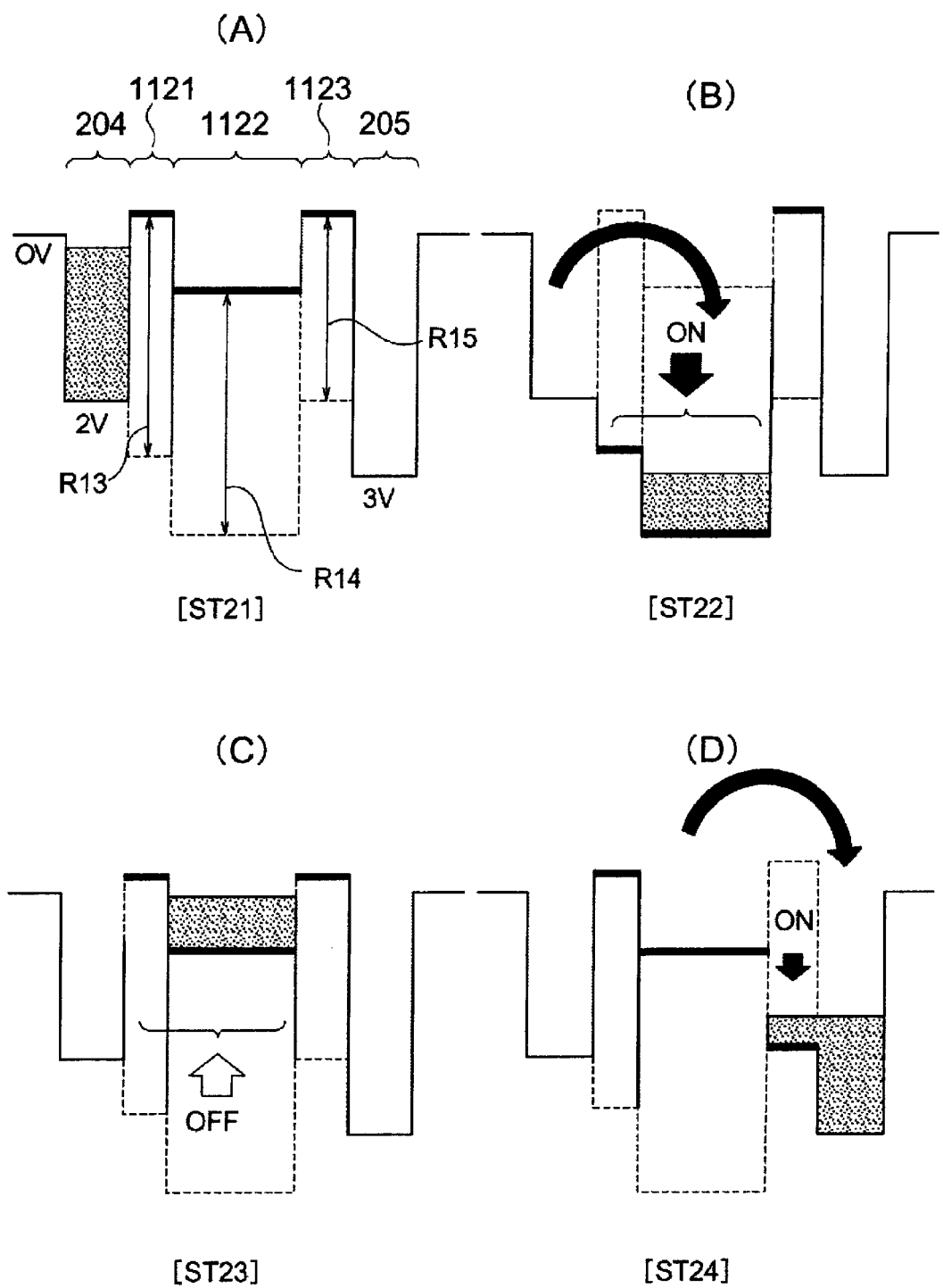
FIG. 13 is a diagram showing a potential change accompanying a read transfer operation using the pixel circuit according to the third embodiment.

Likewise, the potential change of FIG. 13 showing the second embodiment in the intermediate state of step ST23 is as follows.

The electrons accumulated in the channel region of the second NMOS transistor 1122, which is the intermediate accumulation node, are separated from the FD 117, which is in the amplifier input, as well as from the diffusion node 204 of the photodiode 111.

In this case, it is possible to retain the intermediate state during a fixed period by turning off all the first and second NMOS transistors 1121 and 1122 and the third NMOS transistor 1123 by a gate electrode driving operation.

Various additional functions can be implemented if accumulated electrons received from the photodiode 111 are kept during a fixed period in the intermediate accumulation node in which potential modulation is possible.

More specifically, the fixed period is, for example, a period equal to or greater than a minimum accumulation period, or a period equal to or greater than a period taken to read one row.

Hereinafter, three functions of large-capacity accumulation, a global shutter, and a wide dynamic range will be sequentially described in seventh to fourteenth embodiments.

All of the seventh to twelfth embodiments can be equally performed using each configuration of the above-described first to fourth embodiments.

<7. Seventh Embodiment>

FIGS. 18(A) to 18(D) are diagrams showing a timing chart of a pixel operation adopting the above-described intermediate retention mode and improving the large-capacity accumulation operation of the fifth embodiment in a seventh embodiment.

Figure 18:
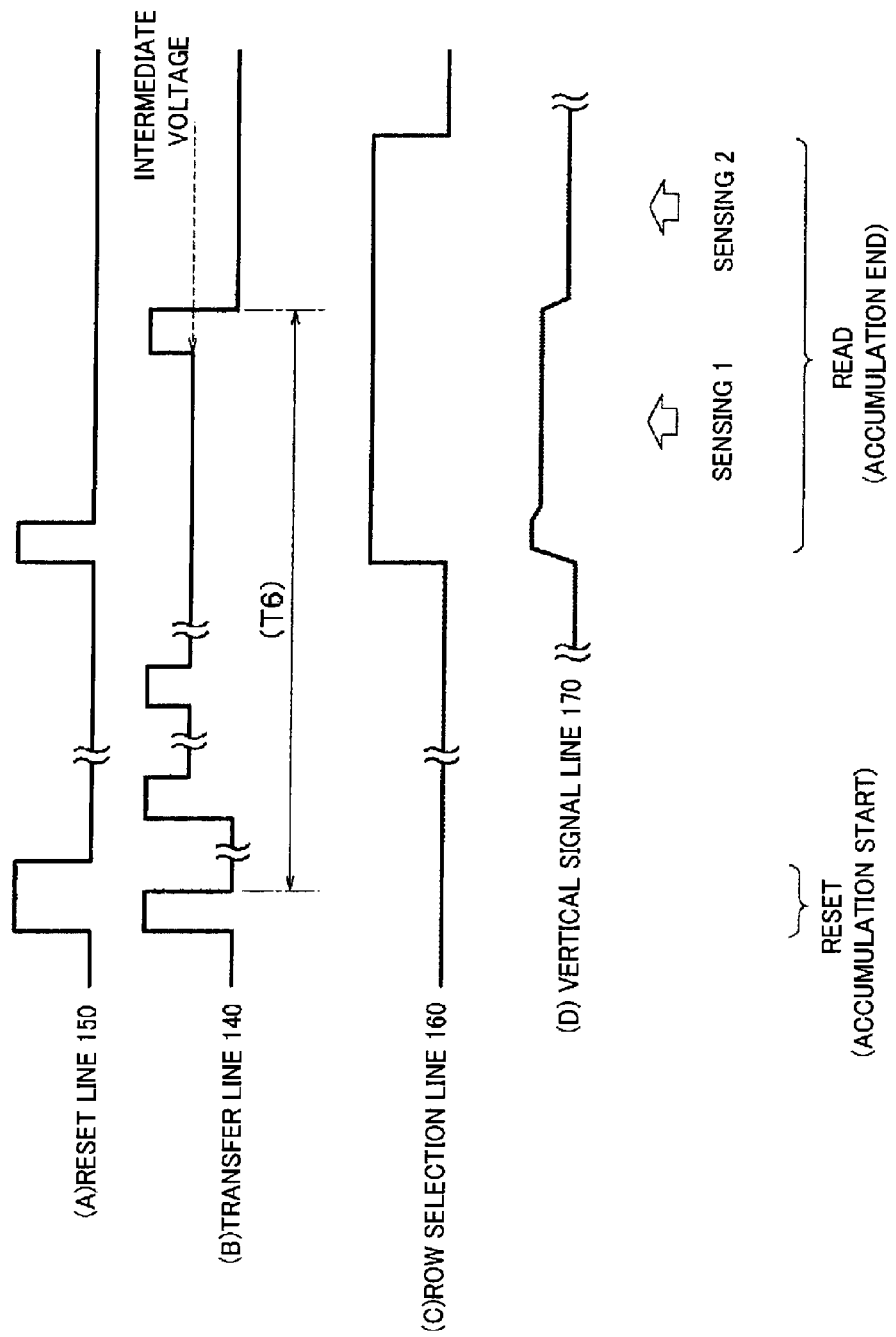
FIG. 18 is a diagram showing a timing chart of a pixel operation adopting an intermediate retention mode and improving a large-capacity accumulation operation of the fifth embodiment in a seventh embodiment.

FIG. 18(A) shows a signal potential of the reset line 150, FIG. 18(B) shows a signal potential of the transfer line 140, FIG. 18(C) shows a signal potential of the row selection line 160, and FIG. 18(D) shows a signal potential of the vertical signal line 170.

In the seventh embodiment, a pixel circuit is the same as shown in FIG. 4, and details and a cross-sectional configuration of a transfer circuit are the same as shown in FIGS. 5 and 6.

If the first and second NMOS transistors 1121 and 1122 are continuously opened via the gate electrode 201, there is a tendency for a potential of the photodiode 111 of FIG. 6 around the gate to rise and a dark current to increase.

In view of the above-described problem, the seventh embodiment, which is an improved example, suppresses the dark current from being increased by driving the gate electrode 201 and intermittently turning on the first and second NMOS transistors 1121 and 1122.

Figure 16:
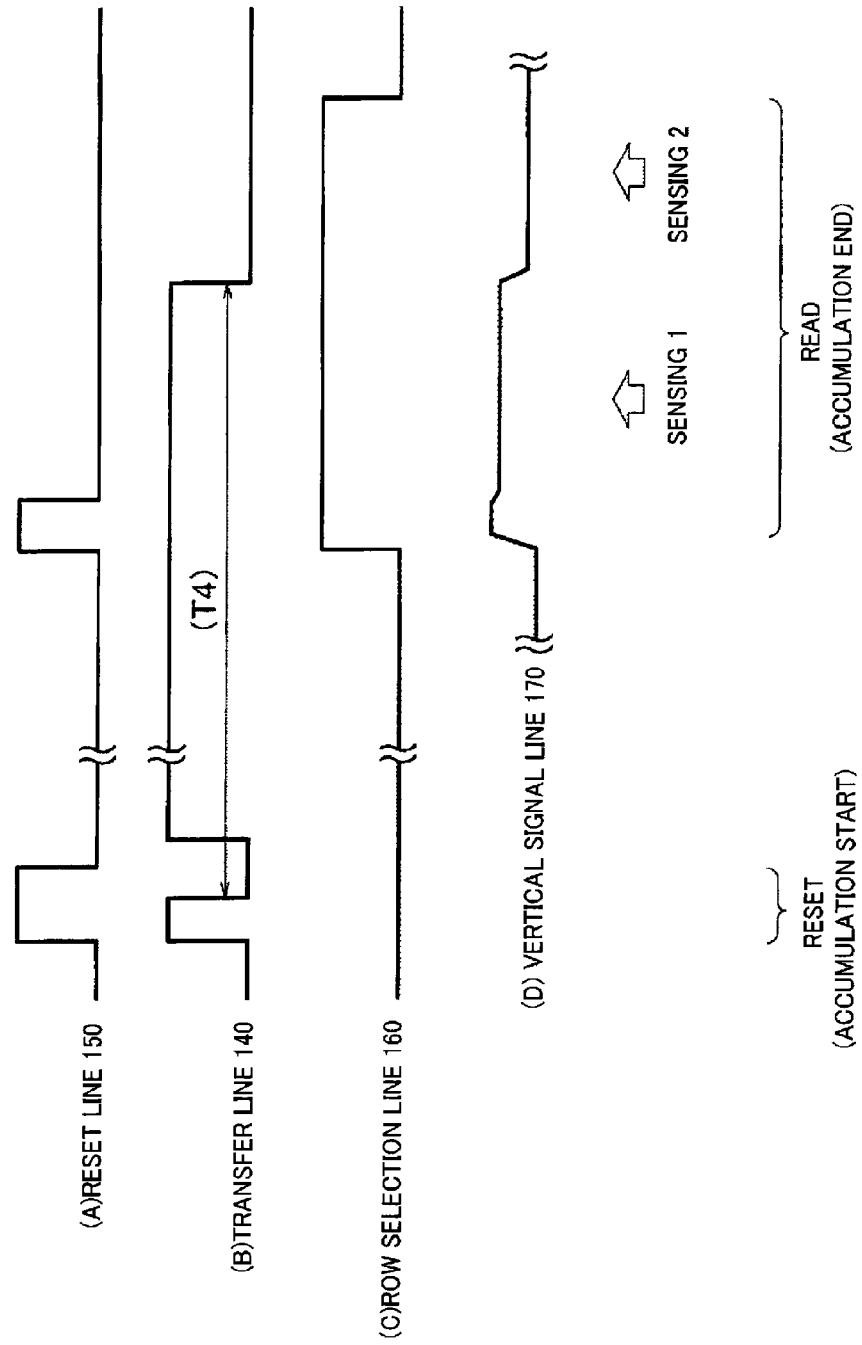
FIG. 16 is a diagram showing a timing chart of an operation of a fifth embodiment.

That is, first, new accumulation is started by performing the same reset operation as that of FIG. 8 or 16. Thereafter, during an accumulation period T6, electrons are transferred from the photodiode 111 to the intermediate accumulation node by time division by causing the first and second NMOS transistors 1121 and 1122 to intermittently have the high level without being continuously opened via the gate electrode 201.

During the accumulation period other than a transfer time after an initial transfer, the gate electrode 201 is kept at the intermediate potential, and the intermediate state of step ST13 of FIG. 7(C) is maintained in the intermediate accumulation node.

The gate electrode 201 has the high level again during a read operation, and electrons remaining in the photodiode 111 are transferred to the intermediate accumulation node. Ultimately, the gate electrode 201 has the low level, and accumulated electrons of the intermediate accumulation node are together collectively transferred to the FD 117, which is the amplifier input.

Normally, because all photoelectrically converted electrons are accumulated in the photodiode 111 after the reset operation, its saturated accumulated electric charge amount Qs decides a dynamic range of a pixel.

However, if the accumulation capacity of the intermediate accumulation node having the channel portion of the second NMOS transistor 1122 is sufficiently large, it is possible to accumulate a larger amount of electric charge than normal by transferring the accumulated electric charge of the photodiode 111 to the intermediate accumulation node a plurality of times by time division.

Because a period in which the first and second NMOS transistors 1121 and 1122 are turned on through the gate electrode 201 can be sufficiently reduced as compared to the accumulation period, it is also possible to prevent a dark current from being increased.

<8. Eighth Embodiment>

FIGS. 19(A) to 19(E) are diagrams showing a timing chart of a pixel operation adopting the same intermediate retention mode as that of the seventh embodiment and improving the large-capacity accumulation operation of the sixth embodiment in an eighth embodiment.

Figure 19:
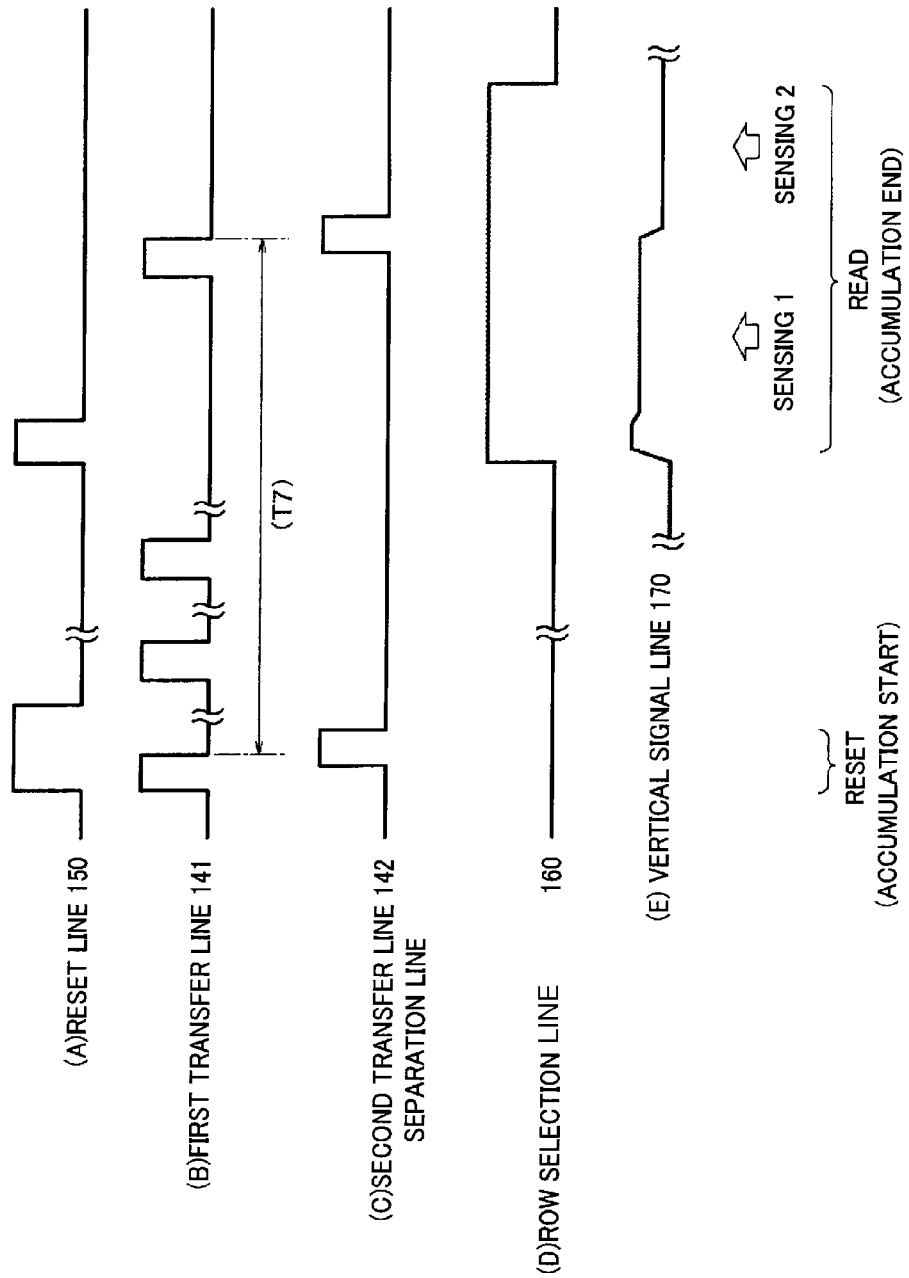
FIG. 19 is a diagram showing a timing chart of a pixel operation adopting an intermediate retention mode and improving a large-capacity accumulation operation of the sixth embodiment in an eighth embodiment.

FIG. 19(A) shows a signal potential of the reset line 150, FIG. 19(B) shows a signal potential of the first transfer line 141, and FIG. 19(C) shows a signal potential of the second transfer line (separation line) 142. FIG. 19(D) shows a signal potential of the row selection line 160, and FIG. 19(E) shows a signal potential of the vertical signal line 170.

In the eighth embodiment, a pixel circuit is the same as that of FIG. 12, and a potential change of the transfer is based on FIGS. 13(A) to 13(D).

Figure 14:
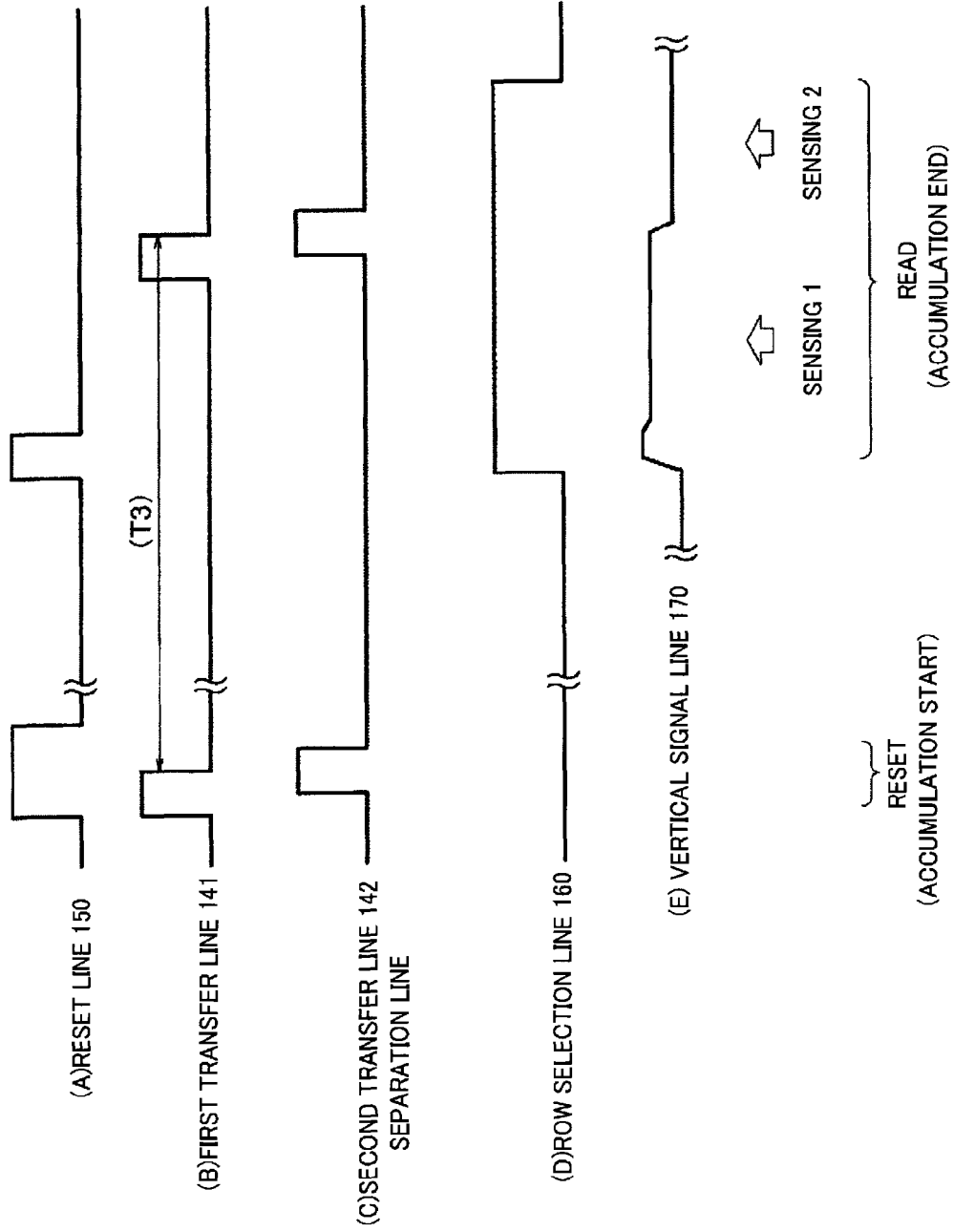
FIG. 14 is a diagram showing a timing chart when reset, electric charge accumulation, and read operations are performed in the pixel circuit of FIG. 12.
Figure 17:
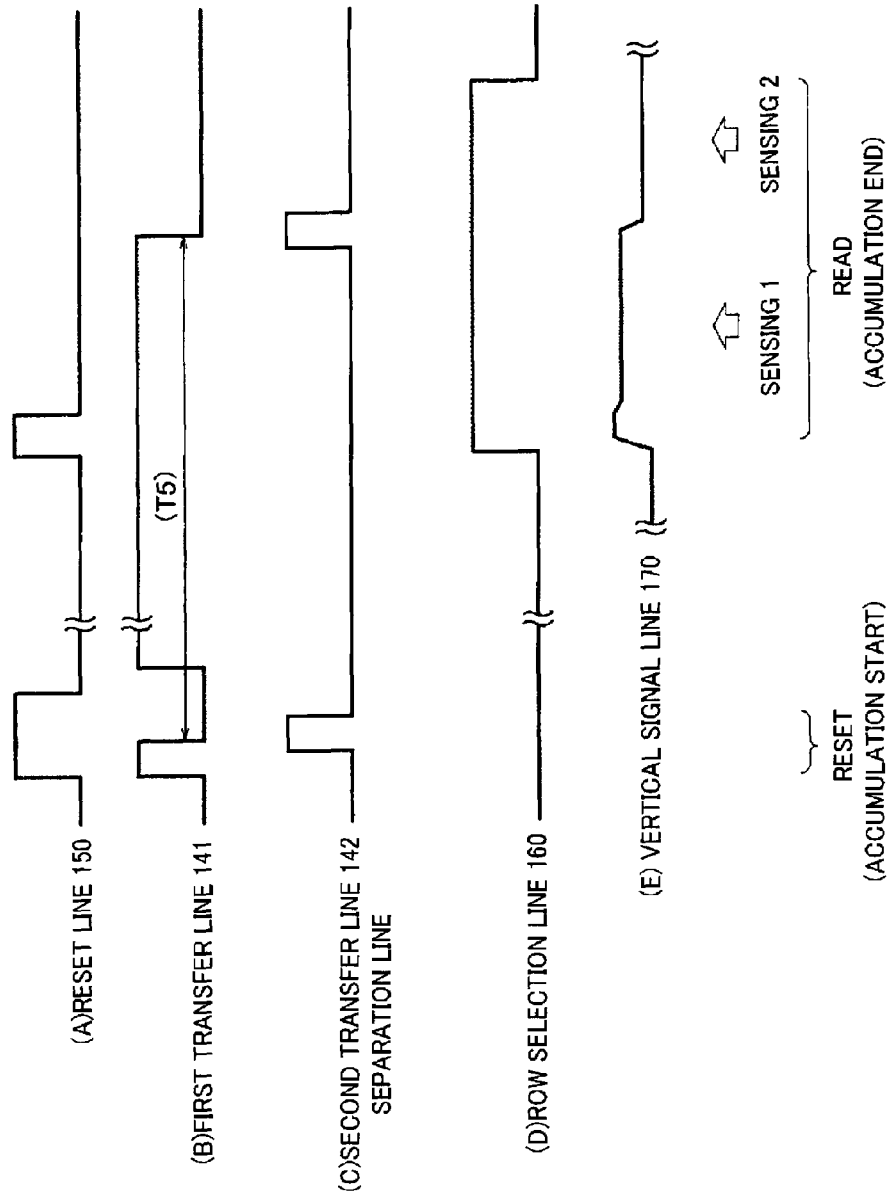
FIG. 17 is a diagram showing a timing chart of an operation of a sixth embodiment.

In the eighth embodiment, which is an improved example, new accumulation is started by performing the same reset as that of FIG. 14 or 17.

Thereafter, during an accumulation period T7, electrons are transferred from the photodiode 111 to the intermediate accumulation node by time division by intermittently applying a pulse without continuously opening the first and second NMOS transistors 1121 and 1122 by driving of the gate electrode 201.

During the accumulation period, the third NMOS transistor 1123 is maintained in the OFF state through the separation gate electrode 202, and the intermediate accumulation node is maintained in the intermediate state of step ST23 of FIG. 13(C) other than the above-described intermittent transmission time.

The pulse is applied to the gate electrode 201 again during a read operation, and the first and second NMOS transistors 1121 and 1122 are turned on, and thus electrons remaining in the photodiode 111 are transferred to the intermediate accumulation node.

Ultimately, the pulse is applied to the separation gate electrode 202, the third NMOS transistor 1123 is turned on, and the accumulated electrons of the intermediate accumulation node are together collectively transferred to the FD 117, which is the amplifier input.

Like the seventh embodiment, the eighth embodiment can suppress a dark current from being increased while implementing large-capacity accumulation.

[Global Shutter Function]

Next, the global shutter function will be described.

The global shutter function is a function of removing focal plane distortion generated by the variation of a shutter timing within a pixel array.

Figure 2:
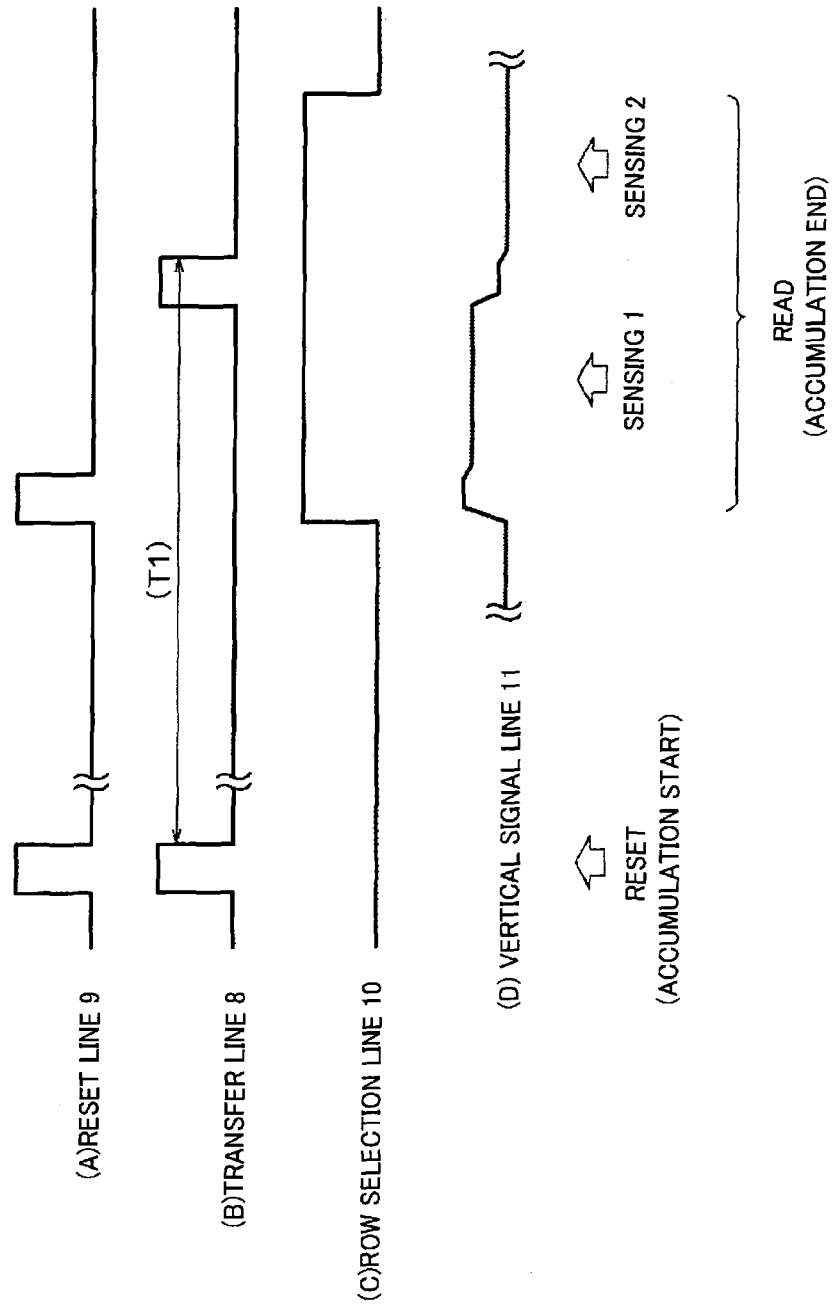
FIG. 2 is a diagram showing a timing chart of the pixel circuit of FIG. 1.

If a normal circuit configuration and sequence are adopted, the start of the read operation decides an accumulation end timing as shown in FIG. 2.

Because the read is normally sequentially performed for each row, the accumulation end timing also follows it. Consequently, normally, the reset operation serving as the accumulation start also varies for each row and is sequentially performed, and the accumulation period T1 is taken uniformly in all effective pixels.

This is a general method in a CMOS image sensor called a rolling shutter, and means that the shutter timing varies for each row. For example, distortion occurs in an image of a subject operating at high speed.

On the other hand, the global shutter function is implemented by simultaneously collectively starting electric charge accumulations of all the effective pixels and further simultaneously collectively terminating the accumulations.

On the other hand, in this case, because accumulated data is read for each row, it is necessary to separate the accumulation end timing and the read timing, and it is necessary to store a signal for each pixel during a period from the accumulation end to the read.

If the configuration of the transfer circuit shown in FIG. 5 is used and its intermediate retention mode is used, the above-described operation and good signal storage are possible.

That is, in the CMOS image sensor 100, the first and second NMOS transistors 1121 and 1122 are simultaneously turned off through the gate electrode 201 with respect to all the effective pixels. Thereby, the accumulation is terminated by stopping the transfer of photoelectrically converted electrons, and also already accumulated electrons are stored once in the channel region of the second NMOS transistor 1122.

Thereafter, it is preferable to sequentially turn on the third NMOS transistor 1123 by applying a pulse to the gate electrode 202 with the read in units of rows and transfer stored electrons to the FD 117, which is the input node of the amplifier circuit 118.

<9. Ninth Embodiment>

FIGS. 20(A) to 20(D) are diagrams showing a timing chart of the operation of a ninth embodiment in which the global shutter function is mounted in the first embodiment.

Figure 20:
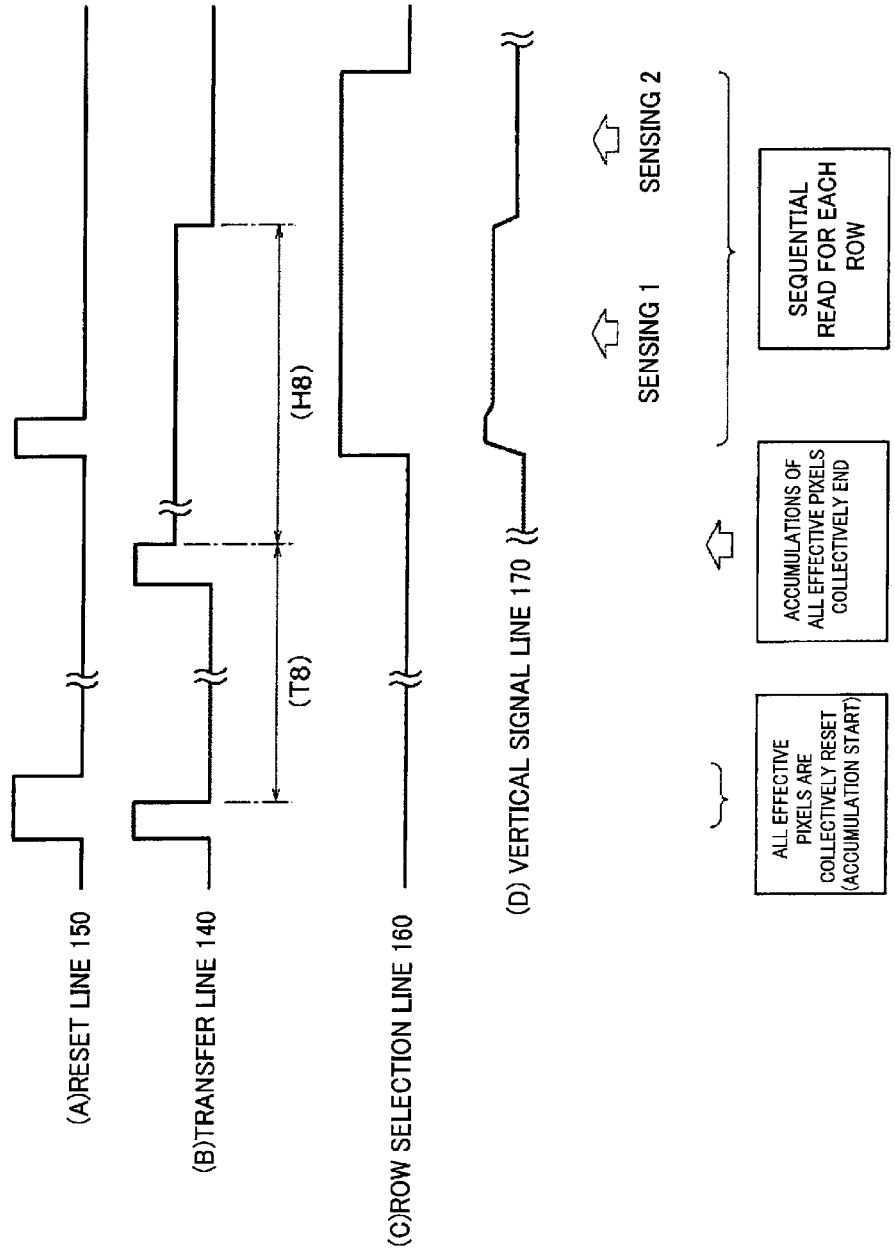
FIG. 20 is a diagram showing a timing chart of an operation of a ninth embodiment in which a global shutter function is mounted in the first embodiment.

FIG. 20(A) shows a signal potential of the reset line 150, FIG. 20(B) shows a signal potential of the transfer line 140, FIG. 20(C) shows a signal potential of the row selection line 160, and FIG. 20(D) shows a signal potential of the vertical signal line 170.

In the ninth embodiment, the pixel circuit is based on FIG. 4, and the potential change is based on FIG. 7.

The reset line 150 has the high level during reset, so that the FD 117, which is the input node of the amplifier circuit 118, is connected to a reset level (power supply voltage 3 V).

On the other hand, at a point in time when the level of the transfer line 140 has risen from the low level to the high level and has further fallen from the high level to the low level, electrons accumulated in the photodiode 111 are transferred to the FD 117 and drawn to the reset level.

At this point in time, a new electron accumulation period T8 starts. A pulse of the reset line 150 falls to the low level after waiting for a pulse applied to the gate electrode 201 to fall to the low level.

Normally, this reset operation is sequentially performed for each selected row, but the global reset is performed for all the effective pixels at the same time.

That is, this process serves as a shutter opening operation of the global shutter.

At an accumulation end time when a predetermined accumulation time T8 has elapsed, first, the level of the transfer line 140 rises from the low level to the high level, so that electrons accumulated in the photodiode 111 are transferred to the intermediate accumulation node. At this time, a potential state corresponds to step ST12 of FIG. 7(B).

Further, if the transfer line 140 returns from the high level to the intermediate potential, the potential state moves to the intermediate retention mode of step ST13 of FIG. 7(B) and the intermediate accumulation node and the photodiode 111 are separated.

These are simultaneously performed for all the effective pixels, and serve as a shutter closing operation of the global shutter.

The read is sequentially performed for each row according to a row address.

First, after a selection signal is applied to the row selection line 160 and row selection is selectively performed, a pulse is applied to the reset line 150, the FD 117, which is an amplifier input section, is connected to a reset level, and the reset level is sensed.

Next, the level of the transfer line 140 falls from the intermediate potential to the low level, so that all electrons retained in the intermediate accumulation node are transferred to the FD 117, which is the input node of the amplifier circuit 118.

Each pixel maintains the intermediate retention mode during a period of H8 from the accumulation end to the read, but the intermediate retention period H8 is different for each row.

That is, the above-described intermediate retention is performed during a period until it has a turn to read a corresponding row after the shutter is closed at once.

<10. Tenth Embodiment>

FIGS. 21(A) to 21(E) are diagrams showing a timing chart of the operation of a tenth embodiment in which the global shutter function is mounted in the third embodiment.

Figure 21:
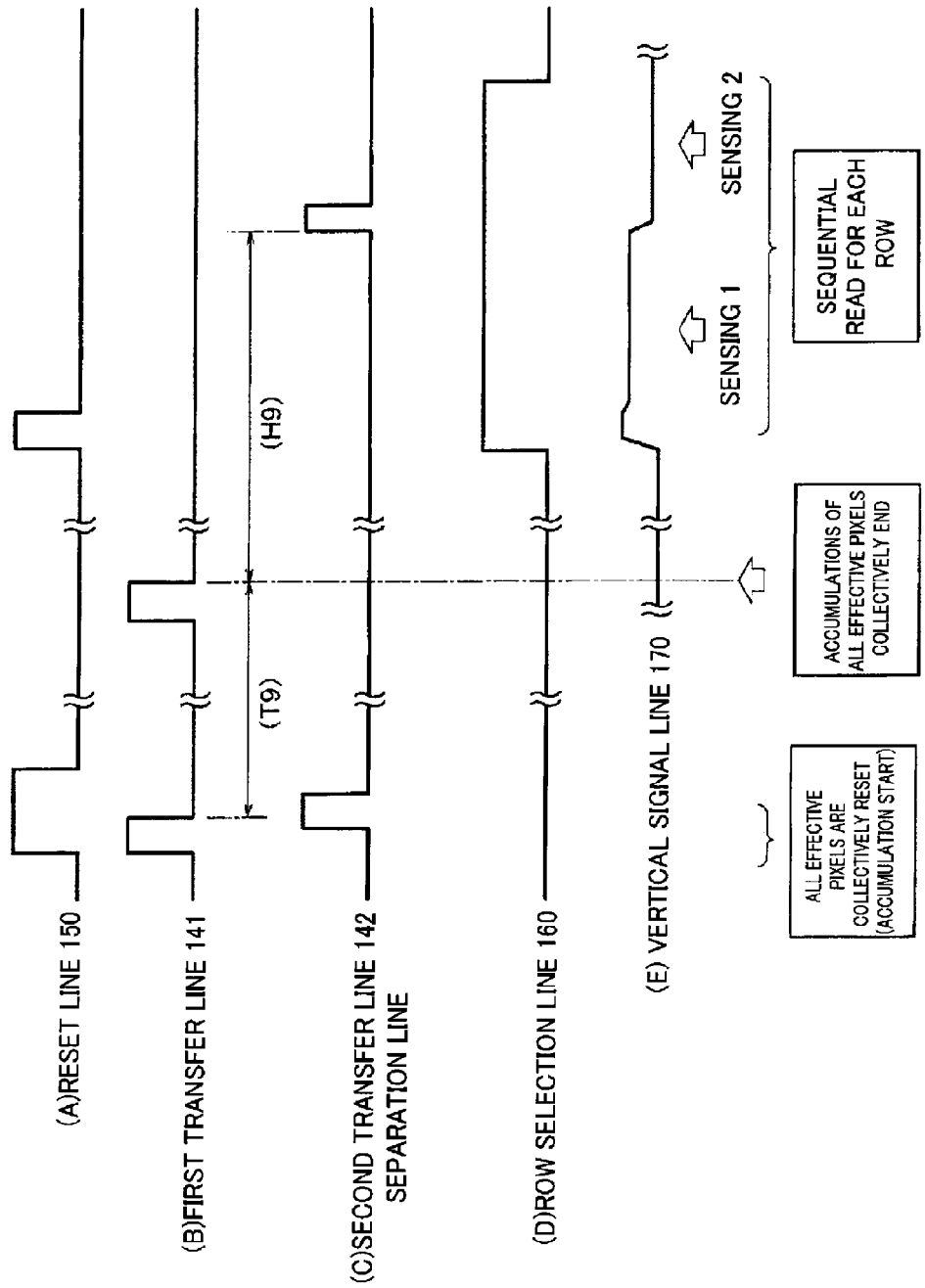
FIG. 21 is a diagram showing a timing chart of an operation of a tenth embodiment in which a global shutter function is mounted in the third embodiment.

FIG. 21(A) shows a signal potential of the reset line 150, FIG. 21(B) shows a signal potential of the first transfer line 141, and FIG. 21(C) shows a signal potential of the second transfer line (separation line) 142. FIG. 21(D) shows a signal potential of the row selection line 160, and FIG. 21(E) shows a signal potential of the vertical signal line 170.

In the tenth embodiment, a pixel circuit is the same as that of FIG. 12, and a potential change of the transfer is based on FIGS. 13(A) to 13(D).

The reset line 150 has the high level during reset, so that the FD 117, which is the input node of the amplifier circuit 118, is connected to a reset level (power supply voltage 3 V).

On the other hand, the level of the first transfer line 141 rises from the low level to the high level, so that extra electrons accumulated in the photodiode 111 are transferred to the channel portion of the second NMOS transistor 1122 via the first NMOS transistor 1121.

Further, the level of the first transfer line 141 falls from the high level to the low level and the second transfer line 142 as the separation line has the high level at substantially the same time, so that the third NMOS transistor 1123 for separation is conductive. Ultimately, if the level of the second transfer line 142 falls to the low level, the accumulated electrons are completely transferred to the diffusion layer 205 and drawn to the reset level.

At this point in time, a new electron accumulation period T9 starts. Normally, this reset operation is sequentially performed for each selected row, but the global reset is performed for all effective pixels at the same time.

That is, this process serves as a shutter opening operation of the global shutter.

At an accumulation end time when a predetermined accumulation time T9 has elapsed, first, the level of the first transfer line 141 rises from the low level to the high level, so that electrons accumulated in the photodiode 111 are transferred to the intermediate accumulation node. At this time, a potential state corresponds to step ST22 of FIG. 13(B).

Further, if the first transfer line 141 returns from the high level to the low level, the potential state moves to the intermediate retention mode of step ST23 of FIG. 13(B) and the intermediate accumulation node and the photodiode are separated.

These are simultaneously performed for all the effective pixels, and serve as a shutter closing operation of the global shutter.

The read is sequentially performed for each row according to a row address.

First, after a selection signal is applied to the row selection line 160 and row selection is selectively performed, a pulse is applied to the reset line 150, the FD 117, which is the input node of the amplifier circuit 118, is connected to a reset level, and the reset level is sensed.

Next, the second transfer line 142 as the separation line is driven to the high level, and the third NMOS transistor 1123, which is the separation transistor, is conductive. Thereby, electrons accumulated in the channel portion of the second NMOS transistor 1122 are transferred to the FD 117, which is the input node of the amplifier 118.

At a point in time when the second transfer line 142 as the separation line has fallen again to the low level, the complete transfer of accumulated electrons to the diffusion layer 205 is completed.

Each pixel maintains the intermediate retention mode during a period of H9 from the accumulation end to the read, but the intermediate retention period H9 is different for each row.

That is, the above-described intermediate retention is performed during a period until it has a turn to read a corresponding row after the shutter is closed at once.

The global shutter function can also be performed in combination with the above-described large-capacity accumulation operation.

For example, when the accumulation of a global shutter sequence shown in FIGS. 20(A) to 20(D) is started, transfer lines 140 of all effective pixels are collectively changed to the high level. It is preferable to terminate the accumulation by collectively dropping them to the intermediate potential after maintaining their state during the accumulation period T8 and move to the intermediate retention state.

In this case, the potential state of step ST12 of FIG. 7(B) is maintained in each pixel during the accumulation period, and electrons are accumulated within the channel of the second NMOS transistor 1122, not in the photodiode 111, so that large-capacity accumulation is possible.

Likewise, a combination with a large-capacity accumulation operation by a time division transfer is also possible, and the large-capacity accumulation operation and the global shutter function can be combined and used along with a basic function of the first embodiment and a basic configuration of the third embodiment.

[Wide Dynamic Range Function]

Next, the wide dynamic range function will be described.

This function is a function of simultaneously storing a signal of a short accumulation time and a signal of a long accumulation time and picking up an image in an exposure time simultaneously appropriate for the two signals using the signal of the short accumulation time for sensing a subject of high luminance and the signal of the long accumulation time for sensing a subject of low luminance.

If the configuration of the first or third embodiment of the present invention and the intermediate retention mode are applied, it is possible to accumulate a separate signal in the photodiode while storing a signal accumulated for a long time in the channel region of the transistor in the intermediate retention mode.

During a read operation, the signal of the long-time accumulation side stored in the intermediate retention mode is first transferred to the amplifier input, and then the signal of the short-time accumulation side stored in the photodiode is transferred.

<11. Eleventh Embodiment>

An example of the wide dynamic range operation using the configuration of the first embodiment will be described using potential changes of FIGS. 22(A) to 22(D) and FIGS. 23(A) to 23(C).

FIGS. 22(A) to 22(D) are first potential change diagrams illustrating an example of the wide dynamic range operation according to an eleventh embodiment using the configuration of the first embodiment.

Figure 23:
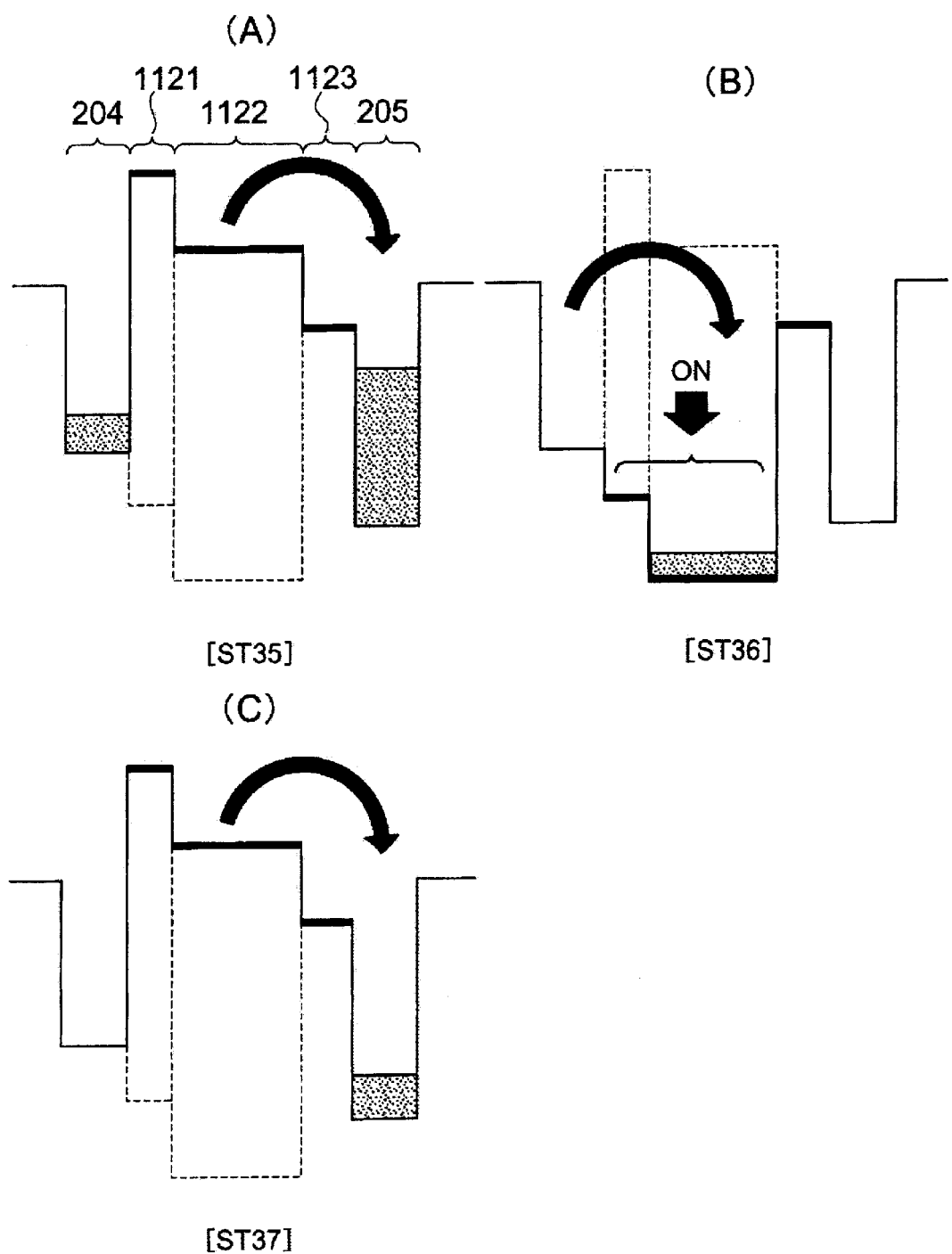
FIG. 23 is a second potential change diagram illustrating an example of a wide dynamic range operation of the eleventh embodiment using the configuration of the first embodiment.

FIGS. 23(A) to 23(C) are second potential change diagrams illustrating an example of the wide dynamic range operation according to the eleventh embodiment using the configuration of the first embodiment.

In the eleventh embodiment, a pixel circuit is the same as shown in FIG. 4, details and a cross-sectional configuration of a transfer circuit are the same as shown in FIGS. 5 and 6.

[Step ST31]

Figure 22:
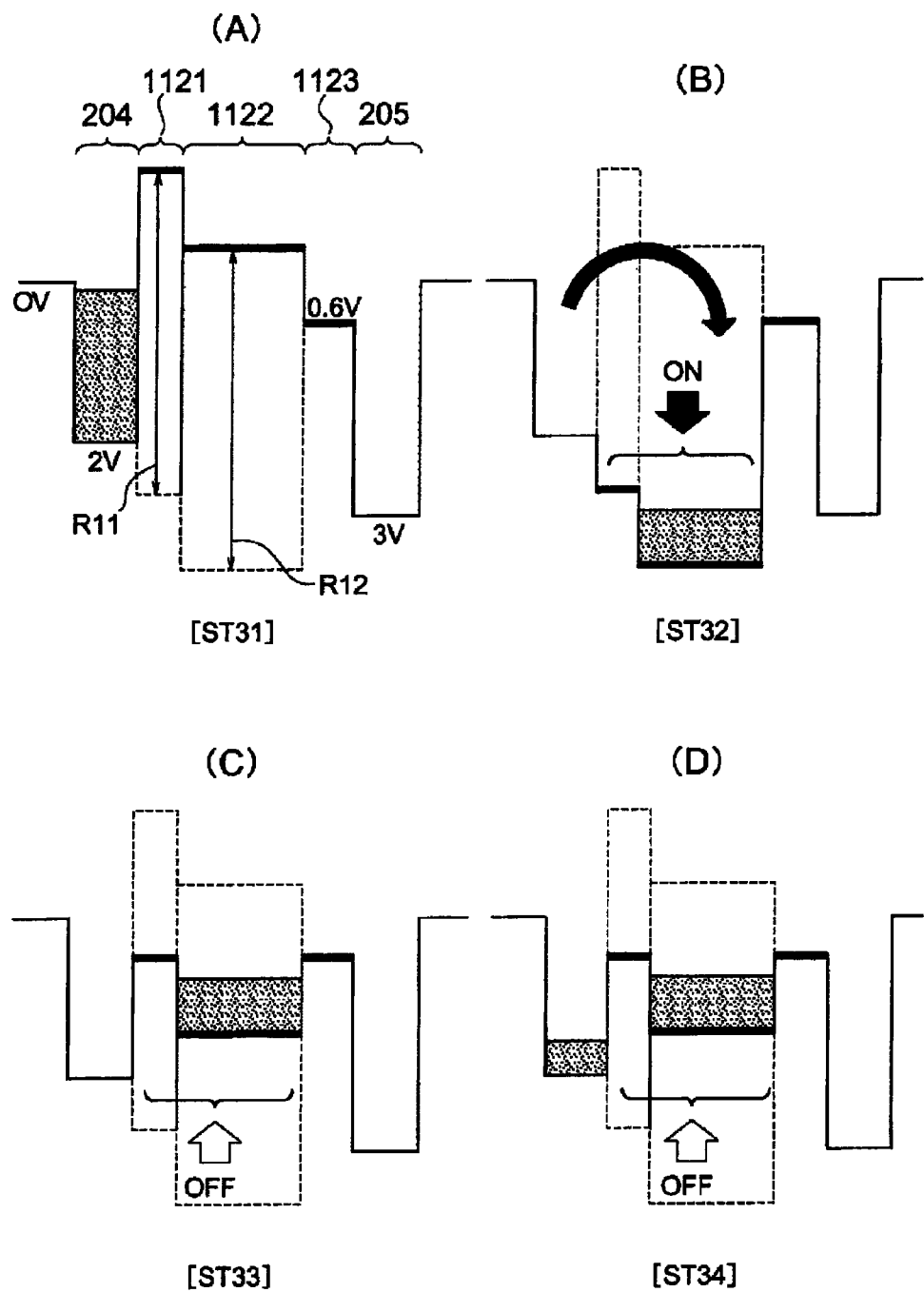
FIG. 22 is a first potential change diagram illustrating an example of a wide dynamic timing range operation of an eleventh embodiment using a configuration of the first embodiment.

In step ST31 of FIG. 22(A) like step ST11 of FIG. 7(A), first electron accumulation is performed in the diffusion node 204 of the photodiode 111.

In the channel regions of the first NMOS transistor 1121 and the second NMOS transistor 1122, potentials are respectively modulated in ranges of R11 and R12 according to a potential commonly applied to the shared gate electrode 201 of the two, for example, −1.5 to 3 V.

On the other hand, the gate electrode 202 of the third NMOS transistor 1123, which is the separation transistor, is connected to the ground GND, and the potential of the channel is adjusted to about 0.6 V.

[Step ST32]

If the first NMOS transistor 1121 and the second NMOS transistor 1122 are turned on in step ST32 of FIG. 22(B), the electrons move.

Electrons accumulated in the diffusion node 204 of the photodiode 111 all move to the channel region of the second NMOS transistor 1122 via the first NMOS transistor 1121.

That is, the electrons move to the channel region of the second NMOS transistor 1122 having a deep depletion state and are accumulated in an analog state.

[Step ST33]

The gate electrode 201 is driven to turn off the first NMOS transistor 1121 and the second NMOS transistor 1122 in step ST33 of FIG. 22(C), so that the potential of the channel region is modulated in the negative potential direction.

Thereby, the photodiode 111 is separated from the channel of the second NMOS transistor 1122, and first accumulation is completed.

In the step in which the gate electrodes of the first NMOS transistor 1121 and the second NMOS transistor 1122 have reached an appropriate intermediate voltage, a state is reached in which the accumulated electrons have been separated from both the photodiode 111 and the FD 117, which is the input node of the amplifier circuit 118.

[Step ST34]

Because light is continuously incident on the photodiode 111 and photoelectrically converted if the intermediate retention state of step ST33 is maintained in step ST34 of FIG. 22(D), new electrons are accumulated in its diffusion node 204.

[Step ST35]

If the first NMOS transistor 1121 and the second NMOS transistor 1122 are completely turned off in step ST35 of FIG. 23(A), the electrons move as follows.

That is, all first accumulated electrons retained in the channel of the second NMOS transistor 1122 move to the FD 117, which is the input node of the amplifier circuit 118.

Thereby, the amplifier circuit 118 having the amplifier transistor 114 drives the vertical signal line 170, and a first accumulated signal is read.

[Step ST36]

If the first NMOS transistor 1121 and the second NMOS transistor 1122 are turned on again in step ST36 of FIG. 23(B), the electrons move as follows.

Second accumulated electrons accumulated in the diffusion node 204 of the photodiode 111 all move to the channel region of the second NMOS transistor via the first NMOS transistor 1121. At this time, the FD 117, which is the input node of the amplifier circuit 118, is reset to 3 V.

[Step ST37]

If the first NMOS transistor 1121 and the second NMOS transistor 1122 are completely turned off again in step ST37 of FIG. 23(C), the electrons move as follows.

All of the second accumulated electrons retained in the channel of the second NMOS transistor 1122 move to the FD 117, which is the input node of the amplifier circuit.

Thereby, the amplifier circuit 118 having the amplifier transistor 114 drives the vertical signal line 170, and a second accumulated signal is read.

By adjusting an effective timing of the above-described operation sequence, the first electron accumulation is performed for a long time and the second electron accumulation is performed for a short time.

If the first electron accumulation is not saturated, its value is used in accumulated data of a pixel. On the other hand, if the first electron accumulation is saturated, a value of the second electron accumulation is used in the accumulated data of the pixel. If the second accumulation time is 1/K of the first accumulation time, second accumulated data is handled to be K times during image synthesis.

The long-time accumulation and the short-time accumulation are continuously performed without the read in the middle. The read is sequentially continuously performed twice for each row.

Therefore, frame synthesis is possible if a user of an imager according to the embodiment of the present invention prepares only two line buffers without having to prepare two frame buffers corresponding to different accumulation times.

When the read time is doubled, a frame rate becomes ½ but all the doubled time taken for one frame can be used in accumulation.

FIGS. 24(A) to 24(D) are diagrams showing a timing chart of the above-described wide dynamic range correspondence operation.

Figure 24:
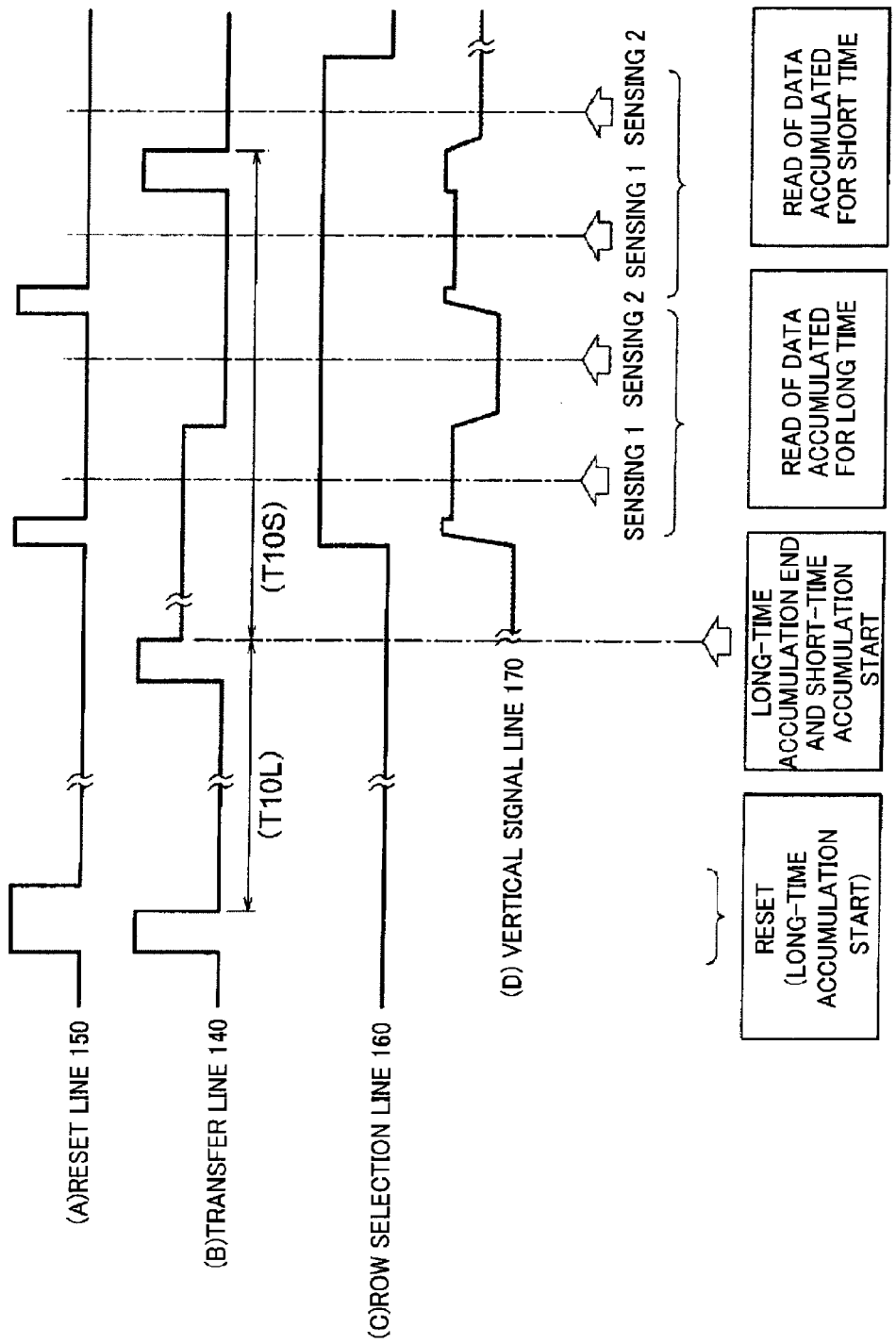
FIG. 24 is a diagram showing a timing chart of a wide dynamic range correspondence operation according to the eleventh embodiment.
Figure 25:
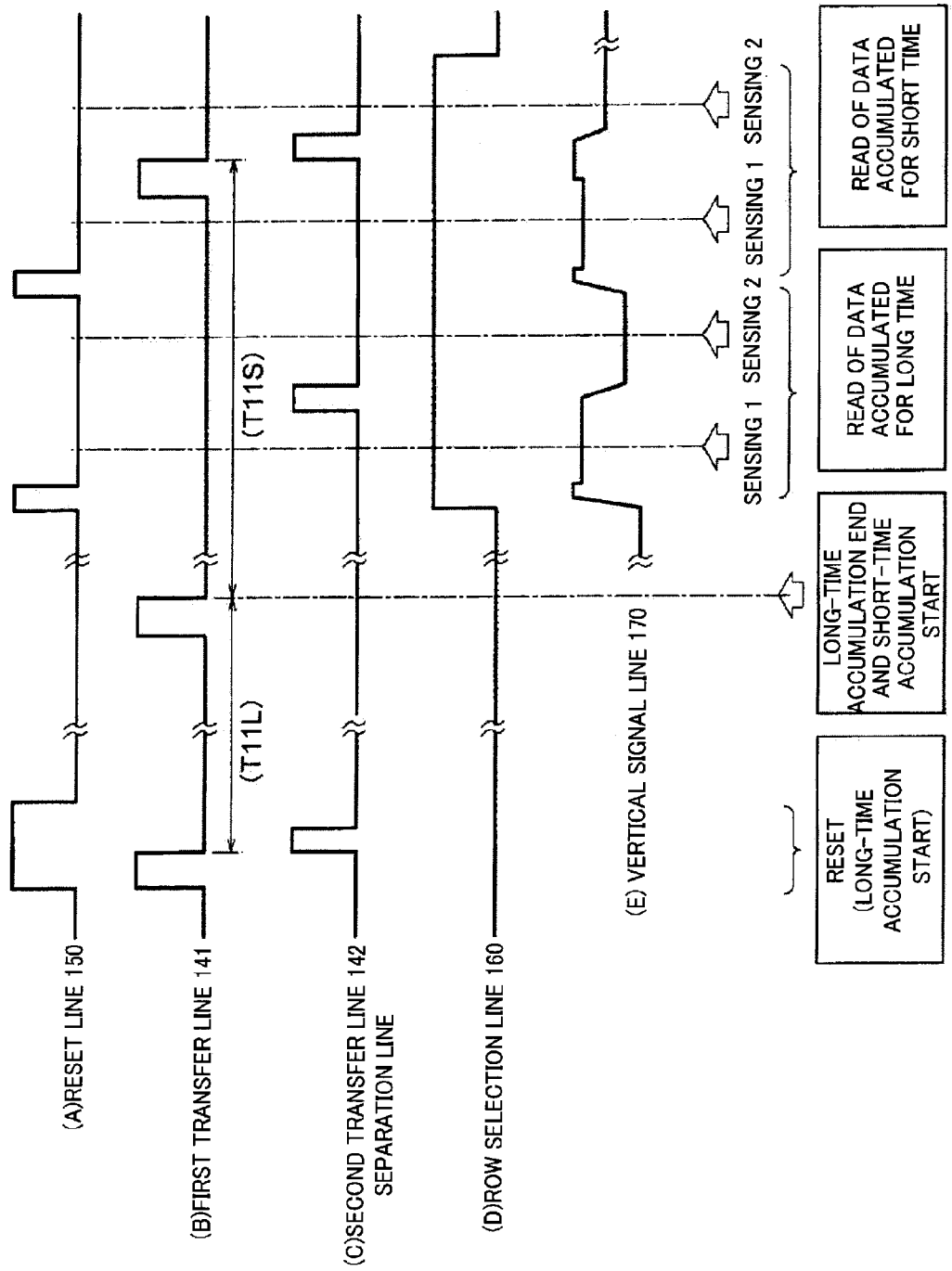
FIG. 25 is a diagram showing a timing chart of a wide dynamic range operation of a twelfth embodiment using a configuration of the third embodiment.

FIG. 24(A) shows a signal potential of the reset line 150, FIG. 24(B) shows a signal potential of the transfer line 140, FIG. 24(C) shows a signal potential of the row selection line 160, and FIG. 24(D) shows a signal potential of the vertical signal line 170.

First, the reset line 150 is set to the high level during reset, so that the FD 117, which is the input node of the amplifier circuit 118, is connected to a reset level (power supply voltage 3 V).

On the other hand, at a point in time when the level of the transfer line 140 has risen from the low level to the high level and has further fallen from the high level to the low level, electrons accumulated in the photodiode 111 are transferred to the FD 117 and drawn to the reset level.

At this point in time, an accumulation period T10L of the first electron accumulation starts. A pulse of the reset line 150 falls to the low level after waiting for the level of the transfer line 140 to fall to the low level.

When a predetermined accumulation time has elapsed, the level of a transfer line rises from the low level to the high level, and accumulated electrons are transferred to the intermediate node formed in the channel portion of the second NMOS transistor 1122 as shown in step ST32 of FIG. 22(B).

Further, if the level of the transfer line 140 falls from the high level to the intermediate potential, the photodiode 11 and the intermediate node are disconnected as shown in step ST33 of FIG. 22(C), and the accumulation period T10L of the long-time side of the first electron accumulation ends.

Simultaneously, a second accumulation period T10S starts.

After a selection signal is applied to the row selection line 160 and row selection is performed, the read is performed as follows.

First, the FD 117, which is the input node of the amplifier circuit 118, is reset by a pulse application of the reset line 150, and the reset level is sensed.

Next, if the level of the transfer line 140 falls to the low level from the intermediate node, the first accumulated electrons are transferred to the FD 117, which is the input node of the amplifier circuit 118, as shown in step ST35 of FIG. 23(A), and their sensing is performed.

The FD 117, which is the input node of the amplifier circuit 118, is reset again by a pulse application of the reset line 150, and the reset level is sensed.

Next, if the pulse is applied to the transfer line 140, the second accumulated signal is transferred to the FD 117, which is the input node of the amplifier circuit 118, through steps ST36 and ST37 of FIGS. 23(B) and 23(C), and its sensing is performed.

The accumulation period T10S also ends by reading the second accumulated signal.

<12. Twelfth Embodiment>

The above-described wide dynamic range function is also performed with the same concept for the configuration of the third embodiment.

FIGS. 25(A) to 25(E) are diagrams showing a timing chart of the wide dynamic range operation according to a twelfth embodiment using the configuration of the third embodiment.

In the twelfth embodiment, a configuration of a pixel configuration is the same as that of FIG. 12.

The reset line 150 has the high level during reset, so that the FD 117, which is the input node of the amplifier circuit 118, is connected to a reset level (power supply voltage 3 V).

On the other hand, the level of the first transfer line 141 rises from the low level to the high level, so that extra electrons accumulated in the photodiode 111 are transferred to the channel portion of the second NMOS transistor 1122 via the first NMOS transistor 1121.

Further, the level of the first transfer line 141 falls from the high level to the low level and the second transfer line 142 as the separation line has the high level at substantially the same time, so that the third NMOS transistor 1123, which is the separation transistor, is conductive. Ultimately, if the level of the second transfer line 142 falls to the low level, accumulated electrons are completely transferred to the FD 117 and drawn to the reset level.

At this point in time, an accumulation period T11L of the first electron accumulation starts. A pulse of the reset line 150 falls to the low level after waiting for the level of the second transfer line 142 to fall to the low level.

If a predetermined accumulation time has elapsed, the level of the first transfer line 141 rises from the low level to the high level, so that electrons accumulated in the photodiode 111 are transferred to the intermediate accumulation node.

Further, if the first transfer line 141 returns from the high level to the low level, the potential state moves to the intermediate retention mode of step ST23 of FIG. 13(B) and the intermediate accumulation node and the photodiode are separated.

Thereby, the accumulation period T11L of the long-time side of the first electron accumulation ends. Simultaneously, a second accumulation period T11S starts.

After a selection signal is applied to the row selection line 160 and row selection is performed, the read is performed as follows.

First, a pulse is applied to the reset line 150, the FD 117, which is the input node of the amplifier circuit 118, is connected to the reset level, and the reset level is sensed.

Next, the second transfer line 142 as the separation line is driven to the high level, and the third NMOS transistor 1123 as the separation transistor is conductive. Thereby, the first accumulated electrons accumulated in the channel portion of the second NMOS transistor 1122 are transferred to the FD 117, which is the input node of the amplifier circuit 118. At a point in time when the second transfer line 142 as the separation line has fallen again to the low level, the complete transfer of the first accumulated electrons to the FD 117 is completed and the first accumulated signal is sensed.

The FD 117, which is the input node of the amplifier circuit 118, is reset again by a pulse application of the reset line 150, and the reset level is sensed.

Next, the first transfer line 141 is driven from the low level to the high level, so that the second accumulated electrons accumulated in the photodiode 111 are transferred to the channel portion of the second NMOS transistor 1122 via the first NMOS transistor 1121.

Further, if the level of the first transfer line 141 falls from the high level to the low level, the second transfer line 142 as the separation line has the high level at substantially the same time, and ultimately the level of the second transfer line 142 falls to the low level, the second accumulated electrons are completely transferred to the FD 117.

Thereby, the second accumulation period T11S also ends, and the second accumulated signal is subsequently sensed.

If the first electron accumulation is not saturated, its value is used in accumulated data of a pixel. On the other hand, if the first electron accumulation is saturated, a value of the second electron accumulation is used in the accumulated data of the pixel. If the second accumulation time is 1/K of the first accumulation time, second accumulated data is handled to be K times during image synthesis.

<13. Thirteenth Embodiment>

Next, the twelfth embodiment in which the structure of a transfer circuit within a pixel is changed will be described.

Figure 26:
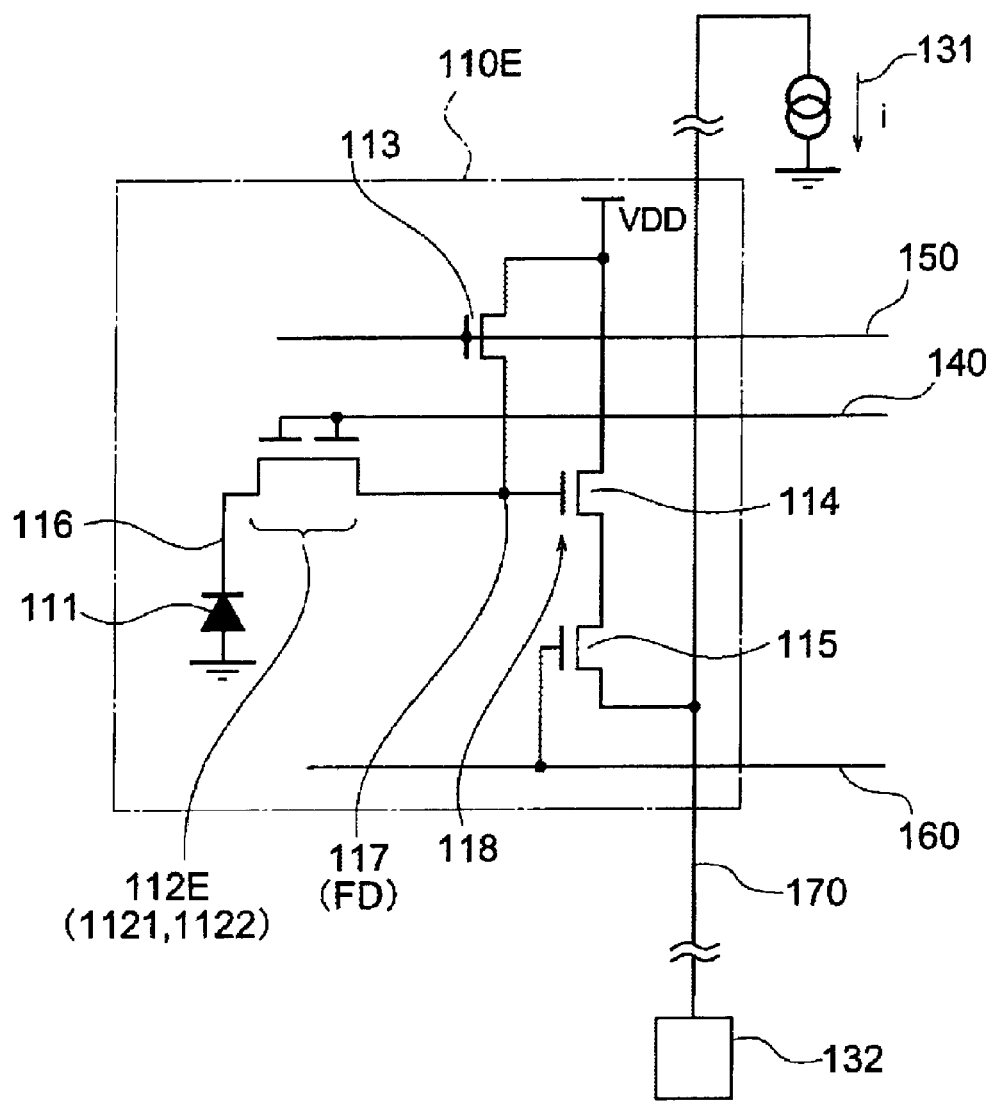
FIG. 26 is a diagram showing a pixel circuit of a CMOS image sensor according to a thirteenth embodiment of the present invention.

FIG. 26 is a diagram showing a pixel circuit of a CMOS image sensor according to a thirteenth embodiment of the present invention.

A pixel circuit 110E according to the thirteenth embodiment has a configuration in which the third NMOS transistor 1123 as the separation transistor of the transfer transistor 112 of the pixel circuit 110A according to the first embodiment is omitted.

That is, in the pixel circuit 110E according to the thirteenth embodiment, a transfer transistor 112E is formed of the first MOS transistor 1121 of the high threshold voltage HVth, and the second MOS transistor 1122 of the low threshold voltage LVth integrated and connected in series.

Figure 27:
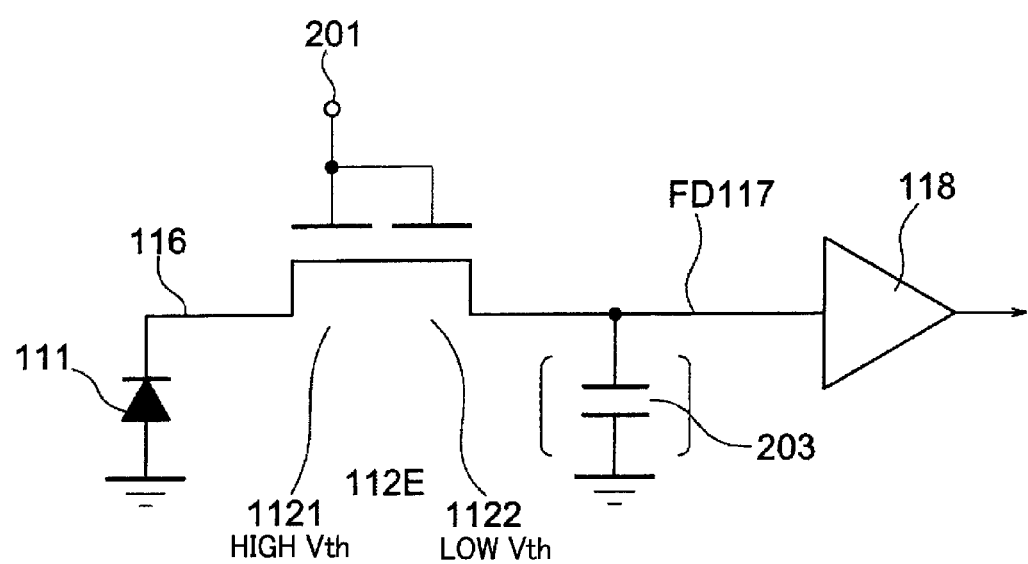
FIG. 27 is a diagram showing an equivalent circuit of a transfer circuit including a transfer transistor of a pixel circuit according to the thirteenth embodiment.

FIG. 27 is a diagram showing an equivalent circuit of the transfer circuit including the transfer transistor of the pixel circuit 110E according to the thirteenth embodiment.

Electrons generated by photoelectric conversion in the photodiode 111 are completely transferred to the FD 117, which is the input node of the amplifier circuit 118, via the first and second NMOS transistors 1121 and 1122 integrated and connected in series to form the transfer transistor 112E.

In the integrated first and second NMOS transistors 1121 and 1122, channels are directly connected to each other, not via an n-type diffusion layer or the like.

A driving signal is collectively applied to the gate electrodes 201 of the first and second NMOS transistors 1121 and 1122 at the same time.

The first NMOS transistor 1121 has the high threshold voltage HVth, and the second NMOS transistor 1122 has the low threshold voltage LVth.

The FD 117, which is the input node, has the parasitic capacitance 203, and its potential variation amount $\Delta Vf$ is $\{\Delta Vf=Q/Cf\}$ if an accumulated electric charge amount is Q and a parasitic capacitance value is Cf.

During a read operation, this displacement drives the vertical signal line 170 at a fixed gain via the amplifier circuit 118.

As the third NMOS transistor as the separation transistor is omitted from the first embodiment, an area occupied by a pixel is reduced by the omission.

On the other hand, the FD 117, which is the input node of the amplifier circuit 118 in a floating state, is easily affected by a state change of the second NMOS transistor 1122 adjacent thereto.

For example, when the first and second NMOS transistors 1121 and 1122 are turned on through the gate electrodes 201, the potential of the FD 117 is changed by coupling thereof. As a result, there is the effect that some electrons to be accumulated in the channel portion of the second NMOS transistor 1122 are leaked to the FD 117, which is the input node of the amplifier circuit 118, or the like.

The FD 117, which is the input node of the amplifier circuit 118, includes a diffusion layer into which a large amount of impurities is introduced, a contact portion of a wiring, or the like, and has low crystallinity as compared to the channel portion of the MOS transistor.

Therefore, individually leaked electrons are easily lost by recombination or the like during the accumulation period, and particularly have significantly negative influence on the accumulation function of the third embodiment or the global shutter function of the ninth or tenth embodiment.

However, if electric charge accumulation capability is sufficiently large in the channel portion of the second NMOS transistor 1122, it is possible in the thirteenth embodiment also to reduce or remove a margin limitation of a complete transfer in a principal similar to that of the first embodiment.

Figure 28:
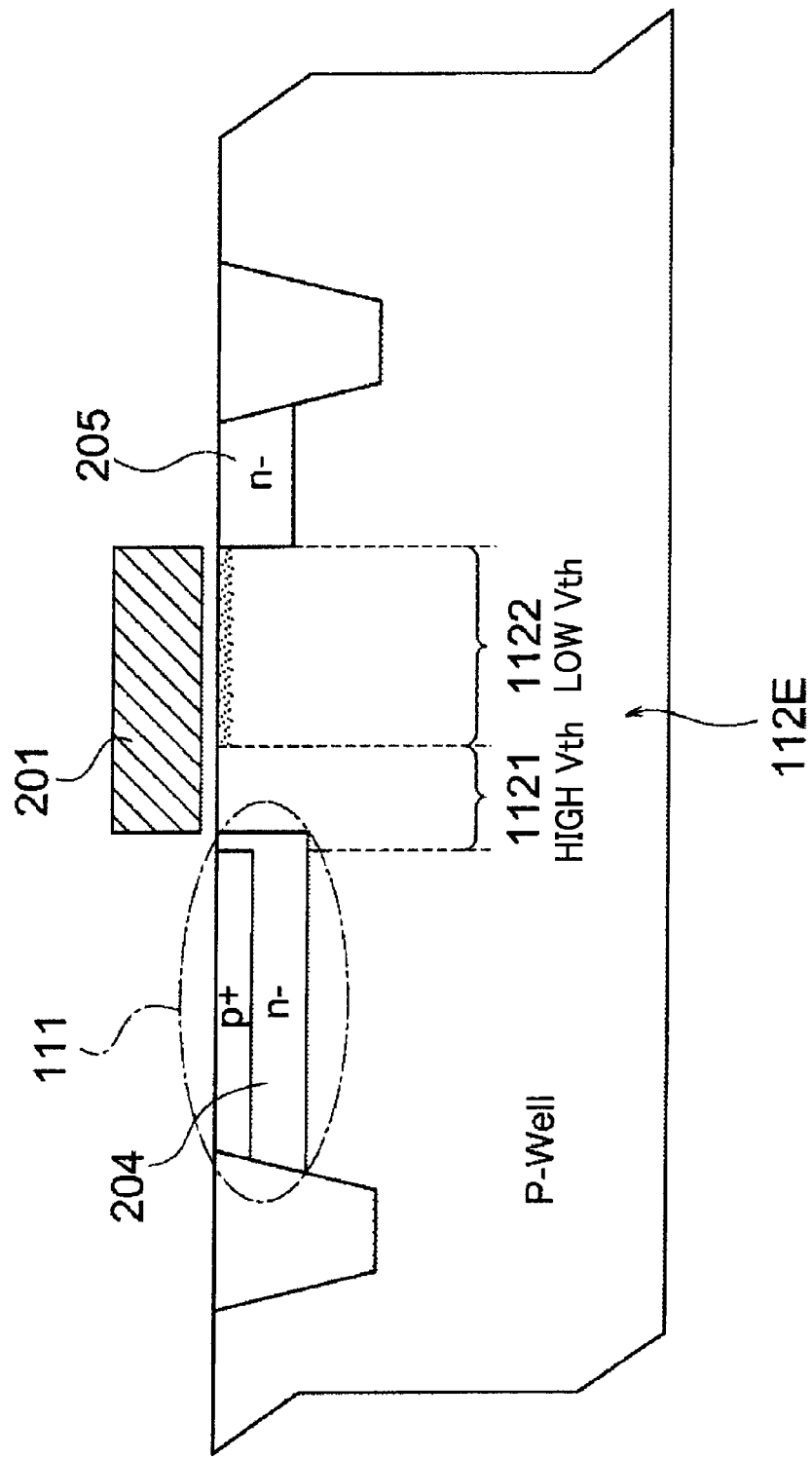
FIG. 28 is a diagram showing a cross-sectional structure example of the transfer circuit of FIG. 27.

FIG. 28 is a diagram showing a cross-sectional structure example of the transfer circuit of FIG. 27.

In the photodiode 111, a HAD structure in which the vicinity of a silicon surface in contact with an oxide film has a p-type is adopted.

Here, the photoelectrically converted electrons are initially accumulated in the n-type diffusion node 204.

If a signal that turns on the first NMOS transistor 1121 is applied to the gate electrode 201, many electrons are transferred to the channel region of the second NMOS transistor 1122 via the first NMOS transistor 1121, and accumulated in the channel region.

For example, an impurity profile of a channel portion is adjusted, so that a threshold of the first NMOS transistor 1121 is set to be high and a threshold of the second NMOS transistor 1122 is set to be low. Thereby, the channel portion of the second NMOS transistor 1122 forms an electron accumulation well, and the channel portion of the first NMOS transistor 1121 forms a potential wall of backflow prevention.

The diffusion layer 205 is connected to an input of the amplifier circuit 118, which is not shown in the cross-sectional view.

Here, the first NMOS transistor 1121 and the second NMOS transistor 1122 are considered two individual transistors. However, they can be considered a single NMOS transistor having a gradient in the impurity profile of the channel portion if the gate electrodes are also integrally formed as shown in the figure.

In any case, it is functionally the same as two individual transistors connected in series, and is included in an application range of the present invention.

FIGS. 29(A) to 29(D) are diagrams showing potential changes accompanying a read transfer operation using the transfer circuit of the pixel circuit according to the thirteenth embodiment.

[Step T41]

Figure 29:
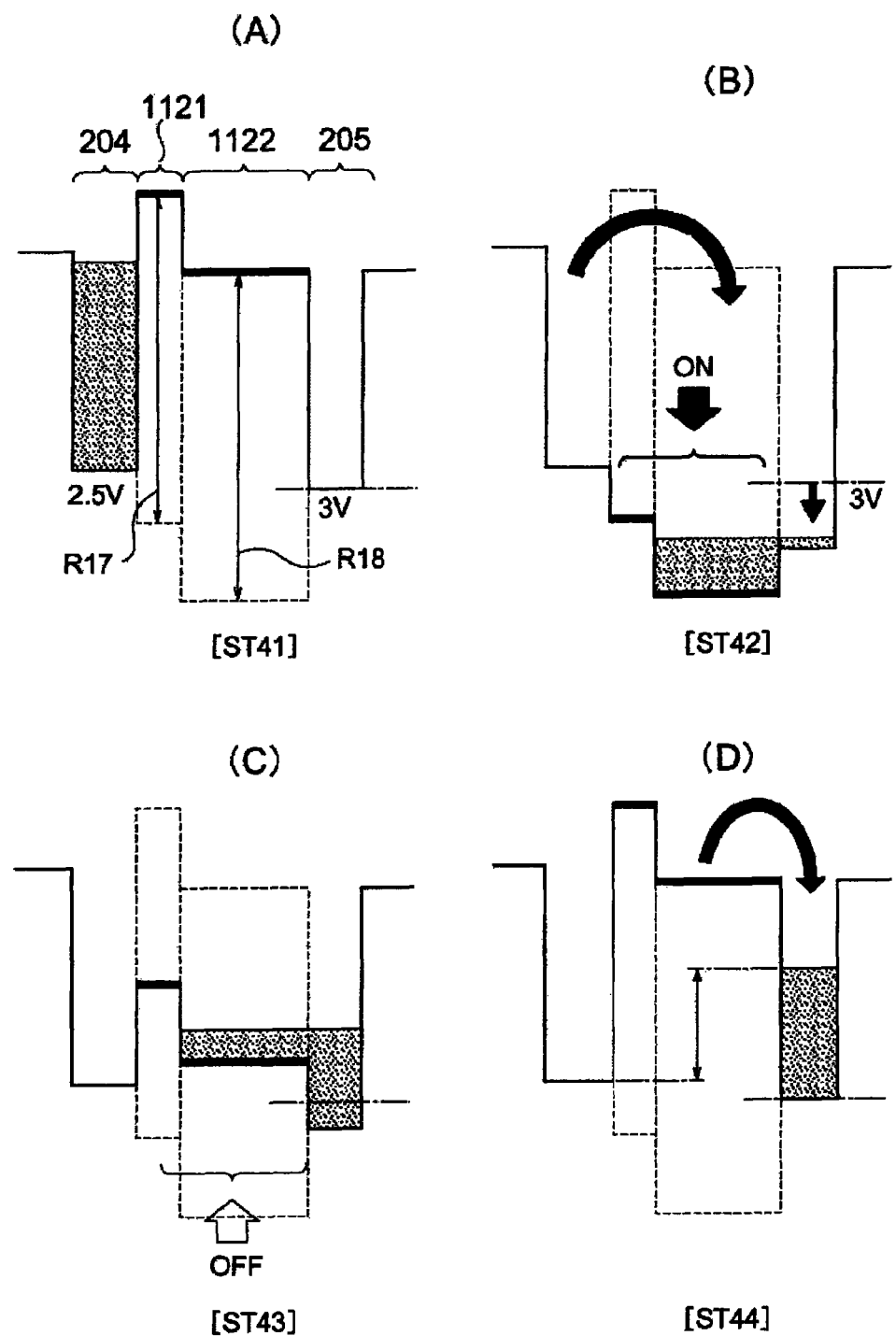
FIG. 29 is a diagram showing a potential change accompanying a read transfer operation using a transfer circuit of the pixel circuit according to the thirteenth embodiment.

In step ST41 of FIG. 29(A), the diffusion node 204 of the photodiode 111 is designed so that a potential bottom is about 2.5 V during full depletion in positive electric charge by a fixed number of donors. Here, it is filled with photoelectrically converted electrons up to a saturation state (about 0 V).

On the other hand, in the channel regions of the first NMOS transistor 1121 and the second NMOS transistor 1122, potentials are respectively modulated in ranges of R17 and R18 according to a potential commonly applied to the two gate electrodes, for example, 1.5 V to 3 V.

The diffusion layer 205 (the FD 117), which is the input node of the amplifier circuit 118, is reset to have a floating state of 3 V.

[Step ST42]

If the first NMOS transistor 1121 and the second NMOS transistor 1122 are turned on in step ST42 of FIG. 29(B), a potential moves as follows.

Electrons accumulated in the diffusion node 204 of the photodiode 111 all move to the channel region of the second NMOS transistor 1122 via the first NMOS transistor 1121.

In this case, the potential of the diffusion layer 205 (the FD 117), which is the input node of the amplifier circuit 118, rises by coupling. Some electrons further flow into the diffusion layer 205 (the FD 117) via the channel portion of the second NMOS transistor 1122.

That is, most electrons, which are a read signal, are accumulated in the channel region of the second NMOS transistor 1122 having a deep depletion state, and some electrons are accumulated in the diffusion layer 205 (the FD 117), which is the input node of the amplifier circuit 118.

[Step ST43]

The gate electrodes 201 are driven to turn off the first NMOS transistor 1121 and the second NMOS transistor 1122 in step ST43 of FIG. 29(C), so that the potential of the channel region is modulated in the negative direction.

Here, the channel of the first NMOS transistor 1121 forms a potential barrier, and prevents accumulated electrons from flowing back to the diffusion node 204 of the photodiode 111. A height of the barrier corresponds to a difference between thresholds of the two transistors, for example, 1.5 V.

As the potential of the channel region of the second NMOS transistor 1122 rises (the potential decreases), electrons accumulated therein move to the diffusion layer 205 (the FD 117), which is the input node of the amplifier circuit 118.

[Step ST44]

In an OFF state of the first and second NMOS transistors 1121 and 1122 in step ST44 of FIG. 29(D), a state is reached in which all electrons accumulated in the photodiode in step S41 have moved to the diffusion layer 205, which is the input node of the amplifier circuit 118. Thereby, the amplifier drives the vertical signal line, and an accumulated signal is read.

If the above-described step-by-step transfer is used, it is unnecessary to secure a potential difference between the diffusion node 204 of the photodiode 111 having the full depletion state and the diffusion layer 205, which is the input node of the amplifier circuit 118.

That is, in the thirteenth embodiment, a complete transfer is implemented even in a state in which the potential of the diffusion layer 205 (the FD 117) filled with electrons is shallower than that of the diffusion node 204.

To completely remove the above-described potential limitation during the transfer, the accumulation capacity of the channel portion of the second NMOS transistor 1122 is sufficiently increased in step ST42. Thereby, it is necessary to move all electrons to the right side from the second NMOS transistor 1122, regardless of the magnitude of the parasitic capacitance of the diffusion layer 205, which is the input node of the amplifier circuit 118.

If the saturated accumulated electric charge amount of the photodiode is Qs, a channel capacity of the second NMOS transistor 1122 (a capacity of an inversion layer) is Cinv, and a threshold difference between the first NMOS transistor 1121 and the second NMOS transistor 1122 is ΔVth, the following condition is given.

$$|Cinv * \Delta Vth| > |Qs|  \qquad \text{[Expression 3]}$$

Actually, there is an advantageous effect in that a transfer margin sufficiently significantly extends if a state is reached in which half or more of electrons generated by photoelectric conversion of the photodiode 111 have been accumulated in the channel portion of the second NMOS transistor 1122 in step ST42.

<14. Fourteenth Embodiment>

Figure 30:
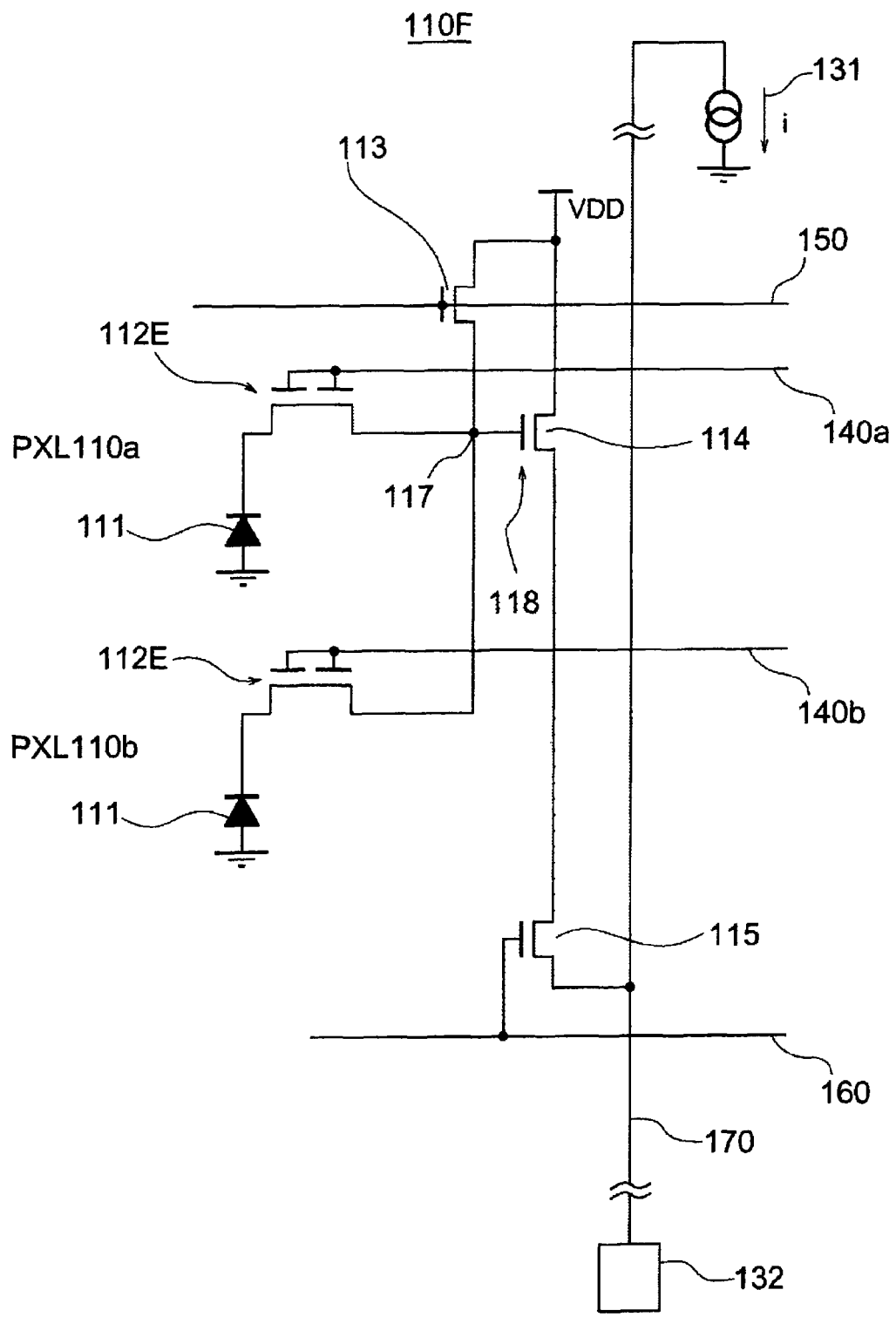
FIG. 30 is a diagram showing a pixel circuit of a CMOS imager according to a fourteenth embodiment of the present invention.

FIG. 30 is a diagram showing a pixel circuit of a CMOS imager according to a fourteenth embodiment of the present invention.

A difference between a pixel circuit 110F according to the fourteenth embodiment and the pixel circuit 110E according to the thirteenth embodiment is as follows.

In the pixel circuit 110F according to the fourteenth embodiment, a plurality of pixels, for example, two pixels PXL110a and PXL110b, respectively having a unique photodiode 111 and a unique transfer circuit 112, share FD 117 and an amplifier transistor 114 forming an amplifier circuit.

In the pixel circuit 110F, the plurality of pixels PXL110a and PXL110b also share a reset transistor 113 and a row selection transistor 115.

In transfer transistors 112a and 112b of the respective pixels PXL110a and PXL110b, shared gate electrodes of first and second NMOS transistors are respectively connected to different transfer lines 140a and 140b.

In the pixel circuit 110F, electrons accumulated in respective photodiodes 111a and 111b are transferred to the FD 117 (the input node of the amplifier circuit) at individual timings according to the respectively independent transfer lines 140a and 140b.

The sharing of the amplifier circuit can reduce an effective size of the pixel, but parasitic capacitance of the FD 117 also increases when the number of sharing pixels increases.

Therefore, it is preferable that the number of sharing pixels be equal to or greater than 2 and equal to or less than 16.

The embodiments using the photodiode in a photoelectric conversion element of a semiconductor imager have been described above.

On the other hand, a MOS capacitor may be used in the photoelectric conversion element. It is possible to obtain the same effect even when the MOS capacitor is used in place of the photodiode in the first to fourteenth embodiments.

<15. Fifteenth Embodiment>

Figure 31:
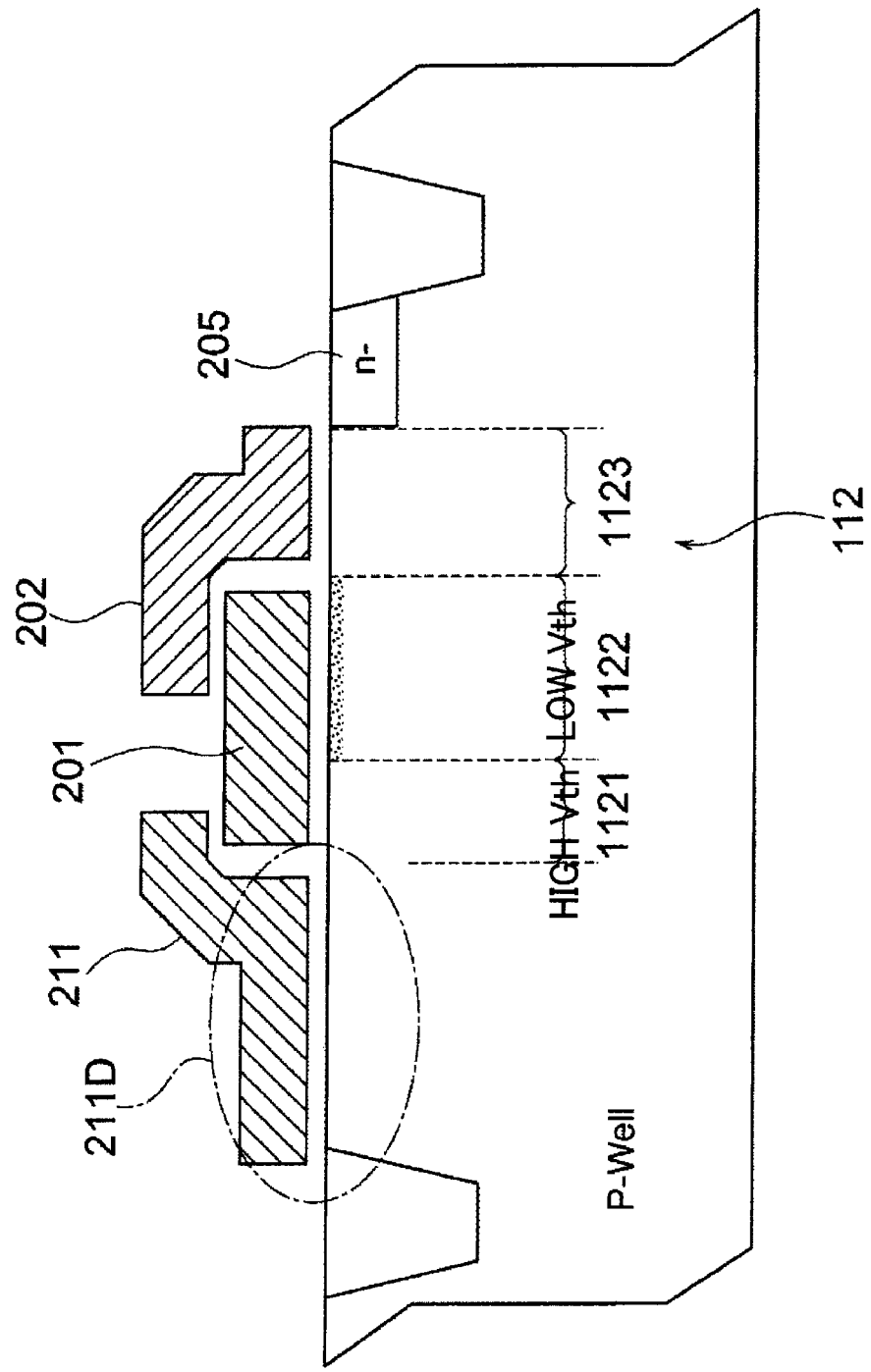
FIG. 31 is a diagram showing a configuration example of a transfer circuit according to a fifteenth embodiment in which a photodiode is replaced with a MOS capacitor with respect to FIG. 6, which is the cross-sectional structure example corresponding to the first embodiment.

FIG. 31 is a diagram showing a configuration example of a transfer circuit according to a fifteenth embodiment in which the photodiode is replaced with a MOS capacitor with respect to FIG. 6, which is a cross-sectional structure example corresponding to the first embodiment.

In FIG. 31, reference numeral 210 denotes a photoelectric conversion element using a MOS capacitor.

For example, a fixed voltage of 2 V is applied to an electrode 211, and a MOS capacitor 210 has a deep depletion state.

If electrons enter the depletion layer, electron/hole pairs are generated. Holes are attracted to an electric field and go to a p-well side. On the other hand, the electrons are accumulated in the vicinity of an oxide film of the MOS capacitor 210 as an inversion layer.

If the gate electrode 201 has the high level, the accumulated electrons are completely transferred to the channel region of the second NMOS transistor 1122 via the first MOS transistor 1121, and accumulated in the channel region.

Further, if the level of the gate electrode 201 falls to the low level, the accumulated electrons are transferred to the diffusion layer 205 (the FD 117), which is the input node of the amplifier circuit, the vertical signal line 170 is driven, and the read is performed.

<16. Sixteenth Embodiment>

Figure 32:
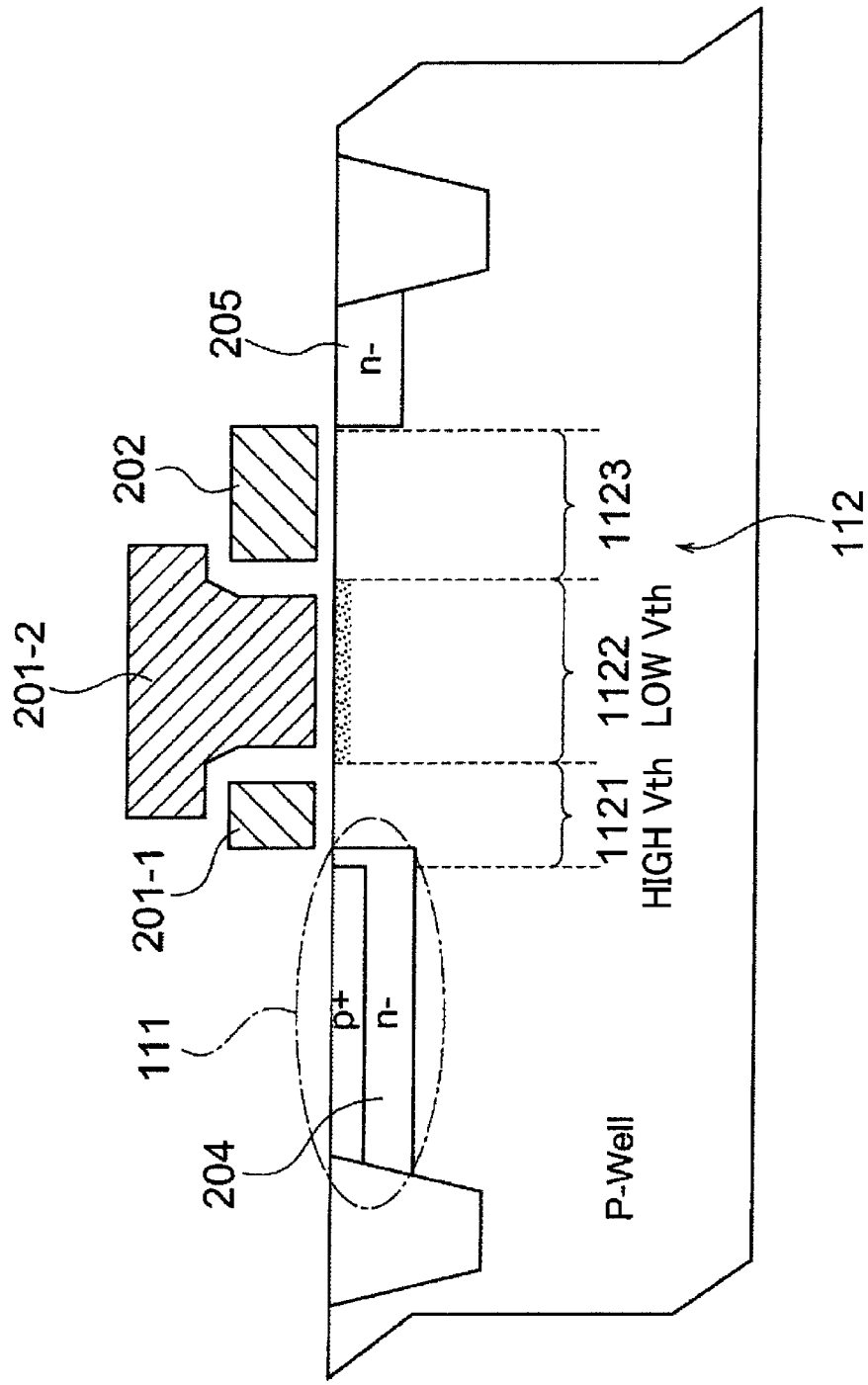
FIG. 32 is a diagram showing a cross-sectional structure example of a transfer circuit according to a sixteenth embodiment having a cross-sectional structure different from the transfer circuit of the first embodiment.

FIG. 32 is a diagram showing a cross-sectional structure example of a transfer circuit according to a sixteenth embodiment having a cross-sectional structure different from the transfer circuit of the first embodiment.

A main difference between the transfer circuit according to the sixteenth embodiment of FIG. 32 and the transfer circuit according to the first embodiment of FIG. 6 is an integrated gate structure of the integrated first to third NMOS transistors 1121, 1122, and 1123.

In the sixteenth embodiment, the first NMOS transistor 1121 and the second NMOS transistor 1122 are formed using different gate electrodes 201-1 and 201-2.

The gate electrodes 201-1 and 201-2 are formed of different conductive layers or polysilicon layers, and short-circuited within a pixel (not shown) to form an integrated electrode 201.

In this structure, it is possible to adjust a substrate impurity profile of the second NMOS transistor 1122 in self alignment. Alternatively, it is also possible to adjust a threshold by changing work functions of different gate electrode layers.

The solid-state image pickup device according to the first to sixteenth embodiments described above may be applied as an image pickup device of a digital camera or a video camera.

<17. Seventeenth Embodiment>

Figure 33:
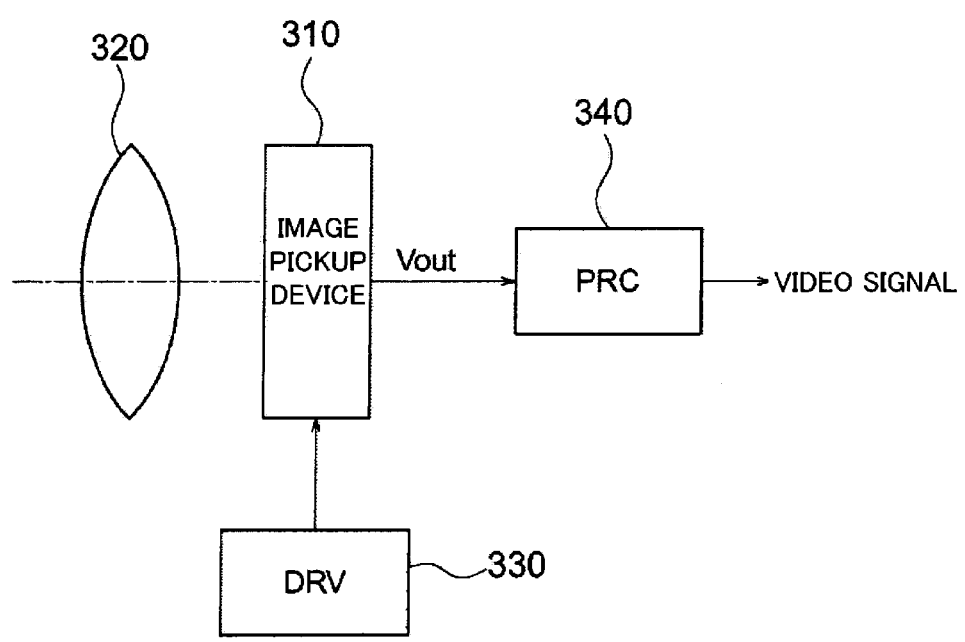
FIG. 33 is a diagram showing an example of a configuration of a camera system to which a solid-state image pickup device is applied according to an embodiment of the present invention.

FIG. 33 is a diagram showing an example of a configuration of a camera system to which a solid-state image pickup device is applied according to an embodiment of the present invention.

As shown in FIG. 33, a camera system 300 has an image pickup device 310 to which the CMOS image sensors (solid-state image pickup devices) 100 is applicable.

The camera system 300 has an optical system, which guides incident light to a pixel region of the image pickup device 310 (or which forms an image of a subject), for example, a lens 320, which forms an image of the incident light (an optical image) on an image pickup surface.

Further, the camera system 300 has a driving circuit (DRV) 330, which drives the image pickup device 310, and a signal processing circuit (PRC) 340, which processes an output signal of the image pickup device 310.

The driving circuit 330 has a timing generator (not shown), which generates various timing signals including a start pulse or a clock pulse to drive a circuit within the image pickup device 310, and drives the image pickup device 310 by a predetermined timing signal.

The signal processing circuit 340 performs predetermined signal processing for the output signal of the image pickup device 310.

An image signal processed by the signal processing circuit 340 is recorded, for example, on a recording medium such as a memory. Image information recorded on the recording medium is hard-copied by a printer or the like. The image signal processed by the signal processing circuit 340 is displayed on a monitor including a liquid crystal display or the like as a moving image.

In an image pickup apparatus of a digital still camera or the like as described above, a high-precision camera can be implemented at low power consumption by mounting the above-described image pickup device 100 as the image pickup device 310.

REFERENCE SIGNS LIST

100: CMOS image sensor
110: Pixel array section
110A to 110F: Pixel circuit
111: Photodiode
112: Transfer transistor
1121: First MOS transistor
1122: Second MOS transistor
1123: Third MOS transistor
113: Reset transistor
114: Amplifier transistor
115: Row selection transistor
116: Accumulation node
117: FD
118: Amplifier circuit
120: Row selection circuit
130: Column read circuit (AFE)
300: Camera system

The invention claimed is:

1. A pixel circuit comprising:
a photoelectric conversion element;
an amplifier circuit; and
a transfer transistor for transferring electric charge generated by the photoelectric conversion element to an input node of the amplifier circuit,
wherein
the transfer transistor has first, second, and third field effect transistors integrated and connected in series from the photoelectric conversion element to a side of the amplifier circuit,
the first and second field effect transistors have gate electrodes to be simultaneously collectively driven, and a threshold voltage of the first field effect transistor is set to be higher than that of the second field effect transistor,
as the gate electrodes are driven step by step, the electric charge generated by the photoelectric conversion element and transferred via the first field effect transistor is accumulated in a channel region of the second field effect transistor,
the electric charge accumulated in the channel region is transferred to an input of the amplifier circuit via the third field effect transistor,
the amplifier circuit drives a signal line, so that the accumulated electric charge is read, and
a gate electrode of the third field effect transistor has a fixed potential.

2. The pixel circuit according to claim 1,
wherein the third field effect transistor transfers the electric charge from the channel region of the second field effect transistor to the input of the amplifier circuit if a pulse is applied to a gate electrode.

3. The pixel circuit according to claim 1,
wherein the transfer transistor has a function of retaining the electric charge accumulated in the channel region of the second field effect transistor during a predetermined period as the gate electrodes of the first and second field effect transistors are maintained at an intermediate voltage.

4. The pixel circuit according to claim 1,
wherein the transfer transistor has a function of retaining the electric charge accumulated in the channel region of the second field effect transistor by maintaining the gate electrodes of the first and second field effect transistors and the gate electrode of the third field effect transistor together at a predetermined level.

5. The pixel circuit according to claim 1,
wherein the transfer transistor has
an accumulation function of accumulating the electric charge generated by the photoelectric conversion element by maintaining the first field effect transistor in an ON state and directly transferring the electric charge to the channel region of the second field effect transistor, and
a read function of transferring the accumulated electric charge to the amplifier circuit via the third field effect transistor.

6. The pixel circuit according to claim 1,
wherein
the transfer transistor accumulates a first accumulated signal generated by the photoelectric conversion element by transferring the first accumulated signal to the channel region of the second field effect transistor via the first field effect transistor,
the first field effect transistor is turned off while second accumulation is started by the photoelectric conversion element and a second accumulated signal is generated in a state in which the electric charge has been accumulated in the channel region of the second field effect transistor,
the transfer transistor performs first read, which transfers the first accumulated signal to the input of the amplifier circuit via the third field effect transistor, and
the transfer transistor performs second read, which transfers the second accumulated signal to the amplifier circuit via the first, second, and third field effect transistors.

7. The pixel circuit according to claim 1,
wherein
the photoelectric conversion element and the transfer transistor including the first, second, and third field effect transistors are arranged in each of a plurality of pixels, and
the amplifier circuit is shared between the plurality of pixels.

8. A solid-state image pickup device comprising:
a pixel section where a plurality of pixel circuits are arranged; and
a pixel driving section for reading a pixel signal by driving a pixel circuit of the pixel section,
wherein each pixel circuit has
a photoelectric conversion element;
an amplifier circuit; and
a transfer transistor for transferring electric charge generated by the photoelectric conversion element to an input node of the amplifier circuit,
wherein
the transfer transistor has first, second, and third field effect transistors integrated and connected in series from the photoelectric conversion element to a side of the amplifier circuit,
the first and second field effect transistors have gate electrodes to be simultaneously collectively driven, and a threshold voltage of the first field effect transistor is set to be higher than that of the second field effect transistor,
as the gate electrodes are driven by the pixel driving section step by step, the electric charge generated by the photoelectric conversion element and transferred via the first field effect transistor is accumulated in a channel region of the second field effect transistor,
the electric charge accumulated in the channel region is transferred to an input of the amplifier circuit via the third field effect transistor,
the amplifier circuit drives a signal line, so that the accumulated electric charge is read, and
a gate electrode of the third field effect transistor has a fixed potential.

9. The solid-state image pickup device according to claim 8,
wherein
the transfer transistor accumulates the electric charge generated by the photoelectric conversion element and transferred via the first field effect transistor in the channel region of the second field effect transistor as the gate electrodes are driven by the pixel driving section step by step,
the first field effect transistor is simultaneously turned off for all effective pixels in a state in which the electric charge has been accumulated in the channel region of the second field effect transistor,
the electric charge is then sequentially transferred to the input of the amplifier circuit via the third field effect transistor for each row, and
the amplifier circuit drives a signal line, so that the accumulated electric charge is read.

10. The solid-state image pickup device according to claim 8,
wherein
the transfer transistor accumulates a first accumulated signal generated by the photoelectric conversion element by transferring the first accumulated signal to the channel region of the second field effect transistor via the first field effect transistor,
the first field effect transistor is turned off while second accumulation is started by the photoelectric conversion element and a second accumulated signal is generated in a state in which the electric charge has been accumulated in the channel region of the second field effect transistor,
the transfer transistor performs first read, which transfers the first accumulated signal to the input of the amplifier circuit via the third field effect transistor, and
the transfer transistor performs second read, which transfers the second accumulated signal to the amplifier circuit via the first, second, and third field effect transistors.

11. The solid-state image pickup device according to claim 8,
wherein
the photoelectric conversion element and the transfer transistor including the first and second field effect transistors are arranged in each of a plurality of pixels, and
the amplifier circuit is shared between the plurality of pixels.

* * * * *